(12) United States Patent
Frost et al.

(10) Patent No.: US 9,361,984 B2
(45) Date of Patent: Jun. 7, 2016

(54) FLASH-BASED MEMORY SYSTEM WITH ROBUST BACKUP AND RESTART FEATURES AND REMOVABLE MODULES

(71) Applicant: INTERNATIONAL BUSINESS MACHINES CORPORATION, Armonk, NY (US)

(72) Inventors: Holloway H. Frost, Houston, TX (US); Don D. Davis, Katy, TX (US); Adrian P. Glover, Houston, TX (US); Lance W. Shelton, Houston, TX (US)

(73) Assignee: International Business Machines Corporation, Armonk, NY (US)

( * ) Notice: Subject to any disclaimer, the term of this patent is extended or adjusted under 35 U.S.C. 154(b) by 313 days.

(21) Appl. No.: 13/934,217

(22) Filed: Jul. 2, 2013

(65) Prior Publication Data

US 2013/0294163 A1   Nov. 7, 2013

Related U.S. Application Data

(60) Division of application No. 12/982,702, filed on Dec. 30, 2010, now Pat. No. 8,495,423, which is a continuation-in-part of application No. 12/646,298, filed on Dec. 23, 2009, now Pat. No. 7,941,696, which (Continued)

(51) Int. Cl.
*G06F 11/07*   (2006.01)
*G11C 16/06*   (2006.01)

(52) U.S. Cl.
CPC ............ *G11C 16/06* (2013.01); *G06F 11/07* (2013.01)

(58) Field of Classification Search
CPC ........... G01R 31/3679; G01R 27/2605; G01R 31/028; G01R 31/3624; G01R 27/02; G11C 5/141; G06F 3/044; H02J 7/045
See application file for complete search history.

(56) References Cited

U.S. PATENT DOCUMENTS 5,548,712 A    8/1996   Larson et al.
5,557,197 A *  9/1996   Schulze ............... G01R 15/125
                                                         324/115

(Continued)

OTHER PUBLICATIONS

Kwon, O.S., International Search Report for International Patent Application No. PCT/US2010/062599, Korean Intellectual Property Office, dated Apr. 29, 2011.

(Continued)

*Primary Examiner* — Loan L. T. Truong
(74) *Attorney, Agent, or Firm* — Locke Lord LLP

(57) ABSTRACT

A Flash-based memory system comprises a plurality of Flash memory devices, a Flash controller communicating independently with each Flash memory device to perform memory operations, a power circuit providing power the Flash memory devices, and a CPU configured to perform a controlled powering down procedure upon detecting a power failure. In some embodiments, the Flash-based memory system includes a backup power source having a charge storage device and charging circuitry, the CPU configured to perform one or more test procedures on the charge storage device to provide an indication of a charge storage capacity of the charge storage device. A plurality of Flash-based memory systems may be mounted on a Flash-based memory card, and multiple such Flash-based memory cards may be combined into a Flash-based memory module. A number of Flash-based memory modules may then be removably mounted in a rack-mountable housing to form unitary Flash-based memory unit.

20 Claims, 49 Drawing Sheets

Related U.S. Application Data is a continuation-in-part of application No. 12/554,892, filed on Sep. 5, 2009, now Pat. No. 8,176,284.

(60) Provisional application No. 61/291,286, filed on Dec. 30, 2009, provisional application No. 61/359,755, filed on Jun. 29, 2010, provisional application No. 61/232,913, filed on Aug. 11, 2009.

(56) References Cited

U.S. PATENT DOCUMENTS

| | | | |
|---|---|---|---|
| 5,606,511 A | 2/1997 | Yach | |
| 5,608,684 A | 3/1997 | Reasoner et al. | |
| 5,831,460 A | 11/1998 | Zhou | |
| 5,956,280 A * | 9/1999 | Lawrence | G01R 31/31908 324/73.1 |
| 6,052,793 A | 4/2000 | Mermelstein | |
| 6,178,520 B1 | 1/2001 | DeKoning et al. | |
| 6,195,754 B1 | 2/2001 | Jardine et al. | |
| 6,229,751 B1 | 5/2001 | Kutaragi et al. | |
| 6,425,087 B1 | 7/2002 | Osborn et al. | |
| 6,546,287 B1 * | 4/2003 | Havel | A61N 1/3937 607/7 |
| 7,380,055 B2 | 5/2008 | Ashmore | |
| 7,451,348 B2 | 11/2008 | Pecone et al. | |
| 7,536,506 B2 * | 5/2009 | Ashmore | G06F 1/3203 711/114 |
| 7,720,576 B2 * | 5/2010 | Warren | H02J 9/06 318/400.3 |
| 7,725,769 B1 | 5/2010 | Staab | |
| 7,898,268 B2 * | 3/2011 | Bernardon | G01R 27/14 324/548 |
| 8,051,331 B2 | 11/2011 | Oodate et al. | |
| 8,060,323 B2 * | 11/2011 | Taniguchi | G01R 31/3651 320/132 |
| 8,065,562 B2 | 11/2011 | Wilson et al. | |
| 8,090,988 B2 * | 1/2012 | Hoang | G06F 1/30 714/22 |
| 8,102,146 B2 * | 1/2012 | Suzuki | G01R 31/3624 320/107 |
| 8,228,039 B2 * | 7/2012 | Takeno | G01R 31/3631 320/136 |
| 8,886,479 B2 * | 11/2014 | Matsumoto | B60L 11/123 320/106 |
| 2001/0019258 A1 * | 9/2001 | Frohler | H02M 3/156 323/222 |
| 2005/0270042 A1 * | 12/2005 | Doljack | G01R 27/2605 324/686 |
| 2006/0080515 A1 * | 4/2006 | Spiers | G06F 11/1441 711/162 |
| 2006/0136687 A1 * | 6/2006 | Conley | G11C 16/10 711/162 |
| 2006/0184736 A1 | 8/2006 | Benhase et al. | |
| 2007/0030016 A1 * | 2/2007 | Schumacher | B60R 21/0173 324/678 |
| 2007/0074053 A1 | 3/2007 | Bulusu et al. | |
| 2007/0115006 A1 * | 5/2007 | Anude | G01R 31/016 324/678 |
| 2007/0145949 A1 * | 6/2007 | Matsushima | H02J 7/00 320/132 |
| 2008/0040520 A1 | 2/2008 | Caulkins | |
| 2008/0068029 A1 * | 3/2008 | Tanida | G01R 27/2605 324/658 |
| 2008/0072088 A1 | 3/2008 | Allarey et al. | |
| 2008/0148114 A1 | 6/2008 | Barth et al. | |
| 2008/0234957 A1 * | 9/2008 | Banhegyesi | G01D 4/004 702/64 |
| 2009/0085502 A1 * | 4/2009 | Geris | G03B 15/05 315/308 |
| 2009/0119449 A1 | 5/2009 | Nagaram Chengal | |
| 2009/0157950 A1 | 6/2009 | Selinger | |
| 2009/0279881 A1 * | 11/2009 | Geris | G03B 7/26 396/205 |
| 2010/0205470 A1 * | 8/2010 | Moshayedi | G11C 5/141 713/340 |
| 2010/0231226 A1 * | 9/2010 | Yamashita | G01R 19/16542 324/433 |
| 2010/0295554 A1 * | 11/2010 | Alho | G01R 31/42 324/548 |

OTHER PUBLICATIONS

Kwon, O.S., Written Opinion for International Patent Application No. PCT/US2010/062599, Korean Intellectual Property Office, dated Apr. 29, 2011.

Hutsell, W., "An In-depth Look at the RamSan-620 Flash Solid State Disk," Texas Memory Systems White Paper, Jul. 2009.

Hutsell, W., "An In-depth Look at the RamSan-500 Cached Flash Solid State Disk," Texas Memory Systems White Paper, Mar. 2008.

Norman, L., "RamSan-20 PCIe Flash SSD: Expanding the role of Flash in the enterprise," Texas Memory Systems White Paper, May 2009.

"smxFFS Users Guide", Micro Digital, Version 1.90, dated Jan. 9, 2009.

* cited by examiner

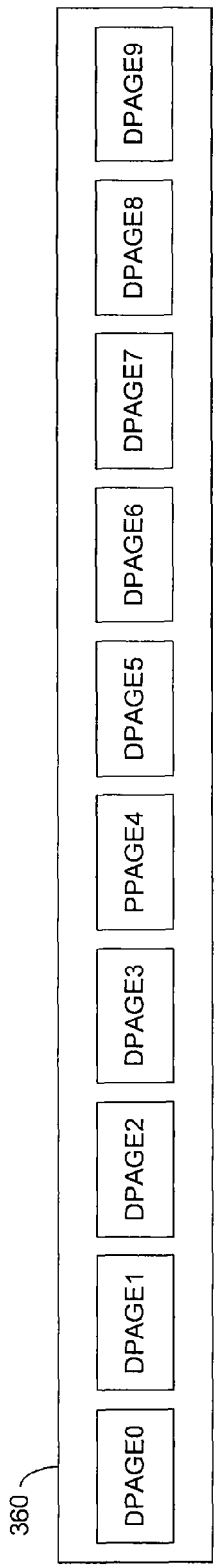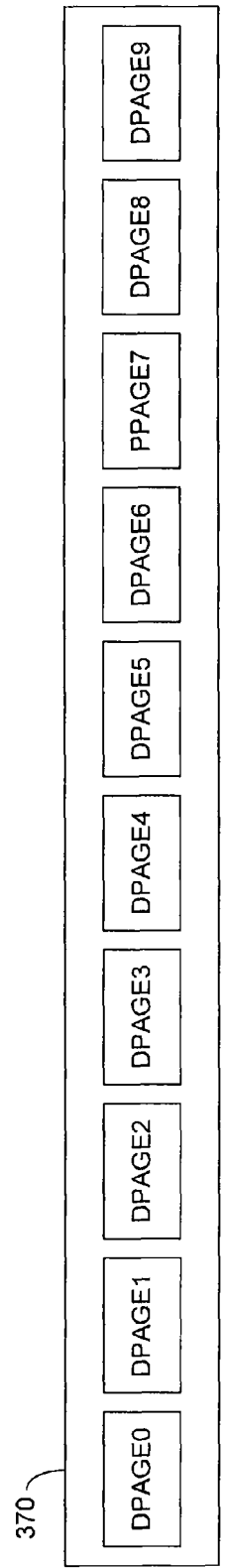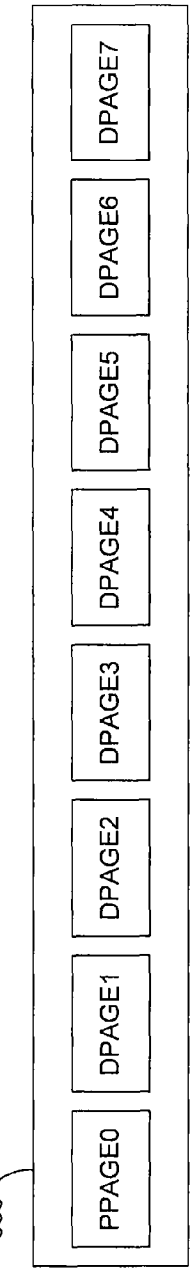

Data Protection Page

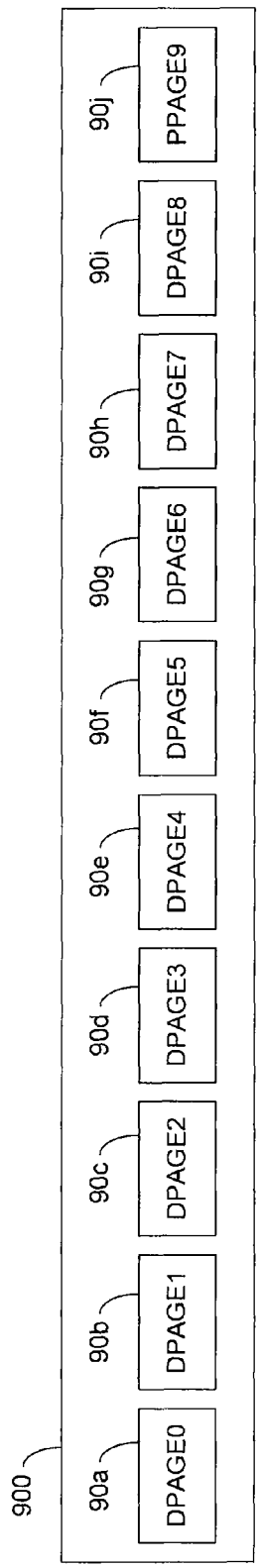
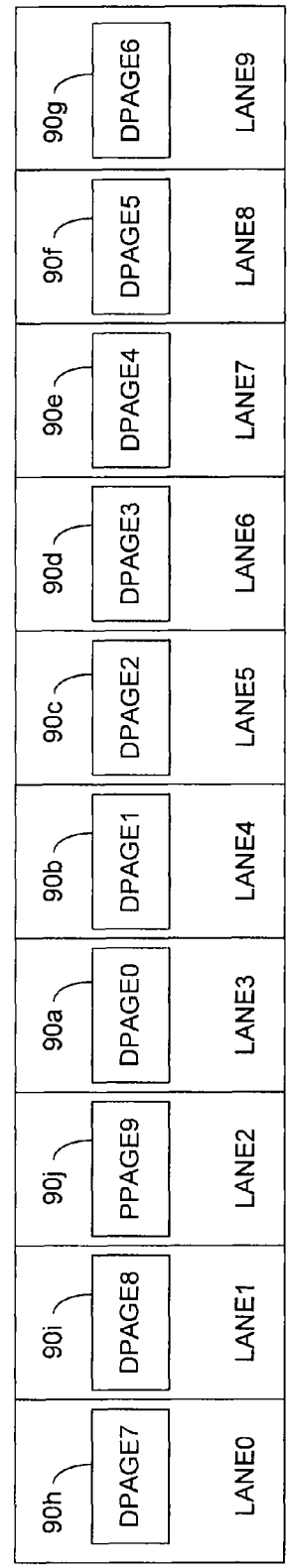
FIG. 9A
FIG. 9B

FIG. 9C

| LANE0 | LANE1 | LANE2 | LANE3 | LANE4 | LANE5 | LANE6 | LANE7 | LANE8 | LANE9 |
|---|---|---|---|---|---|---|---|---|---|
| DPAGE6 (90g) | DPAGE7 (90h) | DPAGE8 (90i) | PPAGE9 (90j) | DPAGE0 (90a) | DPAGE1 (90b) | DPAGE2 (90c) | DPAGE3 (90d) | DPAGE4 (90e) | DPAGE5 (90f) |

FIG. 9D

| LANE0 | LANE1 | LANE2 | LANE3 | LANE4 | LANE5 | LANE6 | LANE7 | LANE8 | LANE9 |
|---|---|---|---|---|---|---|---|---|---|
| DPAGE5 (90f) | DPAGE6 (90g) | DPAGE7 (90h) | DPAGE8 (90i) | PPAGE9 (90j) | DPAGE0 (90a) | DPAGE1 (90b) | DPAGE2 (90c) | DPAGE3 (90d) | DPAGE4 (90e) |

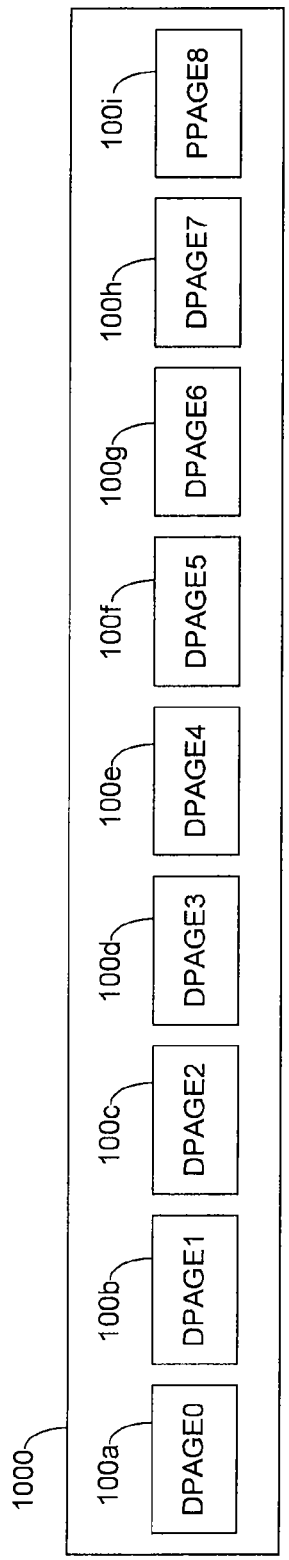
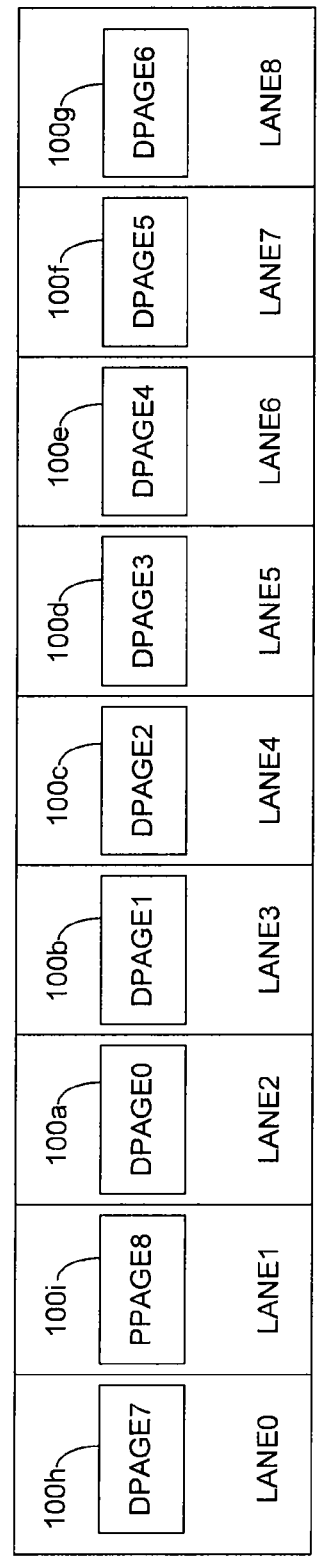
FIG. 10A
FIG. 10B

FFFFF = 000000000000.....0000

FFFFE = 111111111111.....1111

FFFFD = 101010101010.......1010

Defined Data Identifiers

FIG. 15A

| | |
|---|---|
| Actual Physical Address Identifier | LBA0 |
| Actual Physical Address Identifier | LBA1 |
| Actual Physical Address Identifier | LBA2 |
| Actual Physical Address Identifier | LBA3 |
| | LBA4 |
| Actual Physical Address Identifier | LBA5 |
| | |
| FFFFF | |
| | |
| | LBA55 |
| Actual Physical Address Identifier | |
| | |
| | |
| Actual Physical Address Identifier | |
| | |
| FFFFF | |
| | |
| | LBA500 |

FIG. 15B

| | APS0 | APS1 | APS2 | APS3 | APS4 | APS5 | APS6 | APS7 | APS8 | APS9 |
|---|---|---|---|---|---|---|---|---|---|---|
| PS0 | DPAGE0 | DPAGE1 | DPAGE2 | DPAGE3 | DPAGE4 | DPAGE5 | DPAGE6 | DPAGE7 | DPAGE8 | PPAGE9 |
| PS1 | DPAGE0 | DPAGE1 | DPAGE2 | DPAGE3 | DPAGE4 | DPAGE5 | DPAGE6 | DPAGE7 | DPAGE8 | PPAGE9 |
| PS2 | DPAGE0 | DPAGE1 | DPAGE2 | DPAGE3 | DPAGE4 | DPAGE5 | DPAGE6 | DPAGE7 | DPAGE8 | PPAGE9 |
| PS3 | DPAGE0 | DPAGE1 | DPAGE2 | DPAGE3 | DPAGE4 | DPAGE5 | DPAGE6 | DPAGE7 | DPAGE8 | PPAGE9 |
| PS4 | DPAGE0 | DPAGE1 | DPAGE2 | DPAGE3 | DPAGE4 | DPAGE5 | DPAGE6 | DPAGE7 | DPAGE8 | PPAGE9 |
| PS5 | DPAGE0 | DPAGE1 | DPAGE2 | DPAGE3 | DPAGE4 | DPAGE5 | DPAGE6 | DPAGE7 | DPAGE8 | PPAGE9 |
| PS6 | APPAGE0 | APPAGE1 | APPAGE2 | APPAGE3 | APPAGE4 | APPAGE5 | APPAGE6 | APPAGE7 | APPAGE8 | APPAGE9 |

FIG. 18A

| | APS0 | APS1 | APS2 | APS3 | APS4 | APS5 | APS6 | APS7 | APS8 | APS9 |
|---|---|---|---|---|---|---|---|---|---|---|
| PS0 | DPAGE0 | DPAGE1 | DPAGE2 | DPAGE3 | DPAGE4 | DPAGE5 | DPAGE6 | DPAGE7 | DPAGE8 | PPAGE9 |
| PS1 | DPAGE0 | DPAGE1 | DPAGE2 | DPAGE3 | DPAGE4 | DPAGE5 | DPAGE6 | DPAGE7 | DPAGE8 | PPAGE9 |
| PS2 | DPAGE0 | DPAGE1 | DPAGE2 | DPAGE3 | DPAGE4 | DPAGE5 | DPAGE6 | DPAGE7 | DPAGE8 | PPAGE9 |
| PS3 | DPAGE0 | DPAGE1 | DPAGE2 | DPAGE3 | DPAGE4 | DPAGE5 | DPAGE6 | DPAGE7 | DPAGE8 | PPAGE9 |
| PS4 | DPAGE0 | DPAGE1 | DPAGE2 | DPAGE3 | DPAGE4 | DPAGE5 | DPAGE6 | DPAGE7 | DPAGE8 | PPAGE9 |
| PS5 | DPAGE0 | DPAGE1 | DPAGE2 | DPAGE3 | DPAGE4 | DPAGE5 | DPAGE6 | DPAGE7 | DPAGE8 | PPAGE9 |
| PS6 | APPAGE0 | APPAGE1 | APPAGE2 | APPAGE3 | APPAGE4 | APPAGE5 | APPAGE6 | APPAGE7 | APPAGE8 | APPAGE9 |

FIG. 18B

| | | | | | | | | |
|---|---|---|---|---|---|---|---|---|
| DPAGE0 | DPAGE1 | DPAGE2 | DPAGE3 | DPAGE4 | DPAGE5 | DPAGE6 | DPAGE7 | DPAGE8 | PPAGE9 |
| DPAGE0 | DPAGE1 | DPAGE2 | DPAGE3 | DPAGE4 | DPAGE5 | DPAGE6 | DPAGE7 | DPAGE8 | PPAGE9 |
| DPAGE0 | DPAGE1 | DPAGE2 | DPAGE3 | DPAGE4 | DPAGE5 | DPAGE6 | DPAGE7 | DPAGE8 | PPAGE9 |
| DPAGE0 | DPAGE1 | DPAGE2 | DPAGE3 | DPAGE4 | DPAGE5 | DPAGE6 | DPAGE7 | DPAGE8 | PPAGE9 |
| DPAGE0 | DPAGE1 | DPAGE2 | DPAGE3 | DPAGE4 | DPAGE5 | DPAGE6 | DPAGE7 | DPAGE8 | PPAGE9 |
| DPAGE0 | DPAGE1 | DPAGE2 | DPAGE3 | DPAGE4 | DPAGE5 | DPAGE6 | DPAGE7 | DPAGE8 | PPAGE9 |
| DPAGE0 | DPAGE1 | DPAGE2 | DPAGE3 | DPAGE4 | DPAGE5 | DPAGE6 | DPAGE7 | DPAGE8 | PPAGE9 |
| APPAGE0 | APPAGE1 | APPAGE2 | APPAGE3 | APPAGE4 | APPAGE5 | APPAGE6 | APPAGE7 | APPAGE8 | APPAGE9 |

FIG. 18C

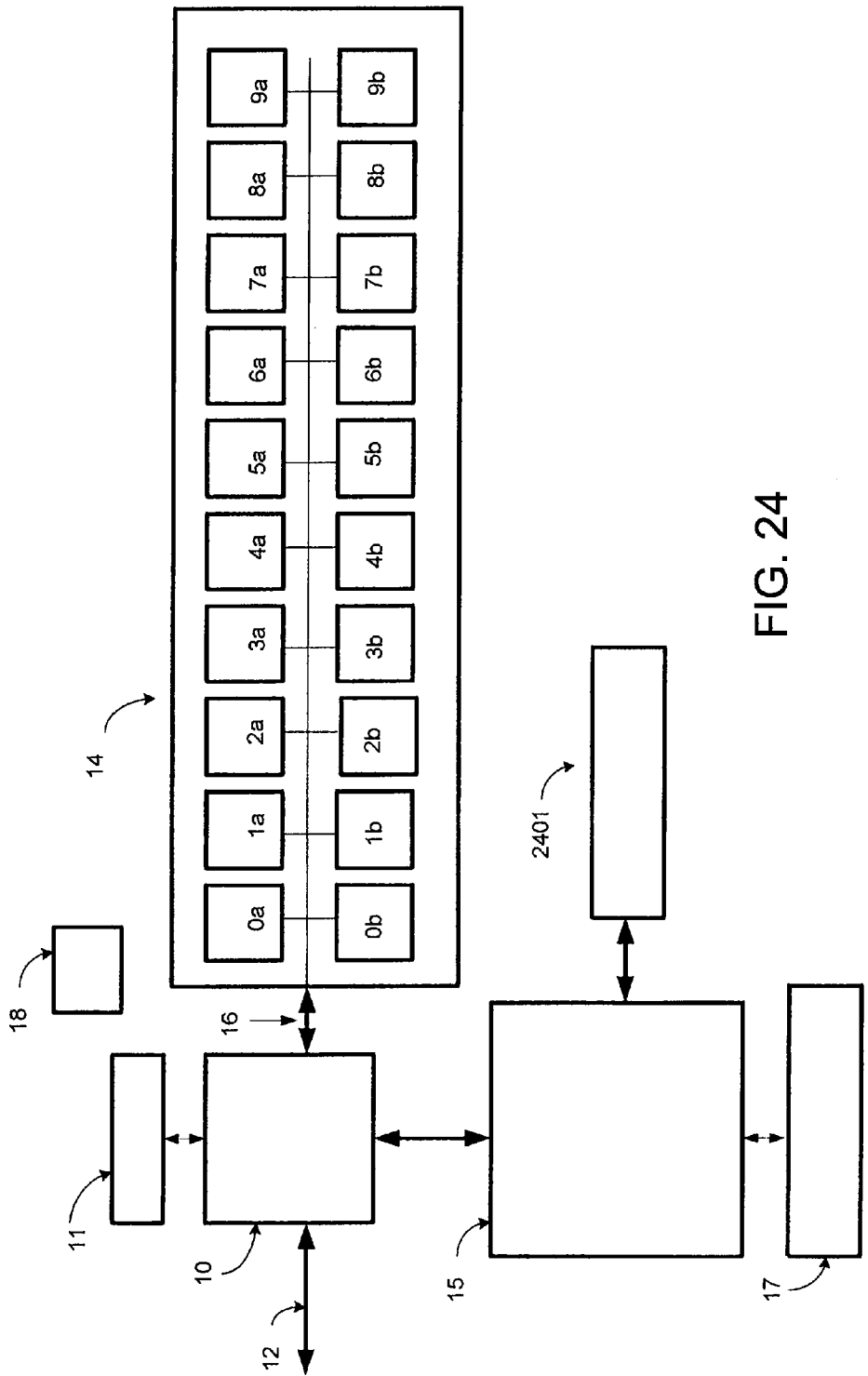

FLASH-BASED MEMORY SYSTEM WITH ROBUST BACKUP AND RESTART FEATURES AND REMOVABLE MODULES

CROSS REFERENCE TO RELATED APPLICATIONS

This application is a divisional of U.S. Non-Provisional application Ser. No. 12/982,702, entitled "Flash-based Memory System with Robust Backup and Restart Features," filed Dec. 30, 2010, which claims priority to U.S. Provisional Application Ser. No. 61/291,286, entitled "Flash-based Memory System with Robust Backup and Restart Features," filed Dec. 30, 2009, and U.S. Provisional Application Ser. No. 61/359,755, entitled "Flash-based Memory System with Robust Backup and Restart Features and Removable Modules," filed Jun. 29, 2010; and is a continuation-in-part of U.S. Non-Provisional application Ser. No. 12/646,298, entitled "FLASH-based Memory System with Static or Variable Length Page Stripes Including Data Protection Information and Auxiliary Protection Stripes," filed Dec. 23, 2009; which is a continuation-in-part of U.S. Non-Provisional application Ser. No. 12/554,892, entitled "Flash-based Memory System with Variable Length Page Stripes Including Data Protection Information," filed Sep. 5, 2009; which claims priority to U.S. Provisional Application Ser. No. 61/232,913, entitled "Method and Apparatus for Efficient and Enhanced Protection, Storage and Retrieval of Data Stored in Multiple Flash Storage Locations," filed Aug. 11, 2009, all of which are incorporated herein by reference. As such, this application also claims priority to the above-referenced U.S. Provisional Application Ser. No. 61/232,913, entitled "Method and Apparatus for Efficient and Enhanced Protection, Storage and Retrieval of Data Stored in Multiple Flash Storage Locations," filed Aug. 11, 2009; and is related in subject matter to: (1) commonly-assigned U.S. Non-Provisional application Ser. No. 12/554,888, entitled "Method and Apparatus for Addressing Actual or Predicted Failures in a Flash-Based Storage System," filed Sep. 5, 2009, and (2) commonly-assigned U.S. Non-Provisional application Ser. No. 12/554,891, entitled "Method and Apparatus for Protecting Data Using Variable Size Page Stripes in a Flash-Based Storage System," filed Sep. 5, 2009, all of which are incorporated herein by reference.

STATEMENT REGARDING FEDERALLY SPONSORED RESEARCH

Not applicable.

REFERENCE TO APPENDIX

Not applicable.

BACKGROUND OF THE INVENTION

1. Field of the Invention

This disclosure relates generally to methods and apparatus for improving the ability of a memory storage system to efficiently and effectively protect, store, and retrieve data stored in multiple storage locations. More specifically, this application relates to a Flash memory system having robust backup and restart features, and to in-circuit testing circuitry that supports those features.

2. Description of the Related Art

In certain memory storage systems, data to be stored in the system is provided to the memory system by an external host. That data is then typically processed by the memory storage system in some manner before it is written to the main storage medium. For example, in many Flash memory systems data to be stored in the system is provided to the system by a host device as part of a WRITE request, along with information relating to a location where the data is to be stored. In such systems, the data provided in the WRITE request may be processed by the system. For example the data may be used by itself or with other data to generate error correction data. The location information provided in the WRITE request may also be processed so that it is associated with a specific physical address within the physical Flash memory space to which the data provided with the WRITE request will be stored.

One shortcoming of conventional systems as described above relates to the operation of the system in the event of a power failure. If the power to such a system fails, or drops below the levels required for proper operation of the system, the processing that was in progress can be lost and, potentially, data that was in the process of being processed or stored can be corrupted. This loss or corruption of data can result in errors that are either not recoverable or that will take a significant amount of time to correct.

SUMMARY OF THE INVENTION

In general, in one aspect, the disclosed embodiments are directed to a Flash-based memory system having data backup and recovery capability. The Flash-based memory system comprises a printed circuit board (PCB) and a plurality of Flash memory devices mounted to the PCB, each Flash memory device having a physical memory space that is divided into blocks, each block being further divided into pages, each page representing an individually addressable memory location on which memory operations are performed, multiple memory locations being erased at the same time in one-block groupings. The Flash-based memory system also comprises a Flash controller mounted to the PCB and communicating independently with each Flash memory device to perform the memory operations, the Flash controller configured to access a logical-to-physical translation table that associates a logical address of a memory operation with a physical address of a memory location, and a power circuit mounted to the PCB and providing power to at least the Flash memory devices. The Flash-based memory system further comprises a central processing unit (CPU) mounted to the PCB and coupled to the power circuit and the Flash controller, the CPU configured to perform a controlled powering down procedure upon detecting a power failure. The controlled powering down procedure comprises: i) determining whether the Flash-based memory system was in normal operation when the power failure is detected; ii) removing power from the Flash memory devices without backing up data upon determining that the Flash-based memory system was not in normal operation when the power failure is detected; and iii) removing power from the Flash memory devices after backing up selected data upon determining that the Flash-based memory system was in normal operation when the power failure is detected. The backing up of selected data, in turn, comprises a) storing the logical-to-physical translation table in predefined memory locations in the Flash memory devices; and b) storing system data in the non-volatile backup memory of the CPU, the system data including data reflecting bad blocks within the Flash memory devices, a pointer pointing to the predefined memory locations in the Flash memory devices where the logical-to-physical translation table is stored, and error correction information associated with the system data.

In general, in another aspect, the disclosed embodiments are directed to a Flash-based memory system having a backup power source. The Flash-based memory system comprises a PCB and a plurality of Flash memory devices mounted to the PCB, each Flash memory device having a physical memory space that is divided into blocks, each block being further divided into pages, each page representing an individually addressable memory location on which memory operations are performed, multiple memory locations being erased at the same time in one-block groupings. The Flash-based memory system also comprises a Flash controller mounted to the PCB and communicating independently with each Flash memory device to perform the memory operations, and a power circuit mounted to the PCB and providing power to at least the Flash memory devices, the power being provided from a primary power source during normal operation of the Flash-based memory system and from a backup power source when the primary power source falls below a predefined level, the backup power source including a charge storage device and charging circuitry configured to charge the charge storage device. The Flash-based memory system further comprises a CPU mounted to the PCB and coupled to the power circuit and the Flash controller, the CPU configured to perform one or more test procedures on the charge storage device and provide an indication of a charge storage capacity of the charge storage device. The one or more test procedures comprises: a) disabling the charging circuitry from charging the charge storage device; b) obtaining a first voltage measurement from the charge storage device; c) applying a predefined load to the charge storage device; d) obtaining a second voltage measurement from the charge storage device; e) waiting a predefined amount of time; and f) obtaining a third voltage measurement from the charge storage device. The CPU provides an indication of the charge storage capacity of the charge storage device by providing at least one of a capacitance C of the charge storage device and an equivalent series resistance (ESR) of the charge storage device based on one or more of the first, second, and third voltage measurements.

In general, in yet another aspect, the disclosed embodiments are directed to a Flash-based memory module. The Flash-based memory module comprises a plurality of input/output (I/O) modules, each I/O module configured to communicate with an external device over one or more external communication links, and a plurality of cross-bar switching elements, each crossbar switching element connected to and in communication with one or more of the I/O modules. The Flash-based memory module also comprises a plurality of Flash-based memory cards connected to and in communication with each crossbar switching element, each Flash-based memory card having a printed circuit board (PCB) and a plurality of Flash-based memory systems mounted on the PCB. Each Flash-based memory system comprises a plurality of Flash memory devices, each Flash memory device having a physical memory space that is divided into blocks, each block being further divided into pages, each page representing an individually addressable memory location on which memory operations are performed, multiple memory locations being erased at the same time in one-block groupings. Each Flash-based memory system also comprises a Flash controller communicating independently with each Flash memory device to perform the memory operations, the Flash controller configured to access a logical-to-physical translation table that associates a logical address of a memory operation with a physical address of a memory location. Each Flash-based memory system further comprises a power circuit configured to provide primary power to at least the plurality of Flash memory devices and, upon failure of the primary power, provide backup power to at least the plurality of Flash memory devices. A CPU is coupled to the power circuit and the Flash controller in each Flash-based memory system, the CPU configured to perform a data backup procedure on selected data in the Flash-based memory system and a controlled powering down procedure on the Flash memory devices when failure of the primary power is detected.

BRIEF DESCRIPTION OF THE DRAWINGS

The foregoing and other advantages of the disclosed embodiments will become apparent from the following detailed description and upon reference to the drawings, wherein:

FIGS. 3A-3F illustrate exemplary implementations of Page Stripes in accordance with the present disclosure.

FIGS. 9A-9D illustrate additional exemplary Page Stripes and additional exemplary storage arrangements therefor in accordance with the present disclosure.

FIGS. 10A-10D illustrate further exemplary Page Stripes and further exemplary storage arrangements therefor in accordance with the present disclosure.

FIGS. 15A and 15B illustrate an exemplary Logical-to-Physical Translation Table having Data Identifiers therein in accordance with the present disclosure.

FIGS. 18A-18C illustrate an exemplary Flash storage arrangement in which Auxiliary Protection Stripes may be used to correct errors in multiple Data Pages across multiple Page Stripes.

FIG. 24 illustrates a Flash-based memory system in accordance with certain teachings of this disclosure having a dedicated backup memory space associated with a CPU controller.

DETAILED DESCRIPTION

The figures described above and the written description of specific structures and functions below are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location, and from time to time.

While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a," is not intended as limiting of the number of items. Also, the use of relational terms, such as, but not limited to, "top," "bottom," "left," "right," "upper," "lower," "down," "up," "side," and the like are used in the written description for clarity in specific reference to the figures and are not intended to limit the scope of the invention or the appended claims.

Figure 1:
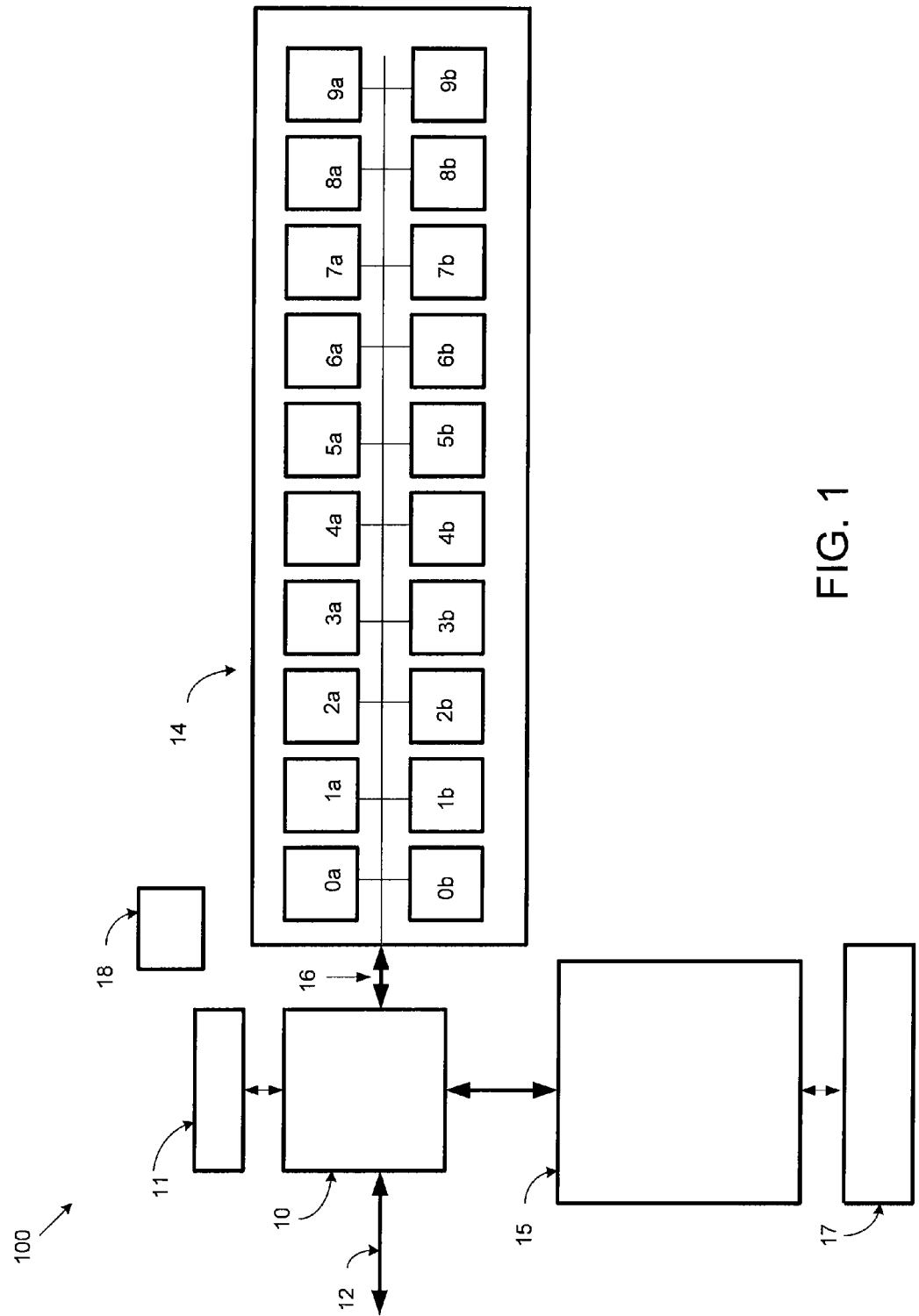
FIG. 1 illustrates an exemplary Flash memory storage system in accordance with the present disclosure.

Exemplary Memory System:

Turning to the drawings and, in particular, to FIG. 1 a memory storage system 100 in accordance with certain teachings of the present disclosure is illustrated. While it can be constructed in various ways, the memory storage system exemplified in FIG. 1 is constructed on a single multi-layer printed circuit board.

The exemplary illustrated memory storage system 100 includes: a Flash controller 10; Flash controller memory 11; a CPU 15; CPU memory 17; an external communication bus 12 used to communicate information to the Flash controller 10; a Flash memory storage array 14; and an internal communication bus 16 that enables communications between the Flash controller 10 and the Flash memory storage array 14. In the illustrated example, the components of the memory storage system 100 are mounted to the same printed circuit board. Such mounting may be accomplished through, for example, surface mounting techniques, through-hole techniques, through the use of sockets and socket-mounts and/or other mounting techniques.

The Flash controller 10 may take many forms. In the example of FIG. 1, the Flash controller 10 is a field programmable gate array (FPGA) that, during start-up of the system, is programmed automatically with a program stored in non-volatile memory within Flash controller 10. Although the FPGA programs itself automatically during system start-up, it may also be configured by the CPU 15.

Like Flash the controller 10, the controller memory 11 may take many forms. In the exemplary embodiment of FIG. 1, the controller memory 11 takes the form of random access memory and in particular DDR2 RAM memory. RAM memory is an example of "volatile" memory, or memory that requires a source of power to maintain the integrity of the information stored within the memory.

The communication bus 12 can be any acceptable data bus for communicating memory access requests between a host device (such as a personal computer, a router, etc.) and the memory system 100. The communication bus 12 can also use any acceptable data communication protocols.

In general operation, the Flash controller 10 receives requests via communication bus 12 to read data stored in the Flash memory storage array 14 and/or to store data in the Flash memory storage array 14. The Flash controller 10 responds to these requests either by accessing the Flash memory storage array 14 to read or write the requested data from or into the storage array 14 in accordance with the request, by accessing a memory cache (not illustrated) associated with the storage array 14, or by performing a read or write operation through the use of a Data Identifier as described in more detail below.

The Flash memory storage array 14 may take many forms. In the illustrated example, the Flash memory storage array 14 is formed from twenty individually addressable Flash memory storage devices divided into groups of two (0a, 0b), (1a, 1b), (2a, 2b), through (9a, 9b). In the illustrated example, each of the Flash memory storage devices 0a-9b takes the form of a board-mounted Flash memory chip, such as, for example, a 64 Gigabit (Gb) Single Level Cell (SLC) NAND flash memory chip. Flash memory is an example of "non-volatile" memory, or memory that does not require a source of power to maintain the integrity of the information stored within the memory.

The internal communication bus 16 can take any form that enables the communications described herein. In the example of FIG. 1, this bus 16 is formed from ten individual eight-bit communication buses 0-9 (not individually illustrated), each arranged to enable communication between the Flash controller 10 and each of the groups of two memory storage devices 0a-9b. Thus, for example, communication bus 0 enables communications between the Flash controller 10 and the group comprising memory devices 0a and 0b, and communication bus 4 enables communications between the Flash controller 10 and the memory devices 4a and 4b.

Referring to FIG. 1, an on-board ultra-capacitor 18 may also be provided and configured to receive charge during intervals when power is supplied to the Flash memory system 100 and to provide power for a limited time to the components making up the Flash memory system 100 whenever applied power is removed or drops below the power level provided by the ultra-capacitor. The purpose of the ultra-capacitor is to provide power for limited operation of the Flash memory system 100 upon the failure of power to the system. In the event of a power loss, the ultra-capacitor will automatically engage and provide power to most or all components of the Flash memory system 100. In the Flash system of FIG. 1, the ultra-capacitor is sized to provide adequate power to allow the system to store into the Flash memory array 14 any data that may be retained in the RAM storage device 11 at the time of power loss or power failure, as well as any other volatile information that may be necessary or useful for proper board operation. In that manner, the overall Flash system 100 acts as a non-volatile memory system, even though it utilizes various volatile memory components. Alternate embodiments are envisioned where multiple ultra-capacitors at various distributed locations across the printed circuit board and/or a single ultra-capacitor bank is used to provide the described back-up power. As used herein, the term ultra-capacitor is any capacitor with sufficiently high capacitance to provide the back-up power required to perform the functions described above that is adequately sized to fit on a printed circuit board and be used in a system, such as system 100.

The system 100 uses an addressing scheme to allow the Flash controller 10 to access specific memory locations within the memory array 14. For purposes of explanation, this addressing scheme will be discussed in the context of a WRITE request, although it will be understood that the same addressing scheme can be and is used for other requests, such as READ requests.

In general, the Flash controller 10 will receive a WRITE request from a host device that contains both: (i) data to be stored in the memory system 100, and (ii) an indication of the memory address where the host device would like for the data to be stored. The WRITE request may also include an indication of the amount (or size) of the data to be transferred. In one embodiment, the system is constructed such that the amount of data (or the size of each WRITE request) is fixed at the size of a single Flash memory page. In the exemplary embodiment of FIG. 1, this corresponds to 4 KB (Kilobytes) of information. In such an embodiment, the address provided by the host device can correspond to the address of a Page within a logical address space.

In the system 100 of FIG. 1, the address received by the Flash controller 10 does not refer to an actual physical location within the memory array 14. Instead, the address received by the Flash controller 10 from the host device is a Logical Block Address (or "LBA") because it refers to a logical address, rather than to any specific physical location within the memory array 14. The concept of Logical Block Addressing as used in the system 100 of FIG. 1 is discussed in more detail below.

In the system 100 of FIG. 1, the memory array 14 comprises a collection of individual Flash memory storage chips. A specific physical addressing scheme is used to allow access to the various physical memory locations within the Flash memory chips 0a-9b. In the embodiment of FIG. 1, this physical addressing scheme is based on the physical organization and layout of the memory array 14.

Referring to FIG. 1, as noted earlier, the physical memory chips 0a-9b that make up the memory array 14 are divided into ten groups of two chips. For purposes of the physical addressing scheme, each group of two chips forms a "Lane," also sometimes referred to as a "Channel," such that there are ten Lanes or Channels within the memory array 14 (LANE0-LANE9). LANE0 corresponds to chips 0a and 0b; LANE1 to chips 1a and 1b and so on, with LANE9 corresponding to chips 9a and 9b. In the embodiment of FIG. 1, each of the individual Lanes has associated with it one of the individual eight-bit buses 0-9 mentioned earlier to enable the Flash controller 10 to communicate information across the Lane. Thus, by directing its communications to one of the specific communication buses 0-9, the Flash controller 10 can direct its communications to one of the Lanes of memory chips. Because each communication bus 0-9 for a given Lane is independent of the communication buses for the other Lanes, the Flash controller 10 can issue commands and send or receive data across the various communication buses at the same time such that the Flash controller can access the memory chips corresponding to the individual Lanes at, or very nearly at, the same time.

In the addressing scheme for the memory system 100 of FIG. 1, each Lane enables communications with one of two physical memory chips at any given time. Thus, for example, data provided across communication bus 0 can enable communications with either chip 0a or chip 0b. In the embodiment of FIG. 1, for Lane 0 as an example, the Flash controller 10 controls eight individual chip enable lines (four for chip 0a and four for chip 0b) so that each chip and its corresponding internal hardware resources may be addressed individually. The assertion of a single chip enable line results in communications with one chip and one chip enable ("CE") resource within that chip.

In the embodiment of FIG. 1, the physical memory locations within each of the Flash memory chips are divided into physical locations that can be addressed and/or identified through the use of one or more of: Chip Enables ("CEs", generally described above); Dice (multiple individual die); Planes; Blocks; and Pages. This exemplary addressing scheme is generally illustrated in FIGS. 2A and 2B.

Figure 2A:
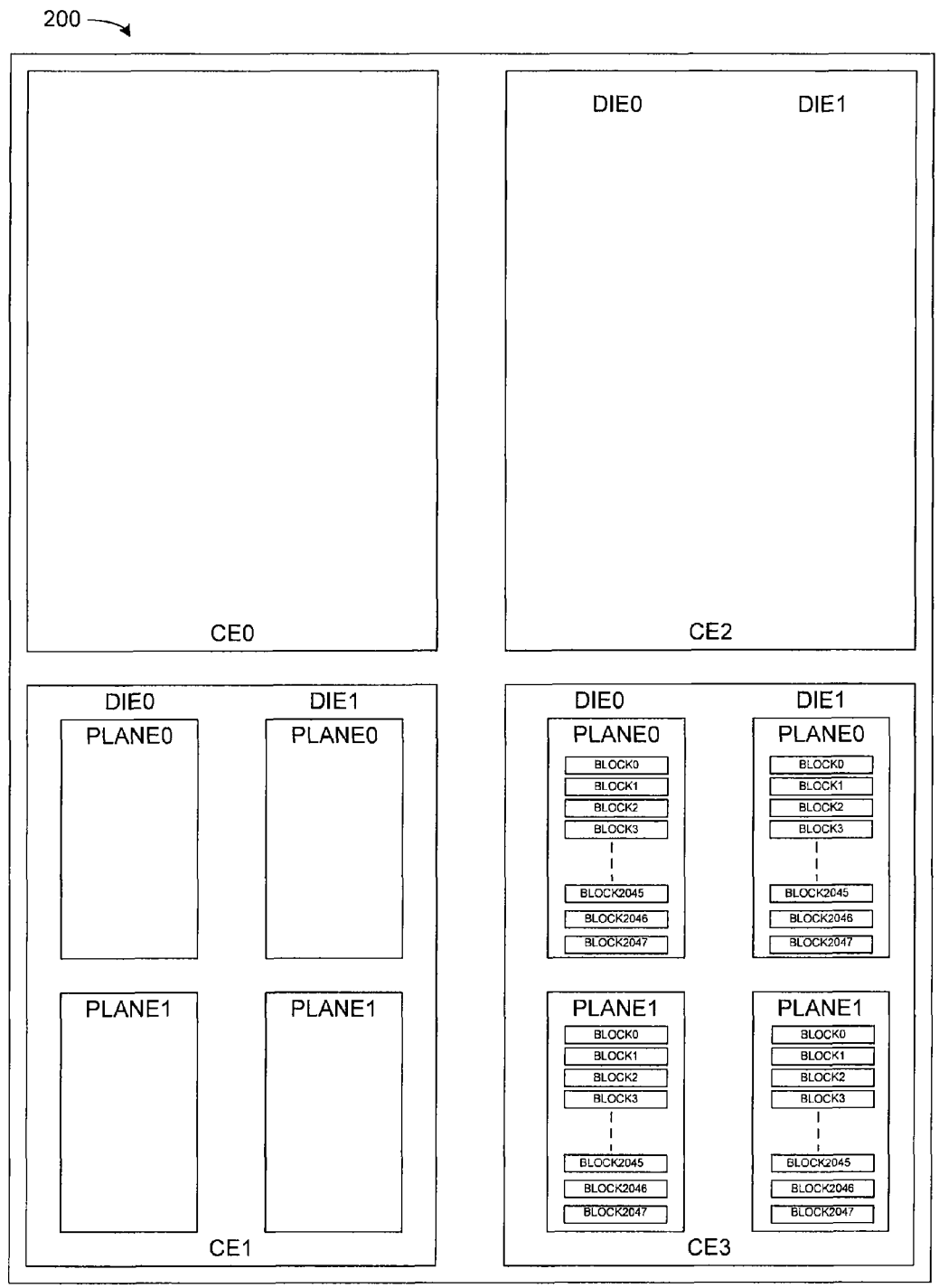
FIGS. 2A and 2B illustrate an exemplary arrangement of physical memory within a Flash memory chip in accordance with the present disclosure.
Figure 2B:
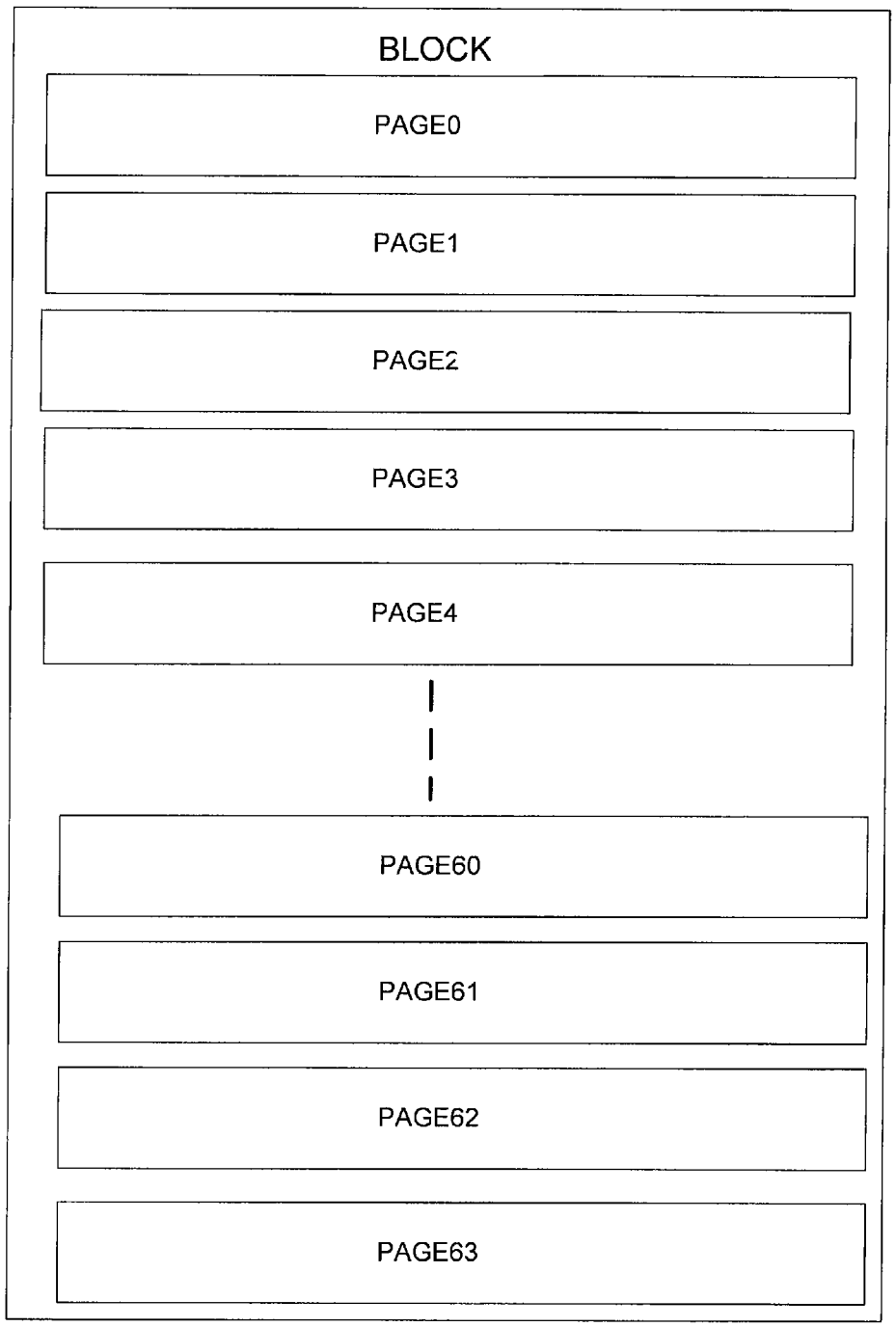

FIGS. 2A and 2B generally illustrate the physical memory 200 within each of the individual Flash memory chips 0a-9b of FIG. 1. Referring to FIGS. 2A and 2B, it may be noted that, at one level, the physical memory 200 within the device may be divided into four high level groupings, where each grouping has associated with it an individual Chip Enable (or "CE") line. In the example of FIG. 2, the physical memory 200 of each Flash chip is divided into four groupings of Chip Enables (CE0, CE1, CE2 and CE3) and each Chip Enable would have a separate CE line. During an addressing state, the activation of one of the four CE lines will enable access to or from memory locations within the group of memory locations associated with the asserted CE line.

In the embodiment of FIGS. 2A and 2B, each CE group of memory locations is further divided into Dice (multiple individual die), Pages, Blocks and Planes.

The division of the physical memory into Dice is generally related to the manner in which the structures internal to the chip are formed. In the exemplary embodiment of FIG. 2A, each Chip Enable includes two Dice (DIE0 and DIE1) which are illustrated for CE0-CE3.

In the addressing scheme of FIGS. 2A and 2B, a Page is the smallest individually addressable data unit. In the exemplary system, each Page of data has a specific length which in the example is a data length corresponding to 4 KB of data plus 128 additional bytes used as described in more detail below. In the embodiment of FIG. 1, data is written into or read from the memory array 14 on a Page-by-Page basis.

In the system of FIGS. 2A and 2B, the various Pages of data are grouped together to form "Blocks". In general, a Block is a collection of pages that are associated with one another, typically in a physical manner. The physical association is such that the Block is the smallest group of Flash memory locations that can be erased at any given time. In the embodiment of FIGS. 2A and 2B, each Block includes 64 Pages of data. This is reflected generally in FIG. 2B.

When dealing with Flash memory, an ERASE operation involves the placement of all of the memory locations that are subject to the erase operation in a particular logical state, corresponding to a specific physical state of the memory locations. In the embodiment of FIG. 1, the ERASE operation is performed on a Block-by-Block basis and the performance of an ERASE operation of a given block places all of the memory locations within the Block into a logical "1" state, corresponding to a state where there is no or relatively low charge stored within the storage devices associated with each memory location. Thus, while data may be read from or written to the memory array 14 on a Page-by-Page basis, the memory locations can be erased only on a Block-by-Block basis in the embodiment shown.

In the arrangement of FIGS. 2A and 2B, the Blocks of data are grouped together to form "Planes." Each Plane represents a collection of Blocks that, because of the physical layout of the Flash memory chips, are physically associated with one another and that utilize common circuitry for the performance of various operations. In the example of FIGS. 2A and 2B, each Die includes two Planes and each Plane comprises 2048 Blocks of data. In FIG. 2A, the Blocks within the Planes are illustrated for CE3.

In the illustrated example, the various Blocks of data that form a given Plane utilize common circuitry within the individual chips 0a-9b to perform certain operations, including READ and WRITE operations. Thus, for example, each of the Pages of Data within an exemplary Plane (e.g., PLANE0 of DIE0 of CE3) will be associated with some specific input/output circuitry that includes an Input/Output (I/O) Buffer. The I/O Buffer is a buffer that is sized to store at least one Page of data. When data is to be written into a specific Page in a Block, a Page of data is first written to the I/O Buffer for the Plane, and the Page of data is then written into the memory locations associated with the specific Page. Similarly, when a specific Page of data is to be read from a location within the Plane, the Page of data is first retrieved from the specific Page to be accessed and placed in the I/O Buffer for the Plane in which the accessed Page resides. If the data was requested in a manner where it would be accessible outside the Flash chip 200, the data is delivered from the I/O Buffer in the associated Plane to the Flash controller 10.

The memory system 100 of FIG. 1 does not generally allow devices external to the system to directly address and access the physical memory locations within the Flash memory storage array. Instead, the memory system 100 is generally configured to present a single contiguous logical address space to the external devices that may request READ or WRITE access to data stored in the memory array 14. The use of this logical address space allows the system 100 to present a logical address space external to the system 100, such that a host device can write data to or read data from logical addresses within the address space—thus allowing easy access and use of the memory system 100—but also allows the Flash controller 10 and CPU 15 to control where the data that is associated with the various logical addresses is actually stored in the physical memory locations that make up memory array 14 such that the performance of the system is optimized.

Because the system 100 isolates the logical address space made available to host devices from the physical memory within the array 14, it is not necessary that the size of the physical memory array 14 be equal to the size of the logical address space presented externally to the system. In some embodiments it is beneficial to present a logical address space that is less than the total available address space. Such an approach ensures that there is available raw physical memory for system operation, even if data is written to each presented logical address space. For example, in the embodiment of FIG. 1, where the Flash memory array 14 is formed using 64 Gb Flash memory chips providing a raw physical memory space of 1280 Gb of storage, the system could present a logical address space corresponding to approximately 896 Gb of data storage.

Page Stripes

In the exemplary system of FIG. 1, data is written to the memory array 14 using associated Pages of data known as "Page Stripes." In the illustrated embodiment, a Page Stripe represents a grouping of associated information, stored in a particular manner within the memory array 14.

Page Stripes: Information Content

While the specific information that is stored in a given Page Stripe can vary, in one embodiment each Page Stripe includes a number of Pages of stored data (typically provided by a host device) and one Page of data used to protect the stored data. While the actual size of a Page Stripe may vary, for purposes of the following discussion an exemplary Page Stripe consisting of nine pages of stored data and one page of data protection information is described.

Figure 3A:
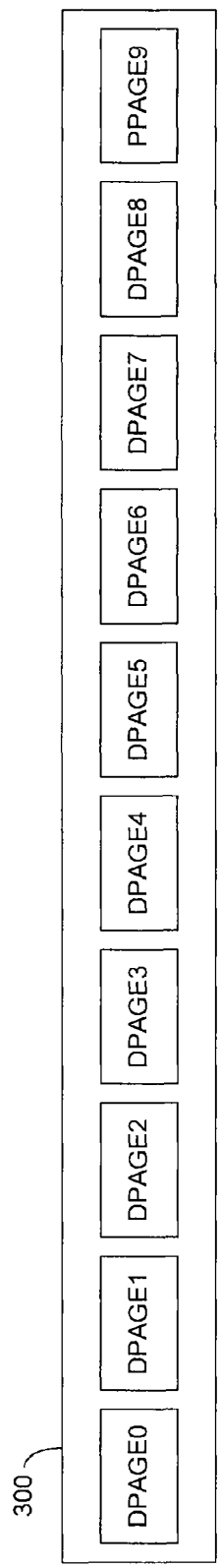

FIG. 3A illustrates an exemplary Page Stripe 300 in accordance with the teachings of the present disclosure. Referring to FIG. 3A, the exemplary Page Stripe consists of nine pages of data, each referred to herein as a "Data Page" (DPAGE0, DPAGE1, DPAGE2 . . . DPAGE8 in the example) and one page of data protection information, referred to herein as a "Data Protection Page" (PPAGE9 in the example).

Figure 4:
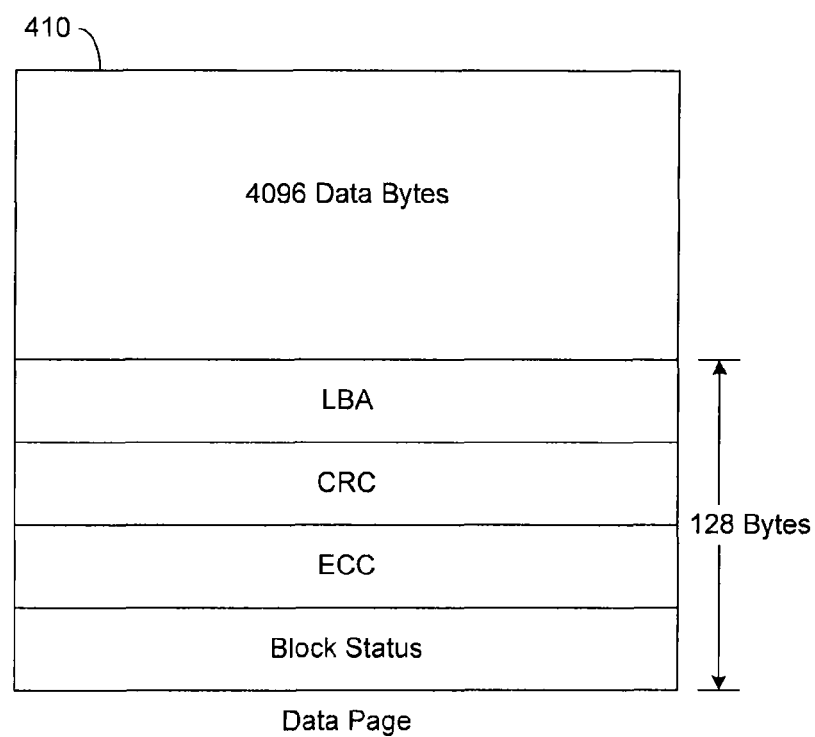
FIG. 4 illustrates an exemplary Data Page in accordance with the present disclosure.

FIG. 4 generally illustrates the format used for each Data Page within the Page Stripe 300. Referring to FIG. 4, an exemplary Data Page 410 is illustrated. The illustrated Data Page 410 includes 4096 bytes of stored data and 128 bytes of additional information that, in the illustrated example, includes a number of bits that provide the Logical Block Address (LBA) corresponding to the specific Data Page at issue; a number of bits that reflect a cyclic redundancy check (CRC) of the combination of the stored data and the stored LBA; and a number of Error Correction Code (ECC) bits. In the illustrated example, the ECC bits are calculated from a combination of the stored data bytes, the LBA bits and the CRC bits. In some embodiments, bits of data reflecting the status of the Block in which the illustrated Page is found may also be stored within the Data Page.

In the example of FIG. 4, the LBA information is in the form of four bytes of data, although the length of the LBA address is not critical and can vary.

The CRC data can take many forms and be of variable length and various techniques may be used to determine the CRC data associated with the LBA address stored in the Data Page. In one example, the CRC data comprises a 64-bit value formed by a hashing technique that performs a hash operation on the 4096 data bytes plus the four LBA data bytes to produce a 64-bit CRC hash value.

Various techniques may be used to determine the ECC bits for the stored data and LBA information stored in the Data Page 410.

In one embodiment, the ECC data associated with the stored data and LBA information is calculated using a beneficial technique in which the ECC data stored in the Data Page comprises thirty-three sixteen-bit ECC segments: each of thirty-two of the ECC segments are associated with 128 unique bytes of the 4 KB data area, and a thirty-third ECC segment is associated with the LBA and CRC fields.

A variety of methods can be used to determine the ECC data. Such methods include, but are not limited to, Reed-Solomon techniques, Hamming techniques, BCH techniques, and low density parity check (LDPC) techniques.

Figure 5:
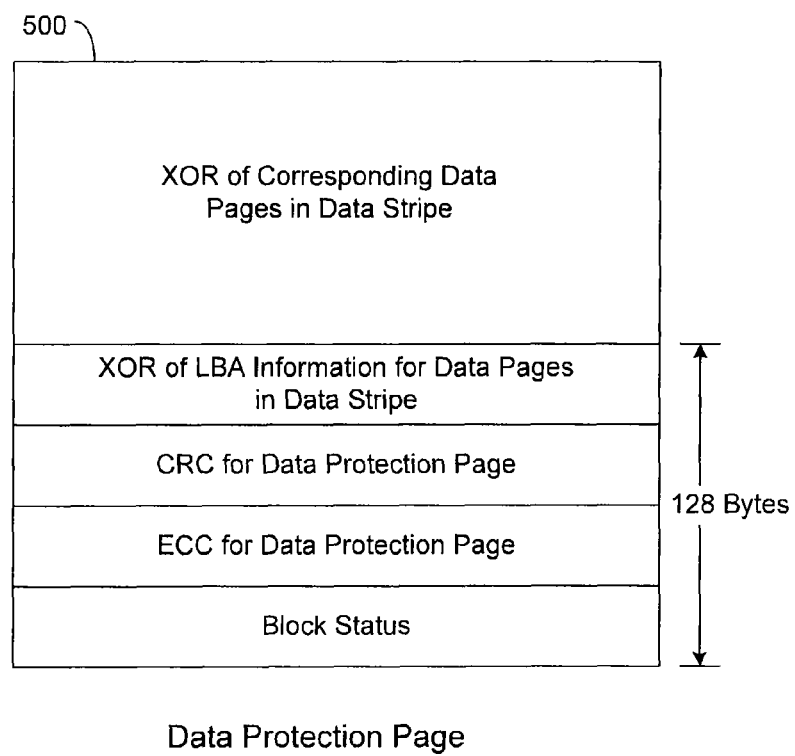
FIG. 5 illustrates an exemplary Data Protection Page in accordance with the present disclosure.

FIG. 5 generally illustrates the form of the information stored in the Data Protection Page of the exemplary Page Stripe 300. Referring to FIG. 5, an exemplary Data Protection Page 500 is illustrated. The data and LBA fields of the Data Protection Page 500 simply contain the bit-by-bit Exclusive Or (XOR) of the corresponding fields in one or more of the associated Data Pages (DPAGE0, DPAGE1, DPAGE2 . . . DPAGE8). The ECC and CRC fields for the Data Protection Page 500 are recalculated for the Data Protection Page 500 in a manner identical to that used in the corresponding Data Pages. The XOR calculation used to produce the Data Protection Page can be accomplished using the apparatus of FIG. 6 and/or a software approach.

Figure 6:
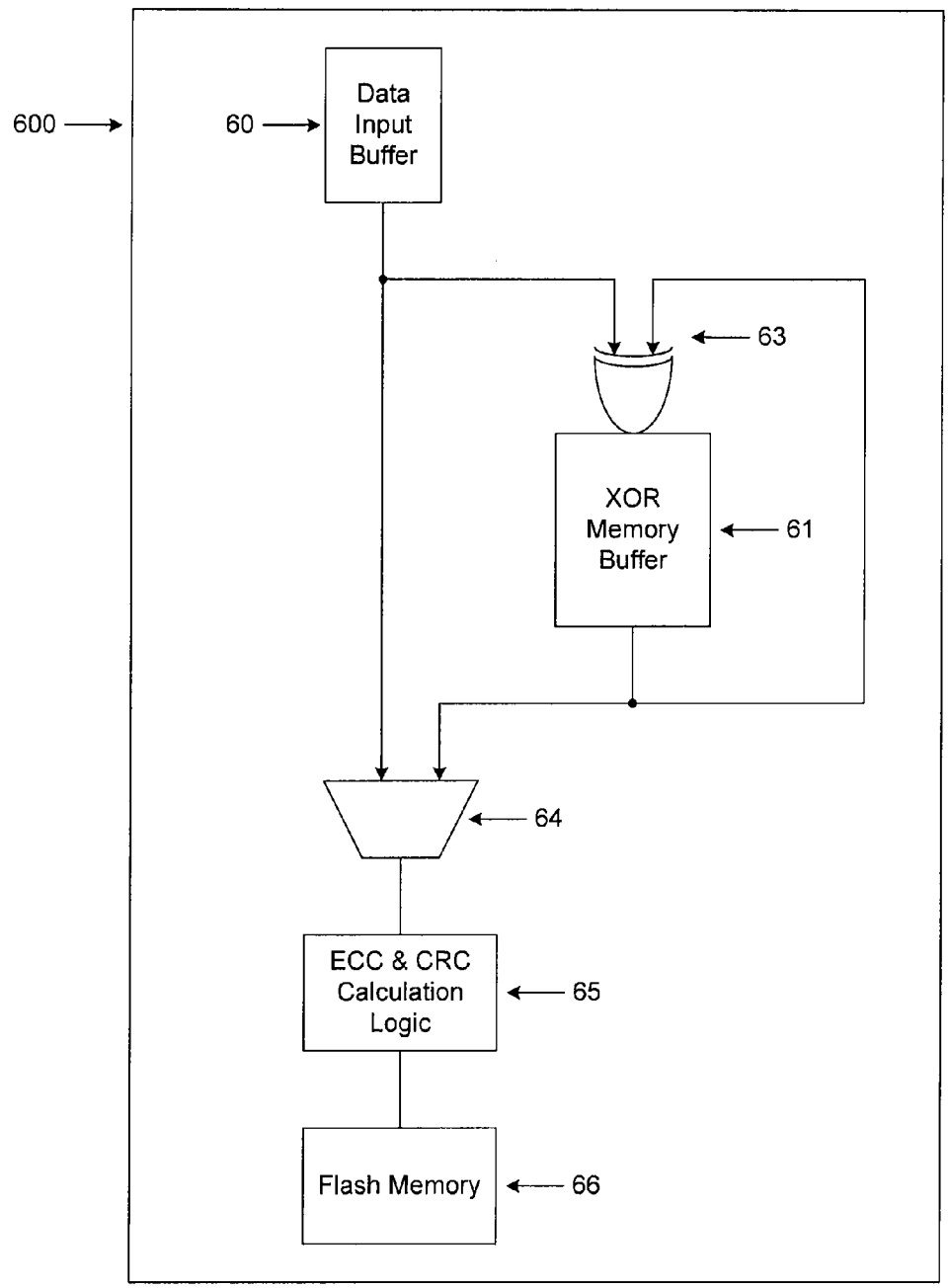
FIG. 6 illustrates an exemplary circuit that can be used to produce a Data Protection Page in accordance with the present disclosure.

Referring to FIG. 6, XOR circuitry 600 is disclosed that includes an input memory buffer 60, an addressable XOR memory buffer 61, a multi-bit XOR circuit/buffer 63 and a multiplexer (MUX) 64. ECC and CRC calculation logic 65 is also illustrated, as is the physical Flash memory array 66. In the illustrated embodiment, each of the input buffer 60, XOR buffer 61, XOR circuit 63 and MUX 64 operate on a Page of information.

The circuitry 600 of FIG. 6 operates as follows. Data destined for the Flash memory 66 passes first through input memory buffer 60. If this data is the first Page of a new Page Stripe, the data is copied directly into the addressable XOR memory buffer 61 as it flows into the downstream ECC and CRC calculation logic 66. For the second and subsequent Pages of a Page Stripe, previous data in the addressable XOR memory buffer is unloaded and XORed with new data as the new data is unloaded from the input memory buffer 60. The result is then written back into the addressable XOR memory buffer 61, yielding the XOR of all Data Pages up to and including the current one. This operation is repeated until the data in the addressable XOR memory buffer 61 reflects the XOR of the data in the Data Pages that make up the Page Stripe at issue, after which the addressable XOR memory buffer 61 is written to Flash memory. Multiplexer 64 selects between current data and the resulting XOR calculation.

The XOR operation may alternately be performed through the use of software or firmware.

It may be noted that through the use of the Page format described above in connection with FIG. 4 and the use of the Data Protection Page 500 of FIG. 5, the data that is stored in a Page Stripe as described herein is protected through multiple different protection mechanisms. First, the use of the ECC bits in each Data Page allows the correction of any single bit error and the detection of any double bit error within each group of 128 data bytes. ECC also allows the same single-bit error correction and double-bit error detection within the LBA and CRC fields. After ECC checking and correction is performed, the corrected CRC field is used to validate the corrected data. Used together, these two mechanisms allow for the correction of relatively benign errors and the detection of more serious errors using only local "intra-Page" information. Should an uncorrectable error occur in a Flash Page, the data and LBA information from the failing Page may be reconstructed from the other Pages (including the XOR Data Protection Page) within the same Page Stripe using the information in the Data Protection Page for the Page Stripe. Note that the XOR Data Protection Page for each Page Stripe employs the same local protection mechanisms (ECC and CRC) as every other Data Page within the Page Stripe.

Figure 3B:
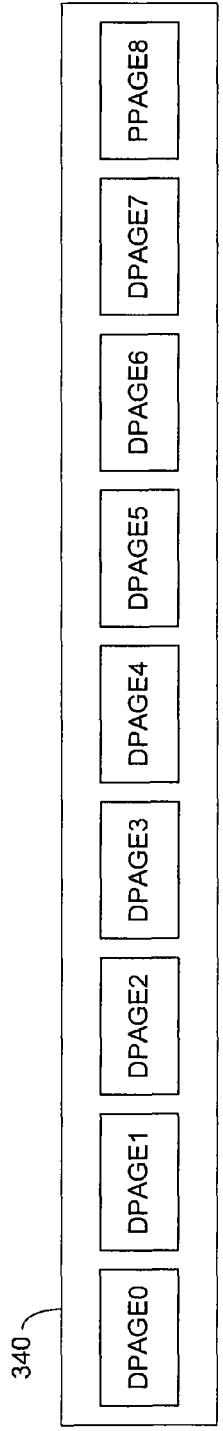

The specific Page Stripe 300 of FIG. 3A is but one example of a Page Stripe in accordance with the teachings of this disclosure. Page Stripes of different sizes and constructions can also be used. One such alternate Page Stripe is reflected in the embodiment of FIG. 3B. FIG. 3B illustrates an alternate Page Stripe 340 that includes only nine total Pages of data with eight of the Pages (DPAGE0-DPAGE7) being Data Pages and one of the Pages (PPAGE8) being a Data Protection Page. In the illustrated embodiment of FIG. 3B, the individual Data Pages (DPAGE0-DPAGE7) are constructed in accordance with the Data Page format of FIG. 4 and the Data Protection Page is of the form reflected in FIG. 5. Because the Page Stripe 340 includes only eight Data Pages, however, the Data Protection Page (PPAGE8) will include the XOR of only eight Data Pages, as opposed to the nine Data Pages that would be used for the Page Stripe 300 of FIG. 3A.

Figure 3C:
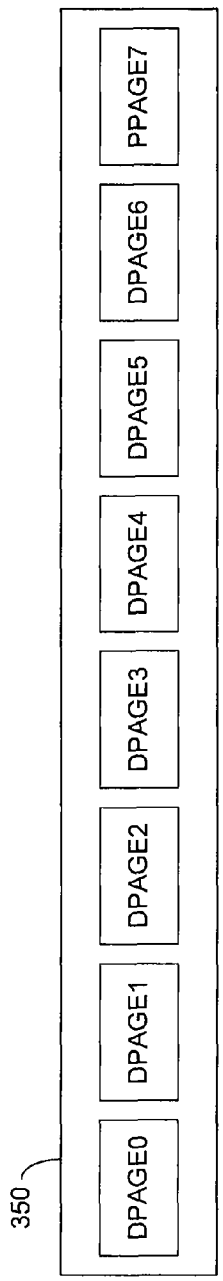

FIG. 3C illustrates yet another Page Stripe 350, in accordance with the teachings of the present disclosure. Page Stripe 350 includes only eight total pages, with seven of the Pages (DPAGE0-DPAGE6) being Data Pages and One of the Pages (PPAGE7) being a Data Protection Page.

In the exemplary system 100 disclosed herein, it is not necessarily required to have the Data Protection Page be located as the last page of a given Page Stripe. The Data Protection Page can be located at any of the Page locations within the Page Stripe. As one example of such a Page Stripe, FIG. 3D illustrates a Page Stripe 360 that is formed from a total of ten Pages of information, where the Data Protection Page is located at the PPAGE4 location. As an alternate example, FIG. 3E illustrates a Page Stripe 370 with ten Pages of information including nine Data Pages and a Data Protection Page at the PPAGE7 location. FIG. 3F illustrates yet another example, depicting a Page Stripe 380 having eight Pages, including Seven Data Pages and one Data Protection Page at the PPAGE0 location.

Page Stripes: Storage Format

While the memory locations in which the Pages of data within a Page Stripe can be stored may vary within memory array 14, in one embodiment, the Pages that make up a given Page Stripe are stored in physical memory locations selected in such a manner that the overall operation of the memory system 100 is optimized. In this embodiment, the physical memory locations in which the data in each Page Stripe is stored are such that the physical Lane associated with each Page of data within the Page Stripe is different from the Lanes associated with the other Pages that make up the Page Stripe. As generally reflected in FIG. 7A, this embodiment allows for efficient writing and reading of a Page Stripe to the memory array since it allows the Pages of data that make up the Page Stripe to be written to the memory array 14 simultaneously or near-simultaneously by having the Flash controller 10 issue commands to the various Lanes at, or close to, the same time.

Figure 7A:
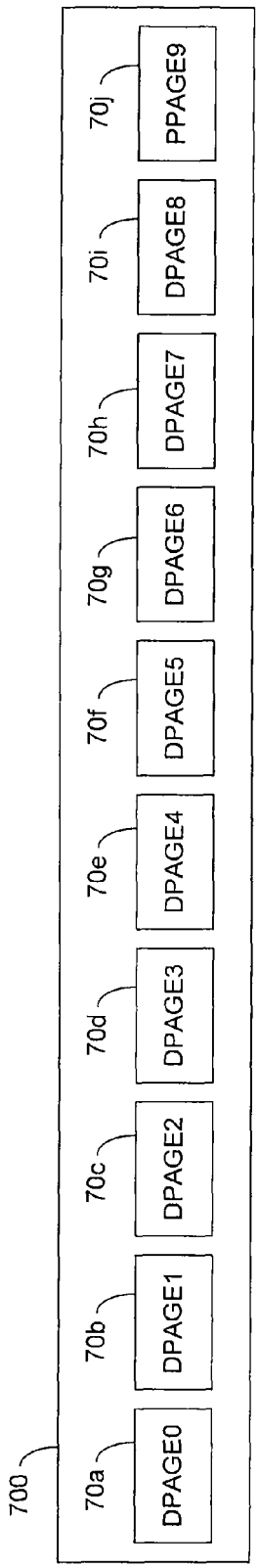
FIGS. 7A and 7B illustrate an exemplary Page Stripe and an exemplary storage arrangement for the Page Stripe in accordance with the present disclosure.
Figure 7B:
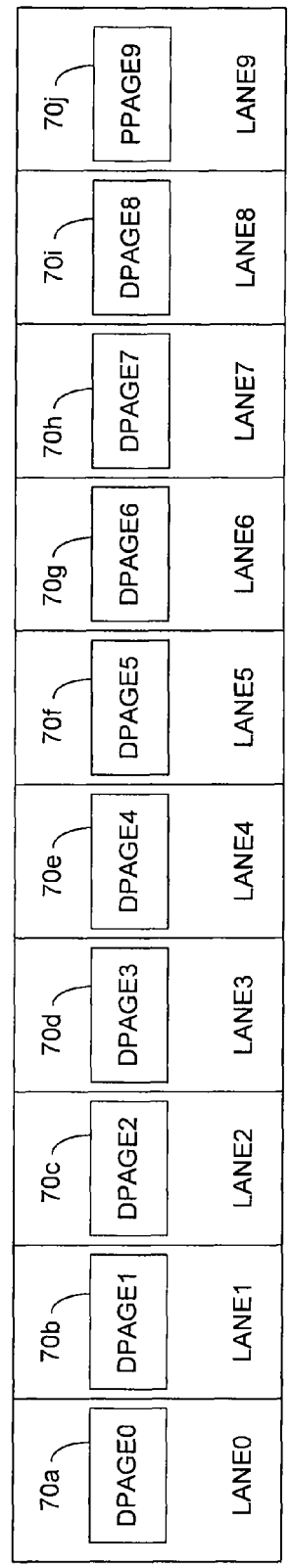

FIG. 7A illustrates an exemplary Page Stripe 700 consisting of nine Data Pages 70a, 70b, 70c through 70i and one Data Protection Page 70j. FIG. 7B illustrates the manner in which this Page Stripe 700 can be stored in the memory array 14 of FIG. 1.

In the example of FIG. 7B, the first Data Page 70a is stored in a physical memory location within LANE0; the second Data Page 70b is stored in a physical memory location within LANE1; the third Data Page 70c is stored in a physical memory location within LANE2, and so on until the ninth Data Page 70i is stored in a physical memory location within LANE8. The Data Protection Page 70j is stored in a physical location within LANE9.

Because the various Pages that make up the exemplary Page Stripe 700 are stored as illustrated in FIG. 7B, and because there are independent communication lines between the Flash controller 10 and each of the various Lanes, the Pages associated with Page Stripe 700 can be written to or read from the memory array 14 simultaneously or near-simultaneously. This arrangement allows for relatively quick read and write operations and allows data to be stored to and retrieved from the memory array 14 in an efficient and effective manner.

Figure 8A:
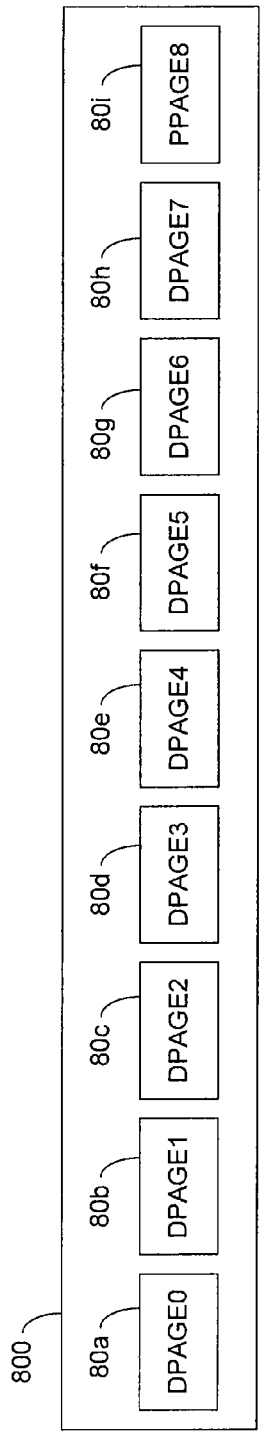
FIGS. 8A and 8B illustrate another exemplary Page Stripe and another exemplary storage arrangement therefor in accordance with the present disclosure.
Figure 8B:
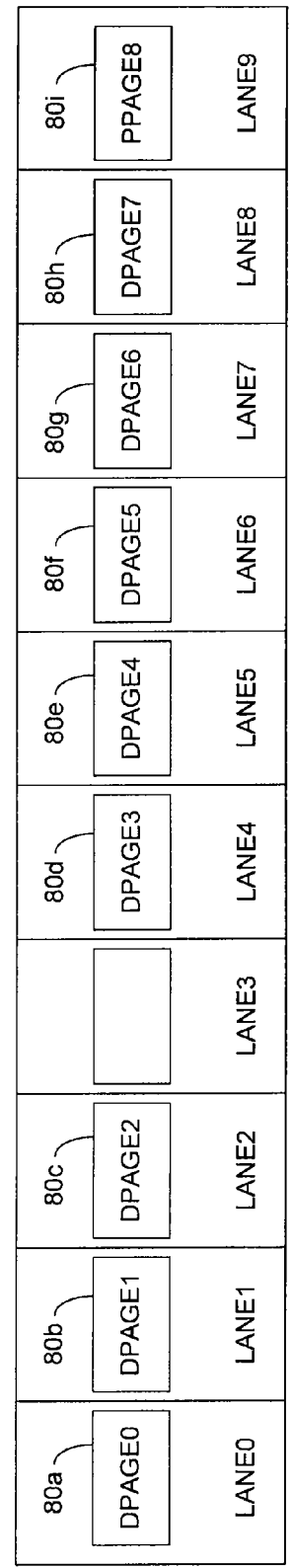
Figure 10C:
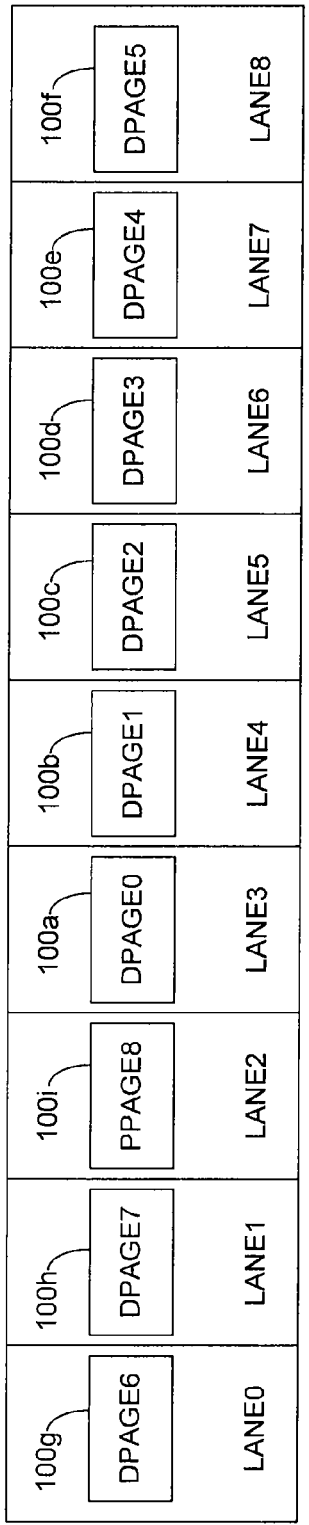
Figure 10D:
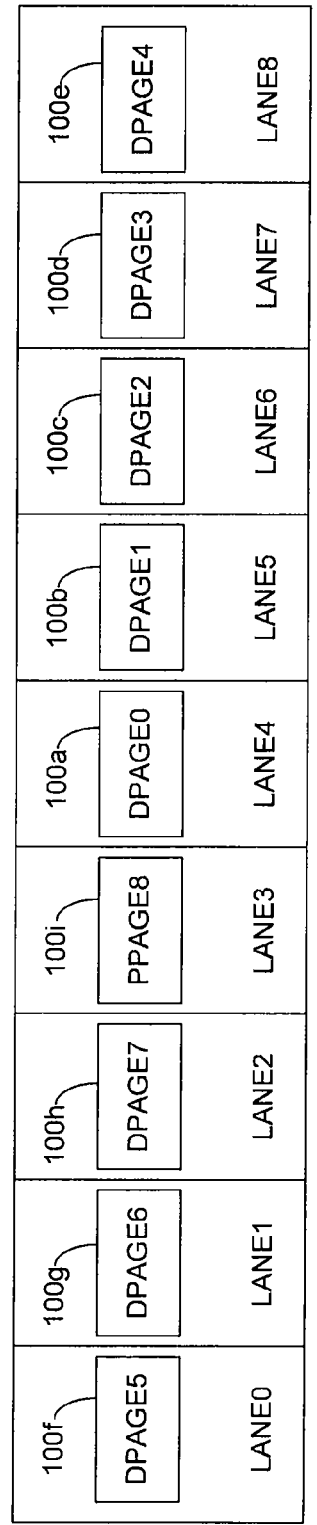

It should be noted that the example of FIGS. 7A and 7B is but one example of how a Page Stripe can be stored within the physical memory array. FIGS. 8A and 8B illustrate an alternate arrangement.

FIG. 8A illustrates an exemplary Page Stripe 800 that includes eight Data Pages 80a-80h and a single Data Protection Page 80i. FIG. 8B illustrates an example of how the Pages making up Page Stripe 800 can be stored in the memory array 14. In the illustrated example, the first Data Page 80a is stored in a physical location associated with LANE0, the second Data Page 80b with a physical location associated with LANE1 and the third Data Page 80c in a physical location within LANE2. Note however, that there is no Data Page stored within any physical location associated with LANE3. The fourth through eighth Data Pages (80d-80h) are then stored in physical locations within LANE4-LANE8, respectively, and the Data Protection Page 80i is stored within a location in LANE9. This example illustrates the fact that in the illustrated embodiment, while each Page of data within a Page Stripe is stored in a location associated with a Lane that differs from the Lane associated with the storage locations of each other Page within the Page Stripe, it is not necessary that data for a Page Stripe be stored in locations within each Lane. For Page Stripes that include a number of Pages that is less than the number of Lanes of a given memory array, there will be one or more Lanes in which no data within the Page Stripe is stored.

In each of the examples of FIGS. 7A-7B and 8A-8B, the Pages that make up the exemplary Page Stripes are stored sequentially across the Lanes, such that each of the Lane designations for the memory locations associated with the Pages within the Page Stripe are sequential as one considers the Page Stripe from the first Data Page to the Second Data Page continuing to the Data Protection Page. While this approach is not critical to the disclosed embodiments, it is beneficial in that it can simplify the implementation of the disclosed subject matter.

While there may be benefits to having the Pages associated with a given Page Stripe stored sequentially across the available Lanes, it is not critical that the Pages within a Page Stripe be written in any particular order. In some embodiments, Page Stripes are stored such that the Pages associated with the Page Stripe are written sequentially across the Lanes, but with the first Data Page of the Page Stripe written into a physical location associated with a Lane other than LANE0. These embodiments are illustrated in FIGS. 9A-9D below.

FIGS. 9A-9D illustrate examples of how an exemplary Page Stripe 900 containing nine Data Pages 90a-90i and a single Data Protection Page 90j can be written sequentially across Lanes within memory array 14 with the first Data Page being stored in a location associated with a Lane other than LANE0. For example, in FIG. 9B, Page Stripe 900 is stored sequentially with the first Data Page stored at an address associated with LANE3 and the Page Stripe sequentially "wrapping around" such that the Data Protection Page 90j is stored in an address associated with LANE2. FIG. 9C illustrates storage with the first Data Page 90a in an address associated with LANE4 and FIG. 9D illustrates storage with the first Data Page 90a in an address associated with LANE5.

FIGS. 10A-10D illustrate still further examples of how a Page Stripe 1000 including eight Data Pages and a single Data Protection Page can be written into memory array 14. In general, Pages within a particular Page Stripe may be written to various Lanes, in any order, so long as no two Pages of the same Page Stripe occupy the same Lane.

Memory System 100—Exemplary Operations

Having described the general physical structure of the memory system 100 and aspects of the manner in which data in the form of Page Stripes is addressed and stored within the memory array 14, certain operational aspects of the system 100 will be described including aspects relating to the WRITING and READING of data to and from the system.

Exemplary WRITE Operations

At a high level, and in general, the exemplary system of FIG. 1 may perform WRITE operations through a number of steps including:

(1) receiving from a host device data, typically in the form of a Page of data, to be stored in memory along with a Logical Block Address (LBA) at which the host device would like for the data to be stored;

(2) determining whether the LBA for the received data was previously associated with one or more different physical memory Pages and, if so, changing the status of the previous Page or Pages of memory to indicate that the previously stored data is no longer valid; and (3) identifying an available Page within a Page Stripe where the received data can be stored;

(4) configuring the received data such that it is divided into a data group that fits within the identified Page Stripe on a Page-aligned basis (i.e., data that can be written into a Page or a Page Stripe on a Page-by-Page basis);

(5) writing the data into the available Page;

(6) updating a table associating Logical Addresses from the host device with physical addresses in the memory array to associate the physical Page where the data was stored with the LBA provided by the host device.

It is not critical that these operations be performed in the described order.

The step of receiving, from a host device, data to be stored and an LBA where the host device would like for the data to be stored is relatively straightforward. For the embodiment of FIG. 1, the data and the LBA supplied by the host are typically provided to the System Controller 10 over the communication bus 12.

The step of determining whether the LBA for the received data was previously associated with one or more different physical memory Pages and, if so, changing the status of the previous Page or Pages of memory to an indication that the data is no longer valid (a DIRTY indication) involves the Flash controller 10 comparing the received LBA to the LBA entries in the Logical-to-Physical conversion tables. If the comparison indicates that the LBA provided by the host device for the current WRITE operation was previously associated with another physical memory location, then the system will know that the previously stored data is no longer valid. Accordingly, the system will change a status indicator for the physical Pages of data associated with the previously stored data to indicate that they are DIRTY, or no longer VALID.

The step of identifying one or more available Pages where the received data can be stored can be implemented in a variety of ways. In many instances, the Flash controller will already be in possession of information that identifies a specific group of associated Blocks in physical memory that are available to store data. In such instances, the Flash controller 10 will then have an internal count indicating which Pages within the group of Blocks already have data stored therein and will use the next available group of Pages as a source for a Page within a Page Stripe for the data to be stored. This process is illustrated generally in FIG. 11.

Figure 11:
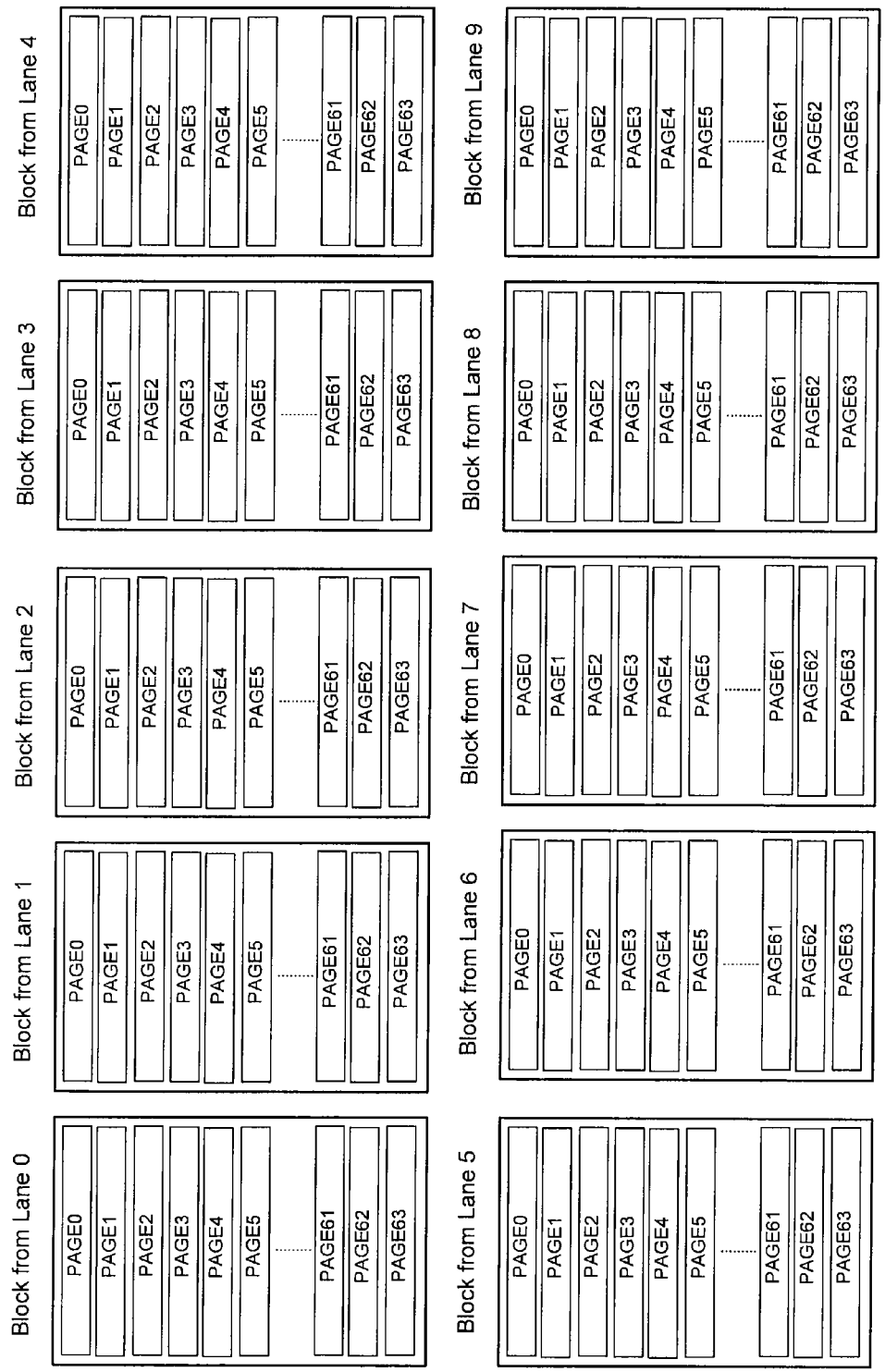
FIG. 11 illustrates an exemplary arrangement of Data Pages within groups of Blocks in accordance with the present disclosure.

FIG. 11 generally illustrates the selection of a Page Stripe location in instances where the Flash controller 10 is already in possession of information identifying a group of blocks in physical memory where data may be stored. Because the group of Blocks is intended for the storage of Page Stripes, and because there is a general one-to-one correspondence between the number of Blocks in the group of Blocks and the number of Pages in the Page Stripes that are stored in the Blocks, the group of Blocks is referred to herein as a Block Stripe. In the example of FIG. 11, the Block Stripe is sized to have ten Blocks such that the Page Stripes stored within the Block Stripe have nine Data Pages and one Data Protection Page.

Figure 12:
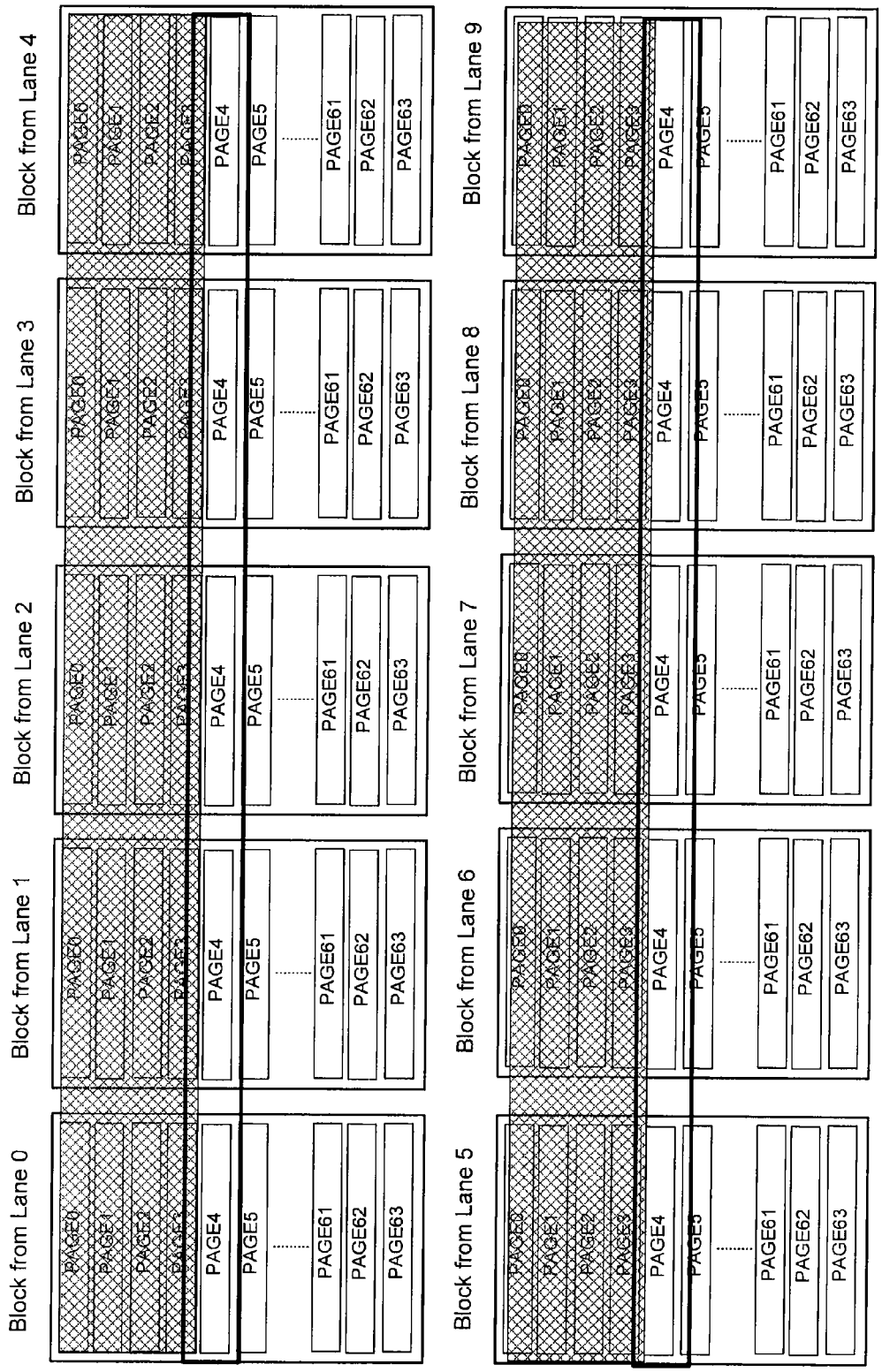
FIG. 12 illustrates an exemplary arrangement of Data Pages within groups of Blocks where data pages that already contain data are indicated as unavailable in accordance with the present disclosure.

In Flash memory, it is beneficial to write data into a Block sequentially, by Page. Thus, when writing to a Block of Flash memory, it is desirable and beneficial to write first to the PAGE0 location, then to the PAGE1 location and so on until the Block is full, or nearly full, of stored data. In the embodiment of FIG. 11, this form of writing is accomplished by having the Flash controller 10 maintain a count so that the first Page Stripe written into a given Block Stripe is written across all of the PAGE0 locations of the Blocks within the Block Stripe, the next Page Stripe across the next page (PAGE1) locations within the Block Stripe and so on. This is reflected in the illustrated example of FIG. 12 where it is assumed that the Flash controller 10, at the time it received the WRITE operation from the host device, had information indicating that the Block Stripe had locations available for storage of a Page Stripe. For purposes of explanation, it is also assumed that Page Stripes had already been stored in the PAGE0-PAGE3 locations within the Block Stripe as reflected in FIG. 12. Thus, in this example, the Flash controller would identify the Page Stripe for the PAGE4 locations within the Block Stripe as the physical location to which the received data should be stored.

In the previous example, it was assumed that the Flash controller 10 was already aware of a Block Stripe in which data could be stored. Under certain conditions, the Flash controller 10 will not be aware of a Block Stripe in which data can be stored. This condition can occur, for example, just after the Flash controller has written a Page Stripe to the last available page locations of a previously available Block Stripe. Under these conditions, the Flash controller needs a mechanism for identifying another available Block Stripe to store data.

In one embodiment of the memory system 100 described herein, the mechanism for identifying available Block Stripes involves having the Flash controller 10 pull data identifying an available (or free) Block Stripe from a buffer in which locations of Free Block Stripes are stored. This buffer, referred to herein as the Free Block Stripe Buffer, is a buffer that contains, for each entry, information that identifies a group of Blocks into which data can be stored in a Page Stripe manner. In this embodiment, the entries in the Free Block Stripe Buffer are such that all of the Blocks corresponding to an entry have been previously erased and are therefore available for the immediate storage of data.

In embodiments where the memory system 100 can store Page Stripes of different format, the Free Block Stripe Buffer may also contain specific information for each entry, or for a group of entries, indicating the format of the Page Stripes that can be stored in the buffer. For example, such entries may indicate that the Block Stripe corresponding to one particular entry of the Free Block Stripes buffer can store Page Stripes having nine Data Pages and one Data Protection Page and that the Block Stripe for a different entry can store Page Stripes having eight Data Pages and one Data Protection Page. This formatting information can be stored as part of the Free Block Stripe Buffer or could be stored in a different buffer. Alternatively, multiple Free Block Stripe Buffers could be maintained with each one storing Block Stripes capable of storing Page Stripes of different formats. In that embodiment, there would be one Free Block Stripe buffer that stored Free Block Stripes capable of storing Page Stripes having nine Data Pages and one Data Protection Page, another Free Block Stripe Buffer storing Free Block Stripes capable of storing Page Stripes having eight Data Pages and one Data Protection Page and, potentially other Free Block Stripe Buffers storing Free Block Stripes capable of storing Page Stripes having seven (or even fewer) Data Pages and one Data Protection Page.

In embodiments where there are one or more Free Block Stripe Buffers, each corresponding to Page Stripes of different formats, the Flash controller 10 can intelligently decide to select the entry in the Free Block Stripe Buffer that would optimize overall performance of the memory system 100. For example, if the Flash controller 10 was aware that the host device was attempting multiple WRITE operations to the system and each WRITE operation was associated with data sufficient to store nine Data Pages of data, or if the Flash controller 10 was attempting to move only nine pages of data, the Flash controller could select the Free Block Stripe Buffer entry corresponding to a Block Stripe of adequate size to store a Page Stripe with nine Data Pages (and one Data Protection Page). If the Flash controller 10 was aware that the host device was attempting multiple WRITE operations and all, or a substantial number of the operations involved quantities of data insufficient to fill nine Data Pages, or if the Flash controller was attempting to move less than nine pages of data, the Flash controller could select an entry from the Free Block Stripe Buffer corresponding to a different Page Stripe format (such as a Page Stripe with eight Data Pages and one Data Protection Page). (Move operations are discussed in more detail below.) In this manner, the overall operation of the system could be optimized.

Still further, in some embodiments of the memory system 100 of FIG. 1, the Flash controller 10 could select and have available for storage multiple Block Stripes. Thus, as long as the received WRITE operations from the host device, or data for a move operation, was such that there was sufficient data to fill nine Data Pages, the Flash controller could select Block Stripes sufficient to store Page Stripes with that number of data pages. If a WRITE or move operation was such that it did not have adequate data to fill nine Data Pages, or if the data when configured has a portion that could not fill nine Data Pages, the Flash controller 10—to the extent that it did not otherwise have an available Block Stripe of that format—could select a Free Block Stripe from the Free Block Stripe Buffers that was of a size appropriate to the amount of data to be stored. This approach could improve the overall performance of the system because, in the absence of such a step, it may be necessary to add dummy data (in the form of appended logical 0's or 1's) to received data to "fill" out a Page Stripe.

Various approaches and methods for populating the Free Block Stripe Buffer(s) are discussed in more detail below.

After an available Page Stripe location is selected, the Flash controller 10 will, in some embodiments, configure the data received during the WRITE operation so that it will "fit" into the selected Page Stripe location on a Page-aligned basis. This step will involve the Flash Controller 10 breaking up the received data into data groups appropriate for storage in a Page Stripe, generating the data to be stored in each Data Page of the Page Stripe (including any LBA data, CRC and/or ECC data as discussed above) and also generating the data for the Data Protection Page for the Page Stripe (as discussed above). Under circumstances where the amount of data from the host device that is to be stored in the Page Stripe is insufficient to fill out all of the Data Pages for the Page Stripe, the Flash controller 10 may append logical 1's or 0's (or any other data) to the data to be stored so that a complete Page Stripe of information can be written to the physical Page Stripe location.

While this configuration step is described above as following the step of selecting the Page Stripe location for the storage of the data, the order of steps could be reversed. In such embodiments, the configuration step could be used to identify the amount of data that was to be stored in the Page Stripe which could enable the Flash controller 10 to select the available Page Stripe location that would minimize or eliminate the need to append data bits to the stored data to fill out the Data Pages for the Page Stripe. Since such appended data bits do not constitute actual host device stored data, the reduction of the extent of the appended bits can enhance overall system performance.

After the data to be stored is configured as described above, the configured Page Stripe is written to physical memory. This step involves the Flash controller 10 issuing the appropriate commands across the communication bus 16 to indicate to the memory storage devices that write operations will occur, to indicate the specific Page locations where the write operations will occur and to provide the data for those operations. As noted above, because of the design of the memory system 100, the write operation may occur simultaneously or near-simultaneously for the Pages that make up the Page Stripe being stored.

At, after, or prior to the time of the actual writing of the Page Stripe data to physical memory, the Flash controller 10 will update the Logical-to-Physical conversion table to associate each LBA provided by the host device with the actual physical location at which the data corresponding to each LBA was stored.

In some embodiments. The Flash controller will, when creating, modifying or writing the Logical-to-Physical conversion table (sometimes called the "LPT") it will add to the data in the LPT additional error detection and/or error correction information such that some or all of the data in the LPT is protected against errors. The error detection and/or correction information can take many forms. For example, the error detection can take the form of single or multiple parity bits. The error correction, for example, could be in the form of a multi-bit Hamming code or any other known error correction coding technique. Alternate embodiments are envisioned where error detection and/or correction information is added to information and data stored in any volatile storage on the printed circuit board forming the Flash-based memory system.

Other embodiments are envisioned where the Flash controller 10 will write data to the memory array 14 on a Page-by-Page basis as data is received from a host device. Thus, as a given Page of data is received and a WRITE request is received, the Flash controller will write the data to the next Page in the current Page Stripe. In this embodiment, because data is written as received on a Page-by-Page basis, there is the potential that a READ operation could be requested of a Page before the Page Stripe containing that Page is "filled-out" and before the Data Protection Page for the Page Stripe containing the Page is stored to physical memory.

If a READ operation is received for a Page written in such a manner, the Flash controller can retrieve the data for the requested Page and, assuming that the ECC and CRC data confirms that the Page has valid data and/or identifies an error that can be corrected through use of the ECC data within the Page, provide the requested Page of data to the host device. In such a circumstance, there is no need to complete the Page Stripe before servicing the READ request. The memory system 100 can simply service the READ request and wait for the receipt of adequate information to complete the Page Stripe at some point in the future.

In the embodiment described above, however, there is a potential that the requested Page will have an error associated with it that cannot be corrected using the intra-page ECC and CRC data. In such a scenario, it may be necessary to utilize the Data Protection Information for the incomplete Page Stripe, which currently resides in the addressable XOR memory buffer associated with that Page Stripe. To do so, the Flash controller 10 could: (i) take the accumulated XOR data for the "incomplete" Page Stripe; (ii) modify the format for the Page Stripe at issue so that the modified format includes only the received data as of that time (e.g., if only seven Data Pages had been received, the modified Page Stripe format would have seven Data Pages and one Data Protection Page); and (iii) write the then-accumulated XOR data to the Data Protection Page for the reformatted Page Stripe. The system could then use the complete modified Page Stripe to recreate the data for the Page that was corrupted. The next WRITE operation received by the system would then be directed to a different Page Stripe. This approach would, therefore, allow the system to modify and "complete" a Page Stripe and use the Data Protection Page information for that Page Stripe to regenerate data from a lost or corrupted page without having to either: (a) wait until a Page Stripe of nine Data Pages and one Data Protection Page is completed, or (b) complete a ten-Page Page Stripe through the writing of dummy data (e.g., 0's, 1's, or other dummy data).

Populating the Free Block Stripe Buffer(s)

As noted above, depending on the embodiment, one step of the WRITE operation can involve the Flash controller 10 pulling Free Block Stripe information from one or more Free Block Stripe Buffers. The following discusses the manner in which the Free Block Stripe Buffer (or Buffers) can be populated. In one embodiment, the Free Block Stripe Buffer(s) is/are populated through the use of apparatus and methods that:

(i) monitor the memory array to identify Blocks that are in a condition to be erased;

(ii) place the identified Blocks in one or more buffers that store information concerning Blocks that are ready to be erased;

(iii) monitor the ready to erase buffers to identify Blocks that, according to certain conditions, may be associated with one another to form a Block Stripe;

(iv) upon identifying Blocks that may be associated with one another to form a Block Stripe in accordance with the applied conditions:

(a) move VALID data as may be necessary from the identified Blocks to other physical storage locations;

(b) perform ERASE operations on the identified Blocks once cleared of VALID data;

(c) associate the identified Blocks with one another to form a Block Stripe that is free and available for data storage; and (d) place information identifying Free Block Stripes in one or more of the Free Block Stripe Buffers (described above).

To understand the following discussion it is helpful to have an understanding of certain aspects of a Flash memory device. In general, a particular Page within a Flash memory device must be completely erased before any data can be written to that Page. As discussed above, the ERASE operation typically involves the setting of the bits in a particular Block of data to a logical 1 state or a logical 0 state. After a Block of Flash memory has been erased, data can be written into the Pages within that Block. As discussed above, it is beneficial to perform such write operations on a sequential, Page-by-Page basis, such that data is first written to the PAGE0 location, then to the PAGE1 location, and then continuing sequentially through the pages of the Block. Because of this aspect of Flash memory, whenever a host device attempts multiple WRITES to the same logical address, or LBA, it is not possible or optimal to write the data associated with that request to the same physical memory locations. This is because writing to the same physical Page would first require a lengthy erasure of the block in which the Page resides. Thus, in certain embodiments of the systems disclosed herein, sequential WRITE operations directed by the host device to the same LBA will commonly and typically involve write operations to different physical locations. When this occurs, the data that was previously stored in the physical location formerly associated with the LBA is no longer valid data. It is, as described herein, DIRTY data, in that it no longer is guaranteed to correspond to the actual valid data associated with the LBA at issue.

Identification of Blocks that are Ready to be Erased

Because ERASE operations in Flash memory devices are performed on a Block-by-Block basis, and because the presence of a DIRTY Page within a Block does not necessarily indicate the presence of another DIRTY Page within the same Block, it is not optimal to ERASE a Block simply because one (or even several) Pages of data become DIRTY. However, it has been discovered that it is also not optimal for the memory system 100 to wait until conditions exist in which the Pages within a given Block become DIRTY. This is because such conditions may not occur or, if they do occur, they occur at intervals that are not optimal for system performance. Thus, in certain embodiments of the memory system 100 disclosed herein, apparatus and methods are used to monitor the memory array to identify Blocks that are in a condition to be erased. This identification is done in a manner that optimizes overall system performance.

In this embodiment, the system maintains one or more tables that track the DIRTY status of various pages within the system. In one embodiment, one or more tables are maintained that track, for each Block Stripe, the number of DIRTY pages within the Block Stripe. In such an embodiment, a Block Stripe State Table can be maintained, with each entry in the table corresponding to a given Block Stripe. Whenever the table indicates that a Block Stripe is sufficiently dirty, the remaining valid data in the Block Stripe could be written into alternate physical memory locations through a move operation and the LPT table updated to reflect the move.

In some embodiments, a previously erased Block Stripe will be directly placed in the Free Block Stripe Buffer. However, in situations where one or more of the Blocks within the Block Stripe are determined to be bad or where a Flash chip or portion of a chip containing the Block Stripe is determined to be bad, the Block Stripe that was erased cannot be used. In such situations new Block Stripes can be assembled from the "good" Blocks of such Block Stripes using one or more Ready-to-Erase Buffers that contain information about Blocks within such Block Stripes.

Assembly of Free Block Stripes Using the Ready to Erase Buffer(s)

In the exemplary memory system 100 of FIG. 1, a beneficial approach involving the use of one or more Ready-to-Erase (or "RTE") Buffers is utilized. In this approach, the memory system 100 maintains one or more of a number of related Ready-to-Erase buffers in which information identifying one or more Blocks of physical memory that are ready to be erased are maintained and in which the system follows a process of using the data in the Ready-to-Erase buffer to select blocks of data for efficient Erasing operations.

Figure 13:
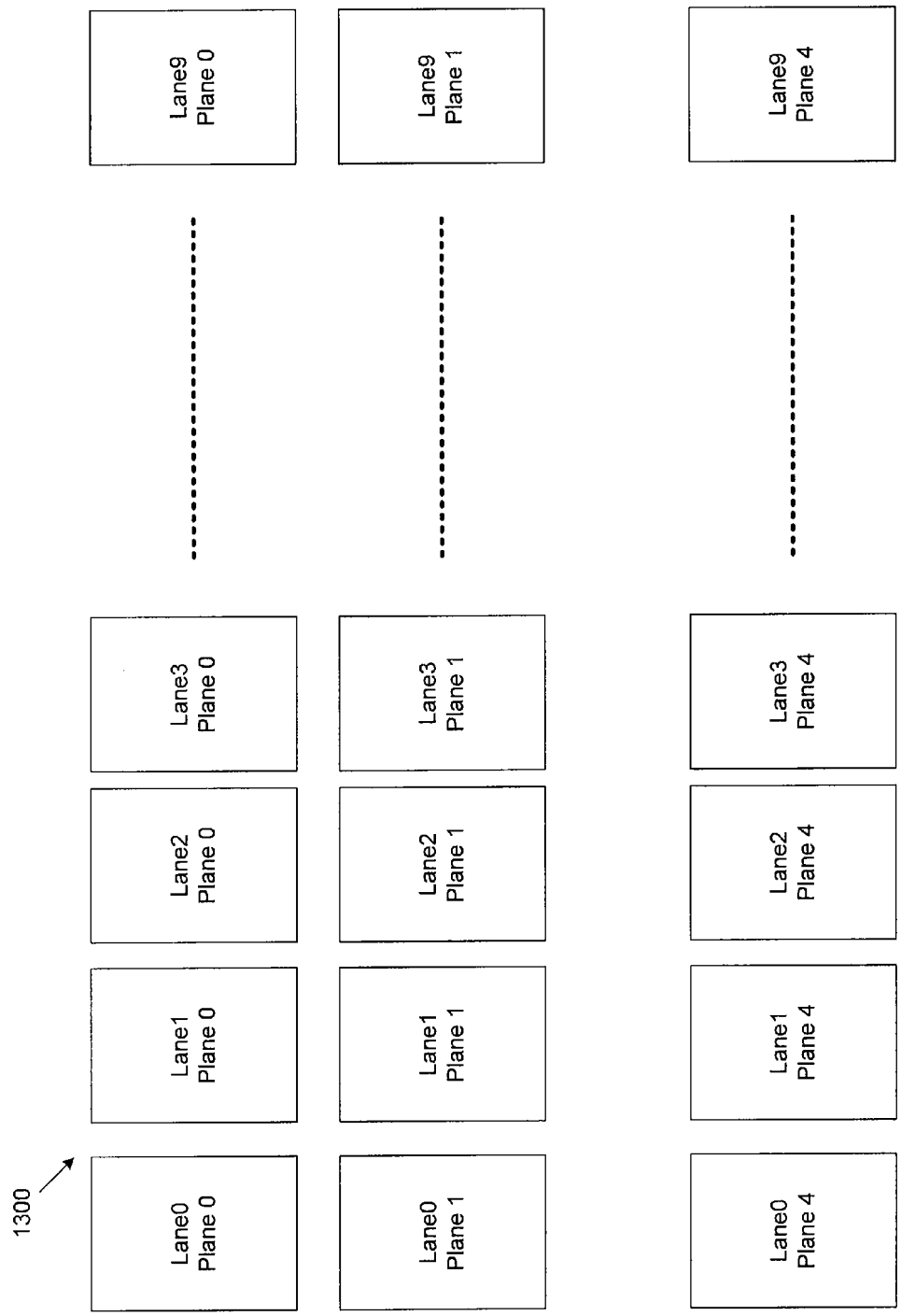
FIG. 13 illustrates an exemplary Ready-to-Erase buffer in accordance with the present disclosure.

FIG. 13 illustrates one exemplary set of RTE buffers 1300 that may be utilized with the memory system 100 of FIG. 1. The illustrated set of buffers is for a given Chip Enable. The RTE buffers within the set 1300 can be maintained as individual buffers, a large arrayed buffer, or a collection of arrayed buffers. The arrangement is not critical as long as the Blocks within the RTE buffer set 1300 can be identified (and selected for association with one another) on a per Lane and per Plane basis. The buffers within set 1300 may be maintained by CPU 15 and stored within a memory location utilized by CPU 15. The buffers within the set 1300 may be first-in first-out (or FIFO) buffers.

As noted above, in the example of FIG. 13, the RTE buffers are maintained on a per Lane and per Plane basis such that the set 1300 of RTE buffers identifies, at any given time, Blocks of memory that are ready to be erased and, for each such Block, the specific Lane and Plane associated with that Block. Because of this organization, the memory system 100 can use the RTE buffers to efficiently perform ERASE operations to optimize the overall performance of the system 100.

In one embodiment, the CPU 15 within the memory system 100 monitors the information in the RTE buffer set 1300 to identify groups of Blocks within the RTE buffer that are associated with memory locations that can be used to efficiently store a Block Stripe of data. When such a group of Blocks is identified, the CPU 15 will execute instructions to: (1) cause an ERASE operation to be performed on the Blocks within the identified group, and (2) cause one or more indications to be provided that: (a) associate the Blocks in the identified group with one another so that memory locations within the Blocks can be used to store Page Stripes of data, and (b) indicate that the Blocks that make up the identified group are free and available to store data.

Various approaches can be implemented using CPU 15 to identify Blocks within the RTE buffer set 1300 that are optimal for use in storing Page Stripes of data.

For various reasons, it can be beneficial to store the Pages within a Page Stripe of data in memory locations that are: (a) associated with different Lanes, and (b) within corresponding Planes. In this context, Pages within "corresponding planes" are simply Pages whose physical addresses share the same Page Index (the component of the physical address that identifies the Plane in which the Page resides). The same definition applies to Blocks within corresponding Planes.

Exemplary benefits of having the Pages of a Page Stripe correspond to different Lanes were discussed above.

The primary benefit of having all Pages within each Page Stripe share the same Plane Index is a significant reduction in the "bookkeeping" associated with the Page Stripe. Knowledge of the Plane in which each Page resides is useful for the execution of efficient move operations (transferring VALID data out of Pages within a soon-to-be-erased Block Stripe). One approach for such movement of data would be to READ the data from each original Page into a buffer external to the Flash chip and then WRITE the data back into a Page within the same or a different Flash chip. While such an approach accomplishes the ultimate objective of moving the data from the original Page location to a new Page location, the approach requires the time and overhead associated with providing the data external to the Flash chip and writing the data from an external location into a location within the same or a different Flash chip. Another approach allowed by many Flash memory chips is to take advantage of the fact (generally described above) that the Pages within a given Plane of a Flash chip typically share input/output circuitry, including an Input/Output (I/O) Buffer. Because of this shared I/O circuitry, it is possible to move data from one Page within a particular Plane into another Page within the same Plane without having to transfer the data externally and without the corresponding expenses (in terms of time, power, etc.). Many Flash devices provide support for such intra-Plane moves. Although intra-plane MOVE operations require only that the source and destination reside in the same Plane, in some embodiments, the exemplary system of 100 may require that all Pages within the source Block Stripe reside in corresponding Planes. Such requirement may greatly reduce the time and storage resources required for maintaining and tracking Plane Indices for each Block Stripe. Instead of independent Plane Indices, all Pages within each Block Stripe may share one Plane Index.

In accordance with the teachings of the present disclosure, one approach for identifying a suitable group of Blocks within the RTE buffer set 1300 to obtain the advantages described above would be to monitor the Blocks in the buffer set 1300 to determine when groups of Blocks can be identified where the Blocks within the candidate group are: (a) associated with physical addresses in different Lanes, and (b) associated with the corresponding Planes. Under this approach, the system CPU 15 would execute instructions that associate the Blocks within the candidate group with one another and that cause an ERASE operation to be performed on the Blocks within the candidate group.

The precise approach used to determine when sufficient Blocks of data have been identified that meet the above criteria (e.g., different Lanes, corresponding Planes) can vary depending on the operational status of the memory system 100. For example, when the RTE buffers are populated such that the overall set of candidate blocks is uniformly distributed across Lanes and Planes, then the CPU may simply wait until there is one block in each Lane, with each block residing in the same corresponding Plane. This approach would allow the Page Stripe that could be formed from the group of Blocks to have the maximum number of Pages (assuming that each Page of data was to be stored in an address with a different Lane association). Because this approach would maximize the amount of data stored in each Page Stripe, it may be the initially preferred approach and, the system 100 may first look for groups of Blocks within the RTE buffer set 1300 such that: (i) each Block is associated with a different Lane; (ii) each Block is associated with the same corresponding Plane; and (iii) the number of Blocks is equal to the number of Lanes.

Under certain operating conditions, the population of the Blocks in the RTE buffer set 1300 may be such that it is difficult or impossible for the system to readily identify a candidate group of Blocks meeting the preferred criteria described above. This condition could exist, for example, when one or more of the Flash memory chips that make up the memory array 14 fail. While failures are not common and not expected, they can occur. Thus, it is possible that, for a given memory array 14, one or both of the Flash memory chips associated with a given Lane could fail. In embodiments where only known-good Blocks are placed in the RTE buffer set 1300 and where both Flash chips associated with a given Lane fail, the failure of the Flash chips would ensure that no Blocks associated with that Lane are placed in the RTE buffer. The absence of Blocks associated with the Lane associated with the failed Flash chips would ensure that the preferred conditions (where there is a Block associated with each Lane) would not occur.

In addition to complete chip failures, partial chip failures could create conditions under which it would be difficult to identify candidate groups within the RTE Buffer set 1300 that meet the preferred conditions. For example, while complete Flash chip failure is relatively rare, it is not uncommon for given Blocks within a chip, given Planes within a chip, or given CEs within a chip either to fail during operation or to be inoperative upon initial use of the chip. Again, in embodiments where only known-good Blocks are placed in the RTE buffer set 1300, these failures can significantly reduce the number of Blocks that are placed within the RTE buffer set 1300 for a given Lane and/or given Plane.

It should be understood that, as used herein, the failure of a chip or the failure of a portion of a chip can include the actual failure of a chip or the occurrence of a situation indicating an anticipated or predicted failure of a chip or a portion of a chip.

Still further, the manner in which data is written to and/or read from the memory array can create conditions under which it is difficult to identify groups of Blocks in the RTE buffer set 1300 meeting the preferred conditions.

Under conditions as described above, in which the preferred conditions for the selection of groups of Blocks in the RTE buffer set 1300 do not readily exist, the memory system 100 may operate to select groups of Blocks that, while not meeting the preferred conditions, meet a first reduced set of conditions that are appropriate for the operation of the system. For example, if the population of Blocks within the RTE buffer set 1300 is such that the system cannot, after a given amount of time or operational cycles, identify a group of Blocks meeting the preferred conditions, the system may determine whether a group of Blocks meeting another set of conditions can be identified. For example, if a group of Blocks cannot be identified where there is one Block associated with each Lane in the system, the system may determine whether a group of N Blocks can be identified from different Lanes, where N is one less than the total number of available Lanes. If such a group of Blocks can be identified that meets this first reduced set of conditions, the system can then associate that group of Blocks together as a location for storing Page Stripes, where the number of Pages in such Page Stripes is one less than the total number of Lanes in the system, and ensure that ERASE operations are performed on the Blocks within that group.

If the population of the RTE Buffers is such that it is difficult or impossible for the system to identify groups of Blocks in the RTE buffer set 1300 meeting the first set of reduced conditions, the system could attempt to identify blocks meeting a second set of reduced conditions such as, for example, conditions where there are N' Blocks that can be identified, where N' is two less than the number of available Lanes. The operations using this second set of reduced conditions could follow those described above in connection with the first set of reduced conditions. Depending on the system, the system could look for groups meeting other sets of reduced conditions, if an inadequate number of groups of Blocks meeting the already presented sets of reduced conditions were identified.

In the embodiment described above, the operation of the system in terms of accepting and using groups of Blocks in the RTE buffer set 1300 meeting conditions other than the preferred conditions can be static or can vary depending on the operational state of the memory system 100. For example, during periods where there is little write activity occurring within the system, such that there is not a great need for a large number of available Page Stripe locations ready to receive data, the system 100 could operate under conditions where it waits to identify groups of Blocks meeting the preferred conditions before taking action. During periods where there was a large amount of write activity, such that there was a significant need for available Page Stripe locations, the system could more readily process groups of Blocks meeting reduced criteria. Still alternate embodiments are envisioned where the system 100 would be willing to accept groups meeting reduced criteria until a desired inventory of available Page Stripe locations was assembled and thereafter, as long as the inventory was at or near the desired inventory, utilize the preferred criteria. In such embodiments, the desired inventory count could be static or variable depending on the write activity of the system 100.

It should be noted that the system and methods described above can result in operation of the system 100 where the data stored in the memory array 14 is stored in Page Stripes having different numbers of Pages and, therefore, different amounts of stored data and different data protection information. For example, if the operation of the system described above resulted in some Page Stripes that include ten pages and others with nine pages, there would be differences between the amounts of data stored within the Page Stripes (some would have nine Data Pages and others eight Data Pages) and also differences in the Data Protection mechanism used to protect the stored data (in one example some Data Stripes would have data protected using data protection information obtained by XORing data from nine Pages of data, while others would use data protection information obtained by XORing data from eight Pages of data).

Exemplary READ Operations

Having described how WRITE operations may be accomplished using the memory system 100 disclosed herein, and how move operations may be made to move valid data from one Block that is to be erased into another Block, a general discussion of the manner in which READ operations is performed shall be provided.

In general, a READ operation is performed when the Flash controller 10 receives a READ request from an external host device. In general, the READ request will comprise a request from a host device to READ a Page of data associated with a particular LBA provided by the host device. To perform a READ operation, the Flash Controller will, in one embodiment:

(i) look up the LBA in the Logical-to-Physical translation table to identify the particular physical address where the Page storing the requested data is located;

(ii) issue a READ request to read the Page of stored data at the physical location corresponding to the requested LBA;

(iii) validate and, if necessary, correct or reconstruct the requested data using the ECC data and/or the information in the Data Protection Page for the Page Stripe corresponding to the requested LBA; and (iv) provide the host device with the retrieved Page of data.

The order of operations set out above is exemplary and embodiments are envisioned where the order is different from that set out above. For example, embodiments are envisioned wherein steps (iii) and (iv) are interchanged and the data would be provided to the host device followed by an indication of whether the data was valid or not.

In one embodiment, this reading of data is done on a Page specific basis, where the Page of data that is retrieved corresponds to the Page of data associated with the LBA provided by the host device. However, if the Page of data retrieved as a result of the READ operation is determined to be corrupted to a point that it can not be corrected through intra-Page ECC and/or CRC (or if the page is determined to have failed or to be unreadable for any reason) then the Data Pages and the Data Protection Page for the Page Stripe in which that Page resides may be read and used to reconstruct the data within the Page associated with the LBA provided by the host device.

Response to Chip or Intra-Chip Failures

Because the system described above will: (a) check the validity of the data in each retrieved Page of data using the ECC and CRC data for that page; and (b) if necessary, use the Data Protection Page information within the Page Stripe where the Page is found to identify and correct Page failures or corruptions that can not be corrected through ECC, it is possible to identify data errors within the Pages that make up a Page Stripe. Such data errors can take the form of "soft" errors or "hard" errors. In general, a soft error is induced by transient events that cause one or more bits of data to be corrupted but that is not indicative of a physical problem with a specific Flash memory storage cell (or groups of cells). True soft errors are substantially random and are typically not uniquely associated with any specific Pages, Blocks or other physical regions of the memory array.

A hard error is a corruption of one or multiple bits of data that is caused by a physical aspect of the memory storage device. Hard errors can be caused by a variety of factors including, but not limited to, the physical failure of components within a given memory chip (such as the failure of a charge pump), the physical failure of an entire memory chip or the external support structures for that chip (e.g., the breaking of a power line or an address line to a chip); the physical failure of all or part of a chip as a result of excessive temperature, magnetic field, humidity, etc. In general, because hard errors are related to the physical structure of a memory system, hard errors are uniquely associated with a particular collection of memory chips, a particular memory chip, or specific physical regions within a chip (such as a Chip Enable region, Plane or Block).

As noted above, data errors can be detected during a READ operation through the use of the ECC and CRC data for each Page. In many instances, identified data errors can be corrected through the use of ECC algorithms and/or through the use of the Data Protection information (in the event that a single Page exhibits an uncorrectable error). In such instances the ECC or Data Protection information can be used to recreate the corrupted data bit or bits, the recreated data can be placed within a new Page Stripe along with other Pages from the original stripe; and the new Page Stripe can be written back to the physical memory using the corrected data.

In certain embodiments, the memory system 100 will maintain records of the identified data errors and the physical structure associated with those errors. For example, in one embodiment, the memory system 100, and in particular the Flash controller 10, will maintain records reflecting the number of errors associated with the various Blocks, Planes and, potentially, Chip Enables and Chips within the system. When these counts show that the number of errors associated with a given Block, Plane, Chip Enable or Chip are above a predetermined threshold, they can indicate that there has been a failure of a given memory chip or of a given region within the chip (i.e., a given Chip Enable, Plane or Block within a chip). Under such circumstances, the memory system 100 can designate the Chip (or intra-chip) region as bad or failed by designating the Blocks within the chip or region as bad. In that embodiment, the Blocks that are identified as bad will no longer be used by the memory system for the storage of data. This can be accomplished by, for example, (i) not placing the bad Blocks into the RTE Buffer, such that they are not used in the construction of Free Block Stripes and, therefore, would not be used in a Page Stripe for the storage of data, or (ii) continuing to place the bad Blocks into the RTE buffer, but doing so under conditions under which the blocks are identified as bad.

In the embodiment where the bad Blocks are placed into the RTE buffer, an indication would be provided so that the system 100 could use that information when assembling Free Block Stripes. For example, if there were ten blocks that were in the RTE buffer that meet the conditions for being grouped together as a Block Stripe but one of the Blocks was a bad block, the system could then proceed to form a Block Stripe from the identified Blocks that would have ten Blocks, but would provide an indication as to the bad Block such that the Page Stripe format for that Block Stripe would only utilize the nine good Blocks.

The ability of the memory system 100 to identify a failed memory chip and/or failed region within a chip; designate the Blocks associated with the failed chip or region as bad and then adjust the format of the Page Stripes in response to the failed chip or region allows the system to adapt to chip or intra-chip failures in such a way that the overall operation of the memory system is extremely robust. FIGS. 14A-14D illustrate this point.

Figure 14A:
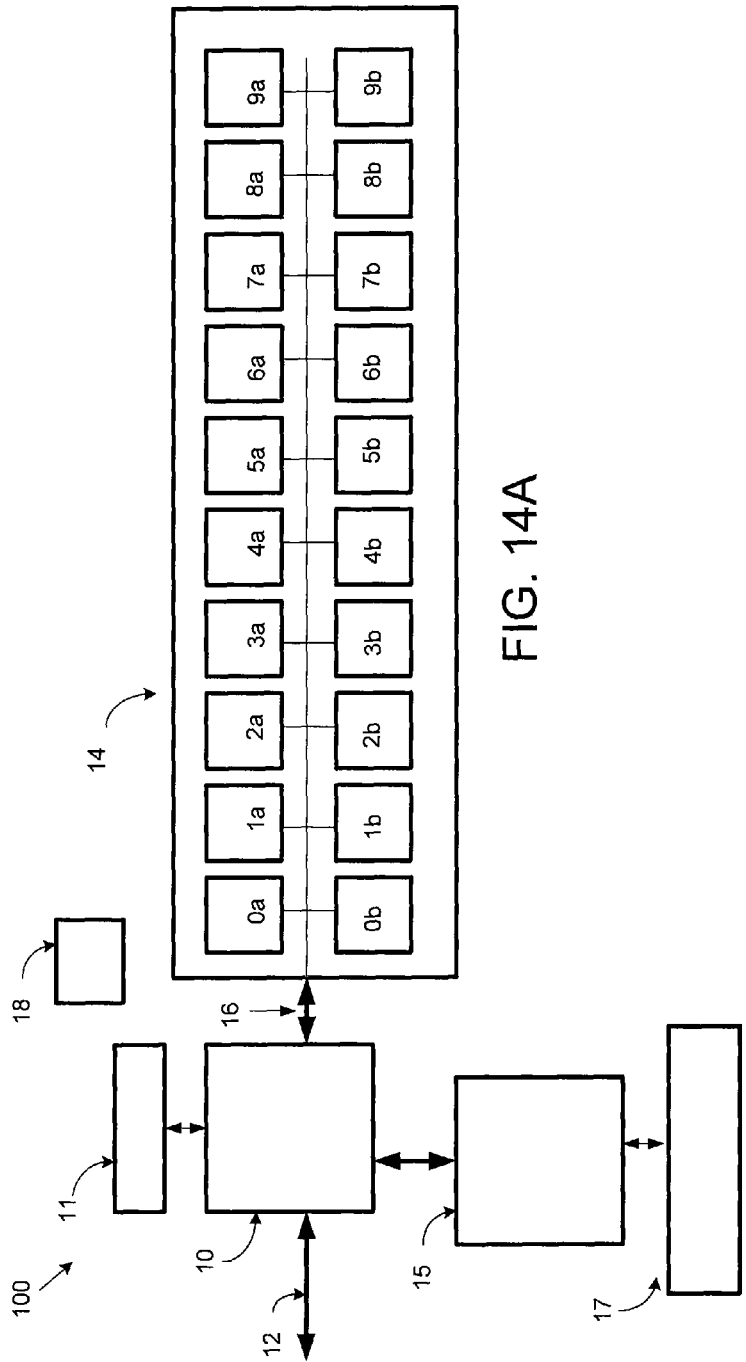
FIGS. 14A-14D illustrate another exemplary Flash memory storage system and exemplary storage arrangement where memory chips that have failed are indicated as unavailable in accordance with the present disclosure.
Figure 14B:
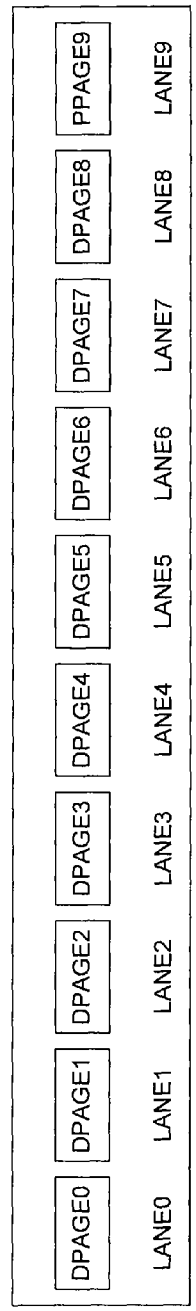

Referring to FIG. 14A, an exemplary memory system in accordance with aspects of the present disclosure is illustrated. Like the memory system 100 of FIG. 1, the memory system of FIG. 14A includes a Flash controller 10, a CPU 15, and a memory array that includes ten Lanes, with each Lane including two memory chips. Assuming that all of the blocks within all of the chips are "good" blocks, the system could store data in the memory array using Page Stripes that are formatted such that each Page Stripe, or at least the majority of Page Stripes, includes a Page stored in each of the ten Lanes (e.g., a Page Stripe having nine Data Pages and one Data Protection Page). This is generally reflected in FIG. 14B which shows the standard Page Stripe format for the embodiment of FIG. 14A.

Figure 14C:
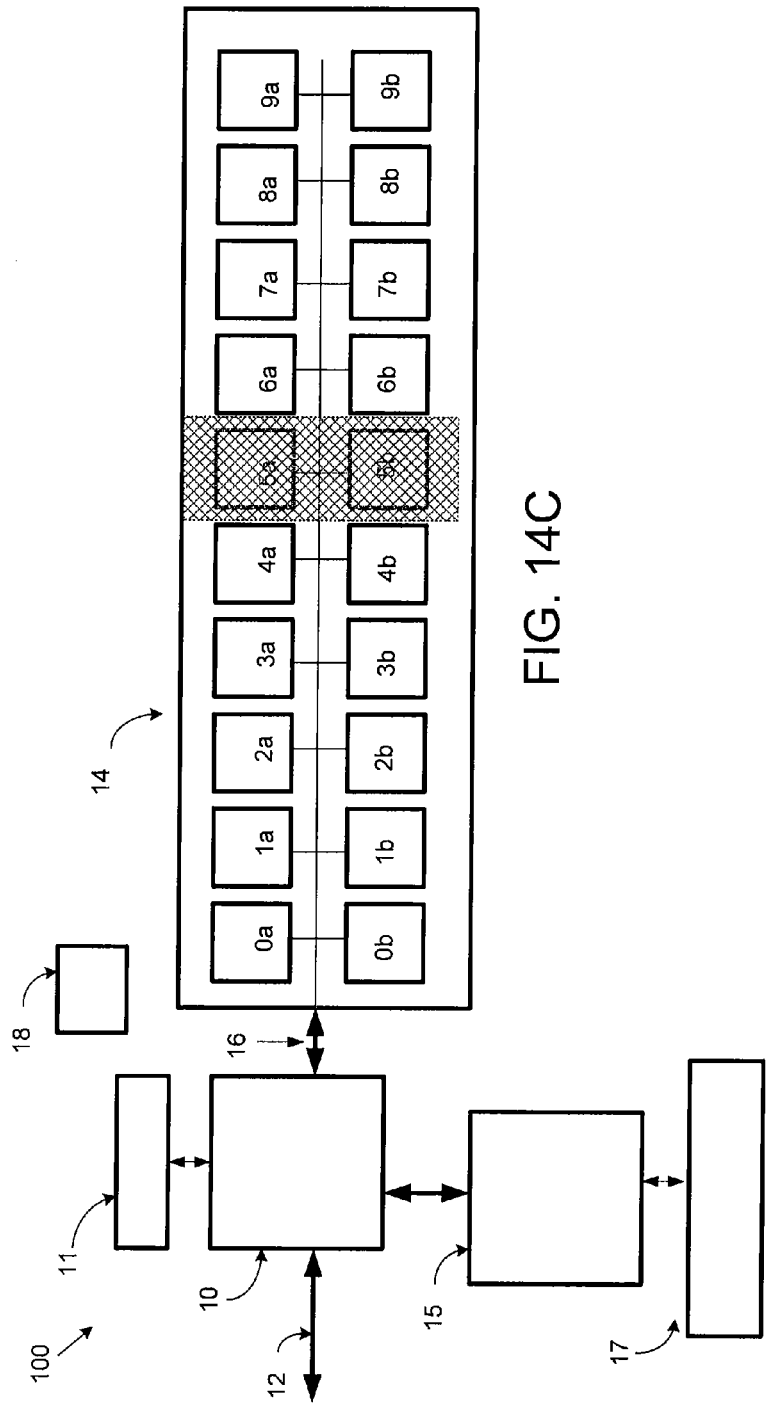
Figure 14D:
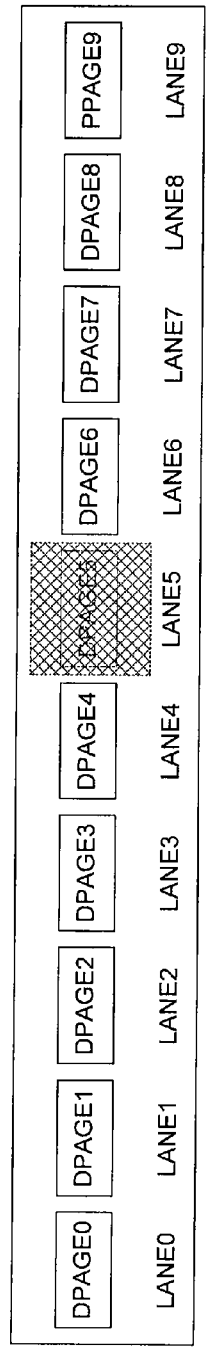

For purposes of the example of FIG. 14C, it is assumed that both of the memory chips associated with a given Lane fail and are no longer available to store data. In the illustrated example, it is assumed that the failure has occurred with respect to the chips in LANE5. This could occur, for example, as a result of a physical failure within the two chips or some damage being inflicted on the address or power lines to the chips in the Lane. Because of the nature of the described system 100, the failure of the chips in LANE5 would be detected and the system 100 could change the format of the Page Stripes that are used so that, as the system reads, writes and moves data, the data that was previously stored in physical locations across chips in all ten Lanes using a Page Stripe format with ten pages, is now stored across chips in only nine Lanes using a Page Stripe format with nine pages as reflected in FIG. 14D. Thus, in this embodiment, no data stored in the memory system 100 was lost, and the memory system 100 can self-adapt to the failure and continue to perform and operate by processing READ and WRITE requests from host devices. This ability of the described system to self-adapt automatically on the fly to chip and intra-chip failures makes the memory system disclosed herein extremely rugged and robust and capable of operating despite the failure of one or more chips or intra-chip regions. It also makes the system very user-friendly in that the failure of one, two or even more individual memory chips or devices does not require the removal and potential disposal of a previously used memory storage components.

It should be noted that the reconfiguration or reformatting of the data to change the Page Stripe format to account for chip or intra-chip failures may reduce the amount of physical memory space held in reserve by the system and available to the system for background operation. This reduction, however, is offset by the ability of the system to continue to operate properly in the event of a chip or Intra-chip failure.

Enhanced WRITE and READ Operations

In the examples described above, each READ or WRITE request issued by a host device will typically result in the performance of a READ or WRITE operation on locations within the physical memory array. While such operations can fulfill the operational goals of the memory system 100, they may not be optimal because: (i) the actual access of the physical memory array takes some amount of time (thus introducing some delay into the overall system operation), and (ii) the multiple accesses to the memory array tend to degrade the overall lifespan of chips that make up the physical array since Flash memory chips used to form the physical memory array can be subjected to only a finite number of ERASE operations and the repeated access will result in increased ERASE operations.

An alternate embodiment of the memory system 100 of FIG. 1 utilizes methods and apparatus to improve the overall performance and lifespan of the system. This is accomplished by having the system monitor the incoming WRITE requests to assess the specific data that the host device seeks to write to the memory system.

It has been discovered that many host devices issue a large number of WRITE commands that request the memory system 100 to write the same data string to the memory array. For example, experience has shown that it is not uncommon for a host device to issue a large number of WRITE commands requesting the memory system to write data consisting of logical 0's to various LBAs or a large number of WRITE commands requesting the memory system to write data consisting of logical 1's to various LBAs. It has also been discovered that, in various applications, it is not uncommon for a host device to issue a large number of WRITE commands requesting that a specific data string be written to various LBAs. This could occur, for example, when the host device was asking the memory system to store data associated with a specific physical measurement, for example the flow rate through a specific orifice. In such situations, if the physical parameter corresponding to the data was relatively constant (e.g., if the flow rate was constant) the host device would likely request that the same data (reflecting measurement of the parameter at different times) be stored at different LBAs.

To increase the performance of the overall memory system, the embodiment described herein utilizes hardware or a software process that first considers, for each WRITE request, whether the data associated with that WRITE request meets one of a number of predefined criteria. For example, the system could use hardware to determine if the data associated with the WRITE request consisted of logical 1's or logical 0's. If it were determined that the data associated with the WRITE request was within one of these predetermined categories, then the memory system would not write the data to the memory array, but would rather take an alternate course as described below.

In the alternate course, the memory system 100 would create an entry in the Logical-to-Physical Translation table (LPT) that associated the LBA provided by the host device with a specific Data Identifier. The Data Identifier would: (a) have the general format of the physical memory address identifier stored in the LPT when the LBA in the table is associated with data actually stored in memory, but (b) would not correspond to any specific physical address in the physical memory array. Instead, the Data Identifier would be associated by the system with a specific data string such that, for a given LBA entry, the presence of the Data Identifier would convey the data associated with the LBA, even though such data was not actually stored in a physical location within the memory array, and even though there was no actual physical memory location in the array associated with the LBA.

This aspect of the present disclosure is generally identified in FIGS. 15A-15B. For purposes of illustration, it is assumed that Data Identifiers have been predetermined that associate certain Data Identifier information with certain data strings. In the illustrated example, the Data Identifier FFFFF is associated with a data string of logical 0's; the Data Identifier FFFFE with logical 1's; and the Data Identifier FFFFD with alternating logical 0's and 1's (beginning with a logical 1). This is reflected in the Table in FIG. 15A.

FIG. 15B illustrates an exemplary LPT that has multiple entries, each entry being associated with a specific LBA. In the illustrated example, the addressing of the table is such that an LPT entry is associated with each LBA presented by the memory system.

FIG. 15B illustrates the situation that would exist if a WRITE operation is requested in which the data associated with the request is logical 0's and the WRITE request was directed to LBA 55. As reflected in this example, the system would, before executing the WRITE request, analyze the data associated with the request, and determine that it was logical 0's. This could be done through software analysis of the data or through the use of a hardware component, such as a comparator or large AND or OR device. Once it was determined that the data was logical 0's, the system would—instead of actually storing data in the memory array—discard the data provided by the host device and store the Data Identifier associated with that data string in the LPT location that would normally store the physical address where the data associated with the corresponding LBA was located.

FIG. 15B illustrates the situation that would exist if a subsequent WRITE operation occurred in which the WRITE was directed to LBA 500 with the data being logical 0's. Here, the system would, using the approaches described above, determine that the data was 0's, discard the data provided by the host device, and write the Data Identifier associated with the 0's string to the entry in the LPT associated with the LBA 500. Note that in this example, the entries for both LBA 55 and LBA 500 would have the same Data Identifier.

The same process would be followed for WRITE operations associated with data strings corresponding to other predefined Data Identifiers.

In terms of the WRITE operation, the use of the Data Identifiers as described above is beneficial because it does not result in the actual writing of data to the physical memory array and does not suffer the write overhead (time delay) that would occur if an actual write operation occurred. In one embodiment, the LPT table is stored in RAM memory and in particular, DDR2 RAM memory. In general, the access times required for RAM memory access are faster than those required for Flash memory access. Thus, by eliminating the need to actually access the Flash-based memory array, the use of Data Identifiers can substantially decrease the time seen by the host device for the performance of a write operation. Also, by eliminating the need to actually access the Flash memory array, the total number of ERASE operations can be reduced and the lifespan of the memory array increased.

The use of Data Identifiers also has an impact on READ operations. Specifically, when a READ operation is attempted for an LBA having an associated Data Identifier, the system 100 will determine that the access is to such an LBA and, instead of accessing an actual physical memory location within the Flash memory array, will return the data string associated with the Data Identifier. Depending on the mechanism used to provide the associated data string, the overall READ times seen by the host device may be decreased relative to what would have been seen had an actual access of the Flash memory array been required.

In the examples of FIGS. 15A-15B, the Data Identifiers were predefined to correspond to specific anticipated data strings. Alternate embodiments are envisioned in which some of the Data Identifiers are not predefined to be associated with specific data strings, but are rather constructed by the system 100 in response to the actual operation of the system For example, in some embodiments the system 100 can include a process that runs in the background during relatively idle time, in which the data actually stored in the memory array is considered. In this embodiment, if the analysis indicates that there is a sufficiently large number of data entries in the memory array corresponding to the same data string, the system would then define a Data Identifier as being associated with that specific data string and would modify the corresponding LPT entries. This process not only could speed up READ and WRITE requests as described above, it could also free up memory space within the memory array that would otherwise be used to store such repetitive data, thus providing more available physical memory and improving the overall operation of the system.

In an alternate embodiment, the system 100 can include a running Data String Cache memory that associates a Data Identifier with each of the most recent data strings associated with the last N number of WRITE operations (where N is a predefined number). In this embodiment, if a subsequent WRITE operation uses a data string associated with an entry in the Data String Cache, the Data Identifier will be used for that entry. A count can be maintained of the number of times a hit occurs for the entries in the Data String Cache. If it is determined that an entry has an insufficient number of Hits, then the particular entry can be deleted from the cache, the corresponding data string actually stored in physical memory and a physical memory location assigned to each of the corresponding LBAs in the LPT table. Another data string entry could then be placed in the Data String Cache.

Auxiliary Protection Stripes

While the use of Page Stripes as described above can provide beneficial protection of data stored in a Flash memory system, such use does not necessarily enable the reconstruction of a corrupted data page in the event that a plurality of the Data Pages within the Page Stripe are corrupted in such a manner that they can not be reconstructed using the ECC data within the corrupted pages. Under the system described above, if two or more Data Pages within a given Page Stripe are so corrupted, neither of the corrupted pages can be reconstructed using the data stored in the non-corrupted Data Pages and the Data Protection Page for that Page Stripe. To allow for enhanced protection of the data stored in the memory system, and to enable the reconstruction of corrupted data in the event that a plurality of Data Pages within a Page Stripe are corrupted, such that the data within those pages can not be reconstructed using the ECC data within such pages, one or more Auxiliary Protection Stripes may be used.

In general, an Auxiliary Protection Stripe is an association of pages of information, or data pages, wherein each Auxiliary Protection Stripe comprises: (i) a plurality of Data Pages, each of which is within a Page Stripe as described above, and (ii) an Auxiliary Protection Page that contains data protection information derived from the data stored in the Data Pages for a given Auxiliary Protection Stripe. In general, the Data Pages for a given Auxiliary Protection Page are selected such that no two Data Pages within the Auxiliary Protection Stripe are within the same Page Stripe. Because of the lack of Page Stripe overlap, the data within each Data Page stored in a system utilizing Auxiliary Protection Pages is protected at multiple levels. First, the data is protected by the ECC data within the Data Page itself, which can enable the correction of certain data errors. Second, the data is protected by the data in the Data Protection Page for the Page Stripe in which the Data Page is found. Third, the data in the Data Page is also protected by the data in the Auxiliary Protection Stripe in which the Data Page is found. Because of the multi-level nature of the protection, data stored within a Data Page associated with a Page Stripe that has multiple uncorrectable Data Page errors may be restored using the data in the Auxiliary Protection Page associated with that Data Page.

Figure 16A:
FIGS. 16A-16B illustrate an exemplary Flash storage arrangement in which Auxiliary Protection Stripes and Auxiliary Protection Pages may be used to reconstruct data where a plurality of Data Pages within a Page Stripe are corrupted.
Figure 16B:
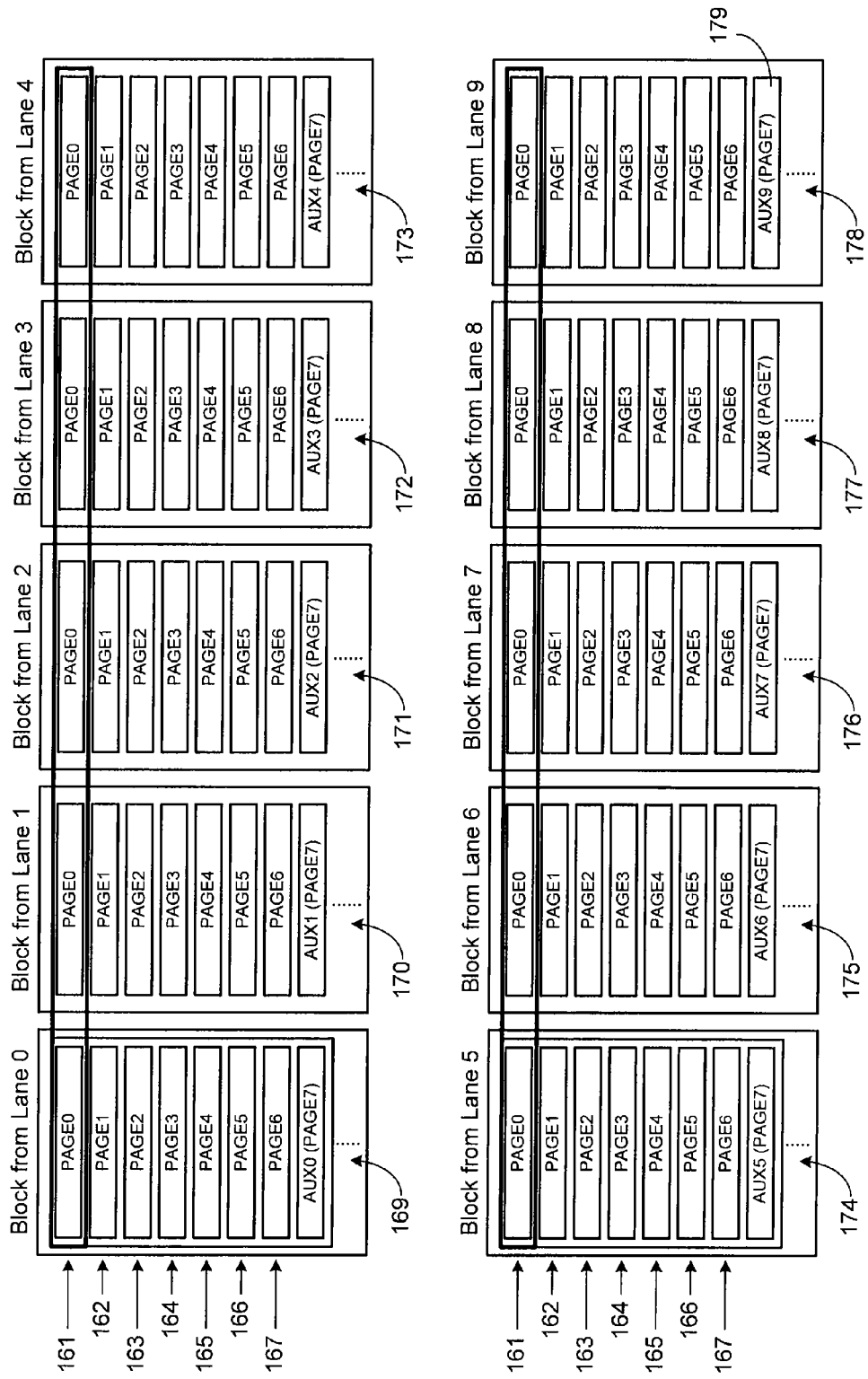

FIGS. 16A-16B illustrate an exemplary use of Auxiliary Protection Pages in a system having the overall structure and operation of the system previously described in connection with FIG. 11. Referring first to FIG. 16A, ten different blocks of Flash memory are illustrated, with each block of Flash memory being located within a different physical Flash memory device and each Block being associated with a different Lane. As described previously, the Pages within the Blocks can be associated with one another to form Page Stripes. In the example of FIG. 16A, seven exemplary Page Stripes 161-167, are illustrated. Each of the exemplary Page Stripes 161-167 includes nine Data Pages stored in one page location within the Blocks from Lanes 0-8 and a Data Protection Page stored in the corresponding page location within the Block from Lane 9. Thus, the Page Stripe 161 includes Data Pages and a Data Protection Page stored in the ten PAGE0 location of the illustrated Blocks and Page Stripe 162 includes Data Pages and a Data Protection Page stored in the ten PAGE1 locations of the illustrated Blocks, with the other exemplary Page Stripes 163-166 being similarly stored and with Page Stripe 167 being stored in the ten PAGE6 locations of the illustrated Blocks.

FIG. 16B illustrates the use of Auxiliary Protection Stripes. Referring to FIG. 16B, ten Auxiliary Protection Stripes 169-178 are illustrated. As may be noted, there is one exemplary Auxiliary Protection Stripe illustrated for each Block in FIG. 16B. In the illustrated example, each Auxiliary Protection Stripe is formed from seven Data Pages stored within the same Block and an Auxiliary Protection Page (AUX0-AUX9) stored in the same Block. Each Auxiliary Protection Page includes data protection information derived from the data stored within the seven Data Pages in the Auxiliary Protection Stripe. Thus, for example, the Auxiliary Protection Stripe stored in the illustrated Block from Lane 0 includes the Data Pages stored in the PAGE0-PAGE6 locations in the Block from Lane 0, as well as an Auxiliary Protection Page stored in the PAGE7 location within the same Block. Each of the other exemplary Auxiliary Protection Stripes are configured in a similar manner.

Figure 17:
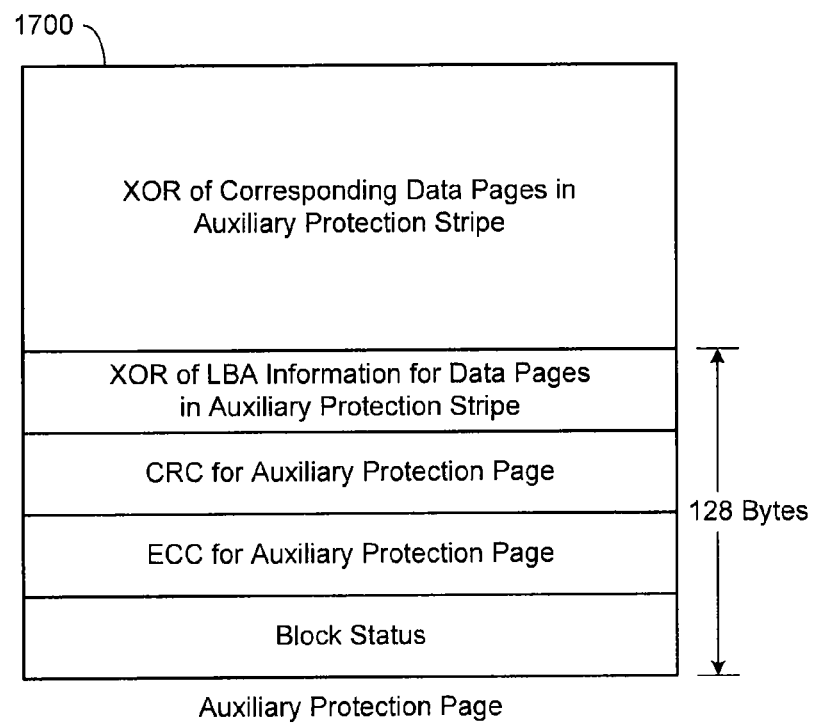
FIG. 17 illustrates an exemplary Auxiliary Protection Page similar to the Data Protection Page illustrated in FIG. 5 in accordance with the present disclosure.

In the example of FIG. 16B, each Auxiliary Protection Page is formed by taking the bitwise exclusive OR (XOR) of the data in the Data Pages within the Auxiliary Protection Stripe containing the Auxiliary Protection Page. As such, the structure and format of each Auxiliary Protection Page is similar to that of the Data Protection Pages described above. FIG. 17 illustrates the format of an exemplary Auxiliary Protection Page.

The use of Auxiliary Protection Stripes as reflected in FIG. 16B provides a second level of protection that can enable the reconstruction of corrupted data even if the data in multiple Data Pages within a given Page Stripe are corrupted. For example, one can assume a situation where the data within the Lane 3 and Lane 4 Data Pages of the Page Stripe 163 becomes corrupted. In such a situation, the data within the Data Protection Page in Page Stripe 163 can not be used to reconstruct the data. However, because the data within the Data Pages stored in each of the Lane 3 and Lane 4 locations would be protected by an Auxiliary Protection Page (AUX3 and AUX4, respectively), the data within those pages can be reconstructed using the data in the appropriate Auxiliary Protection Page.

In the illustrated example, the data for each of the Auxiliary Protection Pages can be determined in a manner similar to that described above in connection with the Data Protection Pages within the Page Stripes. Specifically, the data for each of the Auxiliary Protection Pages can be generated using a circuit and a process similar to that described above in connection with FIG. 6. However, it should be noted that a circuit as set forth in FIG. 6 would be used for each Auxiliary Protection Page. As such, during the course of writing data using the Page Stripe and Auxiliary Protection Stripe approach reflected in FIG. 16B, eleven different circuits as reflected in FIG. 6 would be used, one for generating the data protection information for each of the Page Stripes 161-167 and one for generating the protection data for each of the ten different Auxiliary Protection Stripes 169-178. Of note, the Auxiliary Protection Page AUX9 provides protection for the Data Protection Pages of the Page Stripes 161-167.

It should also be noted that the combination of the use of Page Stripes and Auxiliary Protection Stripes 169-178 as reflected in FIG. 16B provides a robust form of protection that can enable the correction of multiple data errors. This is generally reflected by FIGS. 18A-18C.

Referring to FIG. 18A, a highly simplified representation of an exemplary Flash memory system is illustrated in which data is stored in an arrangement that includes seven Page Stripes PS0-PS6 (illustrated as horizontal stripes), each containing nine pages of data and one page of data protection information and ten Auxiliary Protection Stripes APS0-APS9

(illustrated as vertical stripes), each containing seven pages of data and one page of Auxiliary Protection Data. The pages of Auxiliary Protection Data within the Auxiliary Protection Stripes APS0-APS9 are labeled APPAGE0-APPAGE9 in the figure.

As will be apparent from FIG. 18A, in the illustrated embodiment, each page containing stored data is associated with one page of data protection information for a Page Stripe and one page of Auxiliary Protection information. For example, the Data Page 183 is associated with the Data Protection information located in Data Protection Page 184 in Page Stripe PS2 and with the Auxiliary Protection Page 185 in Auxiliary Protection Stripe APS2. It may also be noted from FIG. 18A that the extent of overlap of any given illustrated Page Stripe and any given illustrated Auxiliary Protection Page is limited to a single Page containing stored data.

In the embodiment of FIG. 18A, the page of Auxiliary Protection Data 182 contains data that corresponds to the XOR of the data in the Data Protection Pages for the Page Stripes PS0-PS6. The data in that Auxiliary Protection Page 182 may be calculated from the XOR of the data in the Data Protection Pages for the Page Stripes PS0-PS6 as described above. The data in Auxiliary Protection Page 182, will also correspond to the XOR of the data in the Auxiliary Protection Pages APPAGE0-APPAGE8, such that—in some embodiments—the protection data for that page 182 could be generated by taking the XOR of the data in those Auxiliary Protection Pages. In some embodiments, the data obtained by taking the XOR of the Data Protection Pages of the Page Stripes PS0-PS6 can be compared to the XOR of the data in the Auxiliary Protection Pages APPAGE0-APPAGE8 as a form of parity check to verify the accuracy of the data.

The organization and storage of data as reflected in FIG. 18A allows for extremely robust reconstruction of corrupted data. For example, referring to FIG. 18B, it is assumed that two pages of data within the Page Stripe PS3, specifically Pages 186 and 187, are corrupted to the point that they can not be corrected using the internal ECC data for those Pages. Because there are two Pages with uncorrectable errors within the Page Stripe PS3, the Data Protection information for that Page Stripe can not be used to correct the errors. However, because Page 186 is part of Auxiliary Protection Stripe APS1, the Auxiliary Protection Page for that Auxiliary Protection Stripe, along with the other pages of data within the Auxiliary Protection Stripe APS1, can be used to reconstruct the data within Page 186. Once that reconstruction is completed, the data within Page 187 can be reconstructed using either the Data Pages and Data Protection Page of Page Stripe PS3 or the Data Pages and Auxiliary Protection Page within Auxiliary Protection Stripe APSE.

As another example, FIG. 18C illustrates a scenario in which the data at Pages 188, 189, 190, 191 and 192 are corrupted to the point at which data within the Pages can not be reconstructed using the internal ECC data for those Pages. This example reflects a situation that likely would not occur in practice, but one that is provided to reflect the significant degree of robust protection provided by the disclosed system. Referring to FIG. 18C, the extent of the errors is such that the Data Protection Page of Page Stripe PS5 can not be used to reconstruct the data in any of the corrupted Pages 188, 189 and 190, since Page Stripe PS5 has multiple corrupted Pages. The Data Protection Page of Page Stripe PS2 can not be used to reconstruct the data in the corrupted pages 191 and 192, since Page Stripe PS2 has multiple corrupted pages. Similarly, the information in Auxiliary Page Stripe APS5 can not be used to reconstruct the data in Auxiliary Page Stripe APS5 since that Auxiliary Page Stripe includes two corrupted Pages 190 and 191. However, the Auxiliary Page Stripe APS0 has only a single corrupted page, Page 188. As such, the data within Page 188 can be reconstructed using the Data Protection information, and the stored data, in Auxiliary Protection Stripe APS0. Similarly, the data in Data Page 189 can be reconstructed using the data in Auxiliary Protection Stripe APS3. Since the Data Pages 188 and 189 would now have properly reconstructed data, the Page Stripe PS5 would now only have a single corrupted page, Page 190, the Data Protection Page and the data within the Data Pages of Page Stripe PS5 could be used to reconstruct the data in Page 190. That reconstructed data could be used with the other information in Auxiliary Page Stripe APS5 to reconstruct the data in Page 191, which in turn could be used with the other information in Page Stripe PS2 to reconstruct the data in Page 192.

In certain instances, when Data Page errors occur that can not be corrected through the use of the ECC data internal to the page, either the Page Stripe or the Auxiliary Protection Stripe associated with that Data Page can be used to reconstruct the corrupted data. In certain embodiments, including embodiments where each Auxiliary Protection Stripe is stored in a single Block, the use of the Page Stripe as the basis for the reconstruction will be preferred over the use of the Auxiliary Protection Stripe since the data for the entire Page Stripe can be read out in parallel in a single READ operation, while the data in the Auxiliary Page Stripe would likely be read through multiple READ operations directed to the same block.

As the above examples reflect, the use of the Auxiliary Protection Pages significantly increases the ability of a system to correct and overcome a significant number of data errors, including multiple errors within multiple pages of a Page Stripe. This combination of inter-Page ECC data, Page Stripe data protection information, and Auxiliary Protection Stripe data protection information provides a powerful system that can be made less susceptible to errors and in which the useful life of the Flash media used within the memory array can be extended dramatically.

In particular, because the error correction described above is so robust, memory locations that are degraded to the point that they may be subject to errors can continue to be used for a longer period of time than in systems where the novel error protection system disclosed herein is not used. Also, because of the significant degree of protection afforded by this system, forms of Flash memory that have a more limited lifespan, and/or are more error prone (such as MLC Flash memory) can be beneficially used in such a system.

As will be apparent from the above, the number of data pages that are contained within an Auxiliary Protection Page is not limited to the disclosed example of seven and can be a number that is greater or less than seven. For example, in some embodiments, each Auxiliary Protection Stripe can include only three pages of data and one page of Auxiliary Protection Data. In other embodiments, each Auxiliary Protection Stripe can include fifteen data pages and one page of Auxiliary Protection Data. In a still further example, the data within a given Block of data can be combined into a single Auxiliary Protection Page. The precise number of data pages is not critical.

The number of data pages used to construct Page Stripes and the number of data pages used to construct Auxiliary Protection Stripes need not be the same. Moreover, the use of Auxiliary Protection Stripes does not require the use of Page Stripes of consistent length. As such, Auxiliary Protection Stripes can be used in systems having Page Stripes of variable lengths as described above.

In the Auxiliary Protection Stripe examples discussed above, each page within an Auxiliary Protection Stripe was located within the same Block of Flash memory as the other pages within the Auxiliary Page Stripe. This arrangement can be beneficial in embodiments where information is moved on a Block Stripe basis since the movement of an entire Block Stripe will not require any recalculation or reconfiguration of the Auxiliary Protection Stripes which will be moved, along with the data forming the Auxiliary Protection Stripes, as part of a Block Stripe move. This is not required, however, and the Auxiliary Protection Stripes can be formed from pages of data that are not stored in the same Block of Flash memory and/or the Auxiliary Protection Page for a given Auxiliary Protection Stripe need not be stored in the same Block of Flash memory as the data pages within the Auxiliary Protection Stripe. All that is generally required for the beneficial use of a system having both Page Stripes and Auxiliary Protection Stripes is that the data in the data pages to be protected by both stripes be associated with a Data Protection Page in a Page Stripe and an Auxiliary Protection Page in an Auxiliary Protection Stripe. In such systems, the amount of overlap between a Page Stripe and an Auxiliary Protection Stripe would be limited to a single page of data.

In the examples provided above, the Data Pages within a given Auxiliary Protection Page are located within the same Block of physical memory. It should be noted that the Auxiliary Protection Pages can be constructed from data physically stored in different Flash memory devices (i.e., different Flash memory chips). Thus, for example, referring to FIG. 1, an alternate embodiment can be envisioned wherein each Lane of the system is associated with "stacked" Flash memory devices: Lane 0a would be associated with two Flash devices stacked on top of each other, and Lane 0b would be likewise associated with two stacked devices. In such an embodiment, data pages at corresponding locations within the stacked devices, e.g., the data pages within the PAGE0 locations of given corresponding Blocks, could form the data pages of an Auxiliary Protection Stripe and the Auxiliary Protection Page for such an Auxiliary Protection Stripe could be stored in one of the stacked chips or in another location. In still another embodiment, an Auxiliary Protection Stripe could be formed from Data Pages located within different Planes, Chip-Enables, or DICE. For example, referring to FIG. 2A, embodiments are envisioned wherein Data Pages stored within different Chip Enables are combined to form an Auxiliary Protection Stripe. In one such embodiment, Data Pages stored in the same physical location (e.g., the DIE0, PLANE1, BLOCK3 locations) within a given physical Flash memory device are combined to form an Auxiliary Protection Stripe. In such an example, the data stored within the identified Data Pages for the Chip-Enables CE0-CE2 could be combined to form the Data Pages for the Auxiliary Protection Stripe and the Auxiliary Protection Page for the Auxiliary Protection Stripe could be stored in the corresponding location within the Chip Enable CE3. Still alternate embodiments are envisioned wherein corresponding physical locations within a given Chip Enable are combined to form an Auxiliary Protection Stripe. In short, Data Pages from any locations (either associated with each other as a result of the physical layout of the Flash memory devices or not) can be combined to form Auxiliary Protection Stripes.

It should also be noted that while the disclosed embodiments are limited to the use of only a single Auxiliary Protection Stripe, embodiments are envisioned wherein two or more Auxiliary Protection Stripes are utilized to protect the stored data. In such embodiments, the construction of the additional Auxiliary Protection Stripes should be such that the overlap between the data pages within the various Auxiliary Protection Stripes is such that added protection is provided for at least some of the data pages.

As discussed above, during normal operation of a Flash memory system as described herein, the movement of data within a Page Stripe and/or the writing of data to a Page Stripe can result in previously valid data within a Page Stripe becoming DIRTY or invalid. It should be noted that in embodiments where Auxiliary Protection Stripes are used, data having a status changed from valid to DIRTY can continue to be maintained in Flash memory and used for purposes of reconstructing data using an Auxiliary Protection Page. This is generally illustrated in FIGS. 19A and 19B.

Figure 19A:
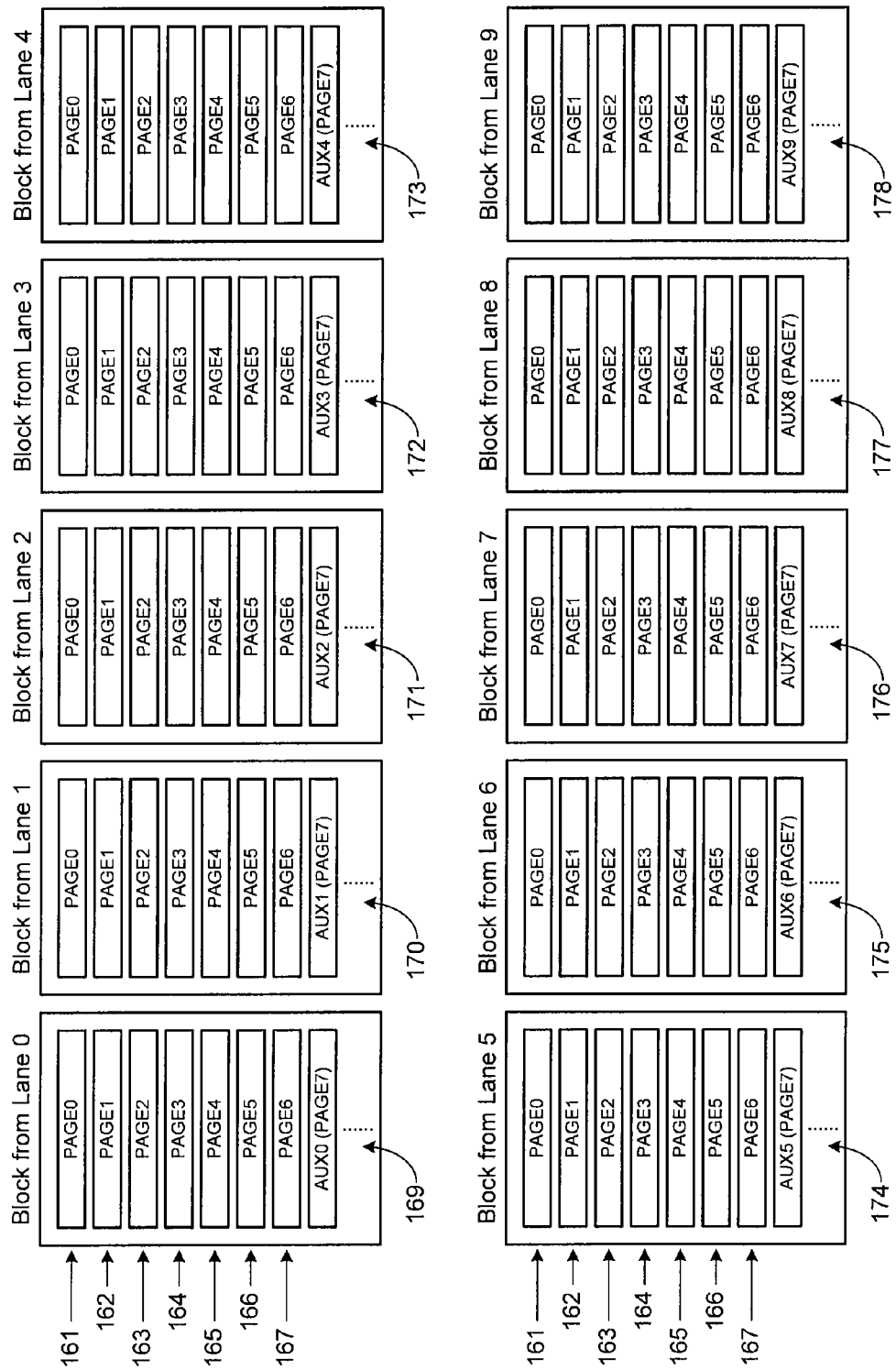
FIGS. 19A-19B illustrate an exemplary Flash storage arrangement in which data having a status changed from VALID to DIRTY continues to be maintained in Flash memory and used in conjunction with an Auxiliary Protection Page to reconstruct corrupted data pages.
Figure 19B:
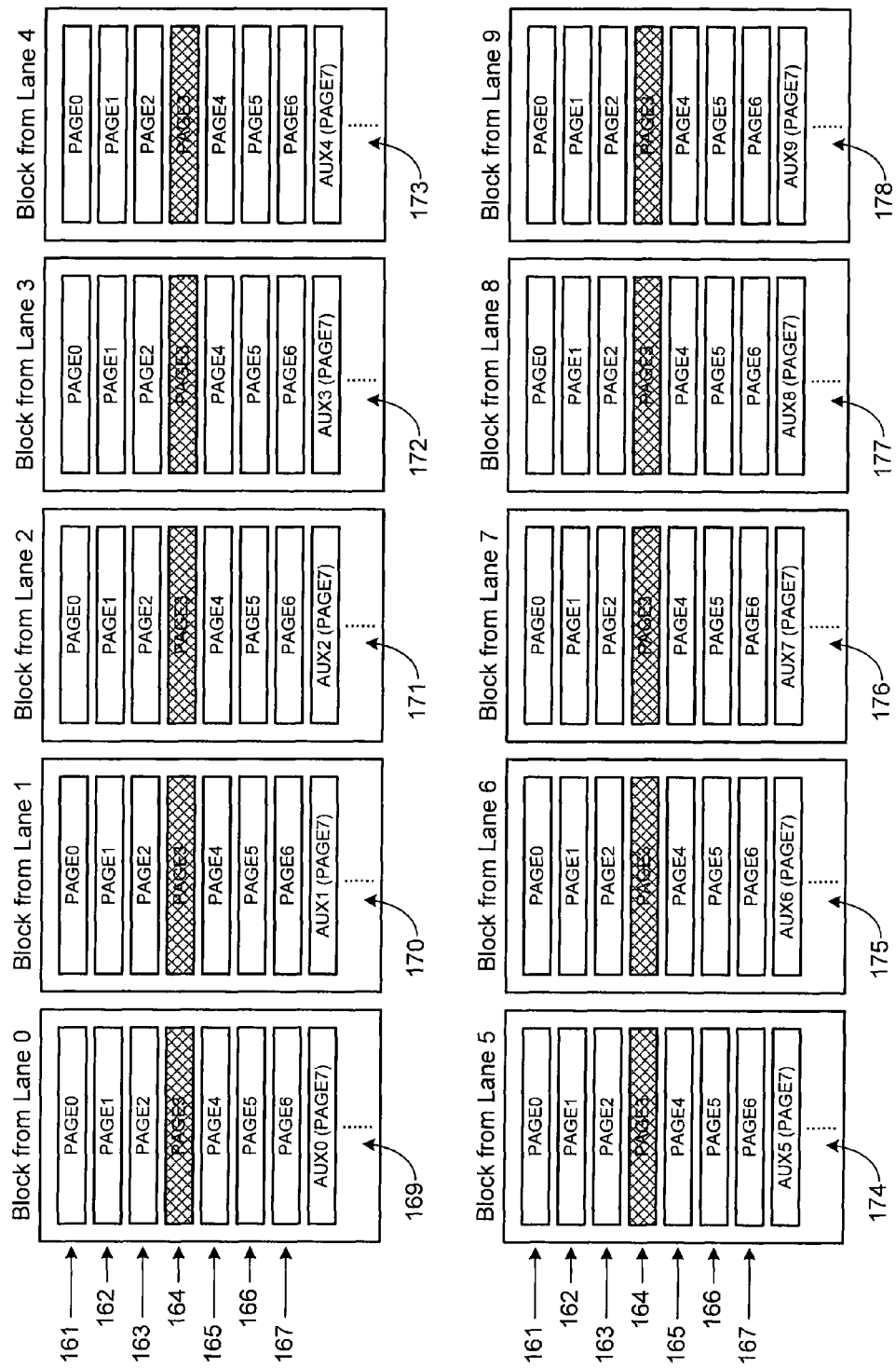

Referring to FIG. 19A, a Flash system is illustrated that is similar to that of FIG. 16B in that it reflects the storage of seven Page Stripes 161-167 and ten Auxiliary Protection Stripes 169-178. As noted above, in this example, the data in the Auxiliary Protection Pages of the Auxiliary Protection Stripes will be calculated using the data in the pages comprising the seven Page Stripes. For purposes of example, it is assumed that new data is provided for the data in one of the Page Stripes such that the data previously stored in the memory locations of FIG. 19A for that Page Stripe is no longer valid and is DIRTY. This is reflected in FIG. 19B where it is assumed that an operation has occurred that renders the data for Page Stripe 164 DIRTY. While the DIRTY pages that previously corresponded to Page Stripe 164 no longer contain valid data, that data was used in the calculation of the Auxiliary Protection Pages of the various Auxiliary Protection Stripes 169-178. As such, while the data is no longer valid, it is data that can be used for the reconstruction of corrupted data for a page that continues to reflect VALID data. Thus, while the Page Stripe 164 contains DIRTY data, DIRTY data pages within Page Stripe 164 could still be used to perform correction operations within their associated Auxiliary Page Stripes.

When Auxiliary Page Stripes are used, it will be important to ensure that the memory locations in which the Auxiliary Protection Pages are stored are not used to store other data. One approach for ensuring that such storage does not occur is to have the system set the memory locations containing Auxiliary Protection Pages as DIRTY. Such a setting will ensure that such pages are not used to store other data and will not otherwise interfere with the operation of a system as described herein.

In the examples described above, the data protection information in the Auxiliary Protection Pages can be calculated using the Flash Controller 10 and multiple versions of the circuitry described in connection with FIG. 6. In embodiments where the pages that form an Auxiliary Protection Stripe are within a single physical Flash memory device, it may be possible to integrate such circuitry within the single physical Flash memory device such that the data protection calculations, for example the XOR calculations described herein, are automatically performed within the chip as data is written to the chip. In such embodiments, the Auxiliary Data Protection information can be used internally to the chip to correct errors within a given Auxiliary Protection Stripe (for example, in response to a given command) or the data could be provided externally for processing.

Novel Power System with In-Circuit Capacitance and ESR Check

Figure 20:
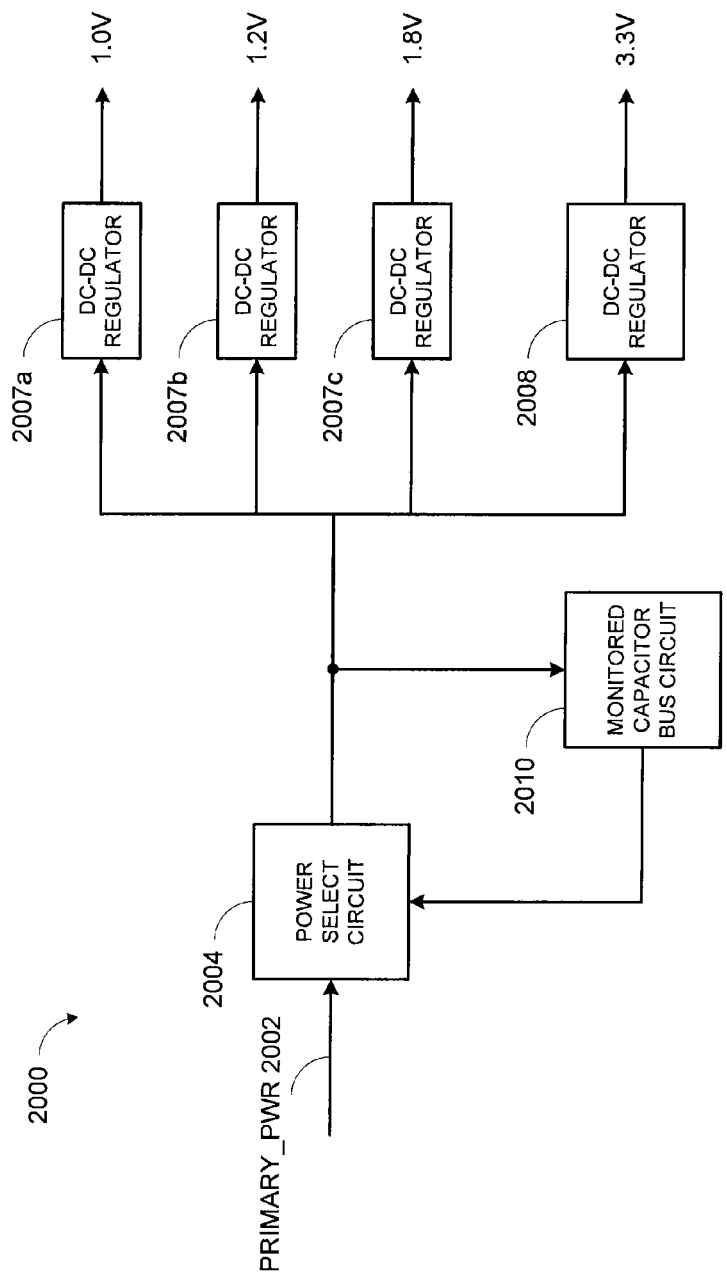
FIG. 20 generally illustrates a novel power system in accordance with one exemplary embodiment of the present disclosure that provides a robust backup feature.

FIG. 20 generally illustrates a novel power system 2000 in accordance with one exemplary embodiment of the present disclosure that provides a robust backup feature. In the illustrated embodiment, the power system 2000 is implemented on the same printed circuit board as the Flash memory storage system 100 reflected in FIG. 1. In general, the illustrated power system receives externally supplied power and converts the externally supplied power to regulated power at a plurality of different voltage levels that is used to power the electronic circuits within the Flash memory system 100. The illustrated power system also supplies a portion of the externally supplied power to a novel ultra-capacitor circuit that is used to store power that can be used for backup operations in the event that there is a disruption or fault in the externally supplied power. In the disclosed embodiment, the novel ultra-capacitor circuit is monitored to ensure that the circuit is capable of performing as desired and an indication is provided in the event that such monitoring indicates that the circuit is unable, or likely to become unable, to perform its intended function.

Turning to FIG. 20, the power system 2000 receives its primary power from a primary power supply bus PRIMARY_PWR 2002. In the illustrated embodiment, the primary power supply bus 2002 is provided by an off-board power system (not illustrated) which can include an AC-DC converter and/or one or more DC-DC conversion devices. In the example, the power supply bus PRIMARY_PWR 2002 provides 12 volt power to the power system.

The voltage provided by the primary power supply bus PRIMARY_PWR 2002 is provided as an input to power select circuit 2004. In the illustrated example, the other input to the power select circuit 2004 is a voltage level provided by a CAP_BUS 2012 which, as discussed in more detail below, is a bus that can provide limited backup power useful for implementing backup operations. In FIG. 20, the power select circuit 2004 is a circuit that performs a power OR operation such that it will provide, at its output labeled Backup_Bus 2006, the input power signal with the highest voltage value (e.g., either the PRIMARY_PWR voltage or the CAP_BUS voltage).

Figure 21A:
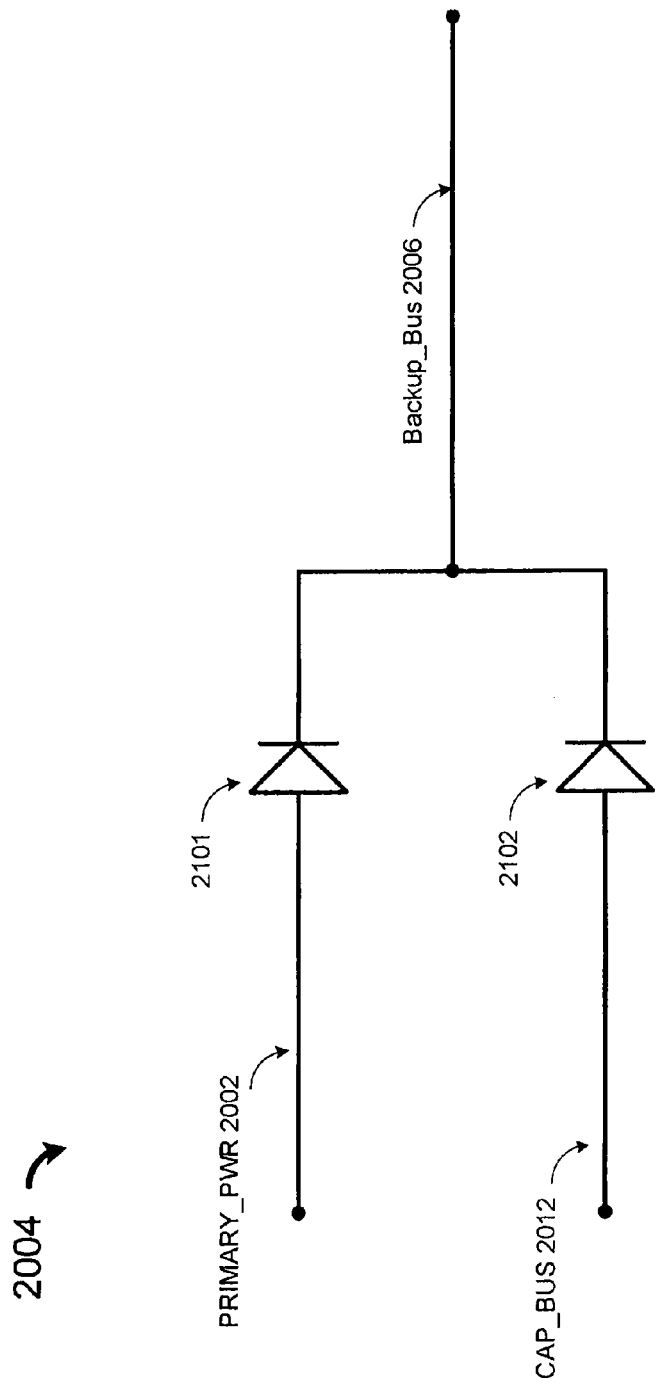
FIGS. 21A and 21B illustrate details concerning one exemplary implementation of the power select circuit of FIG. 20.
Figure 21B:
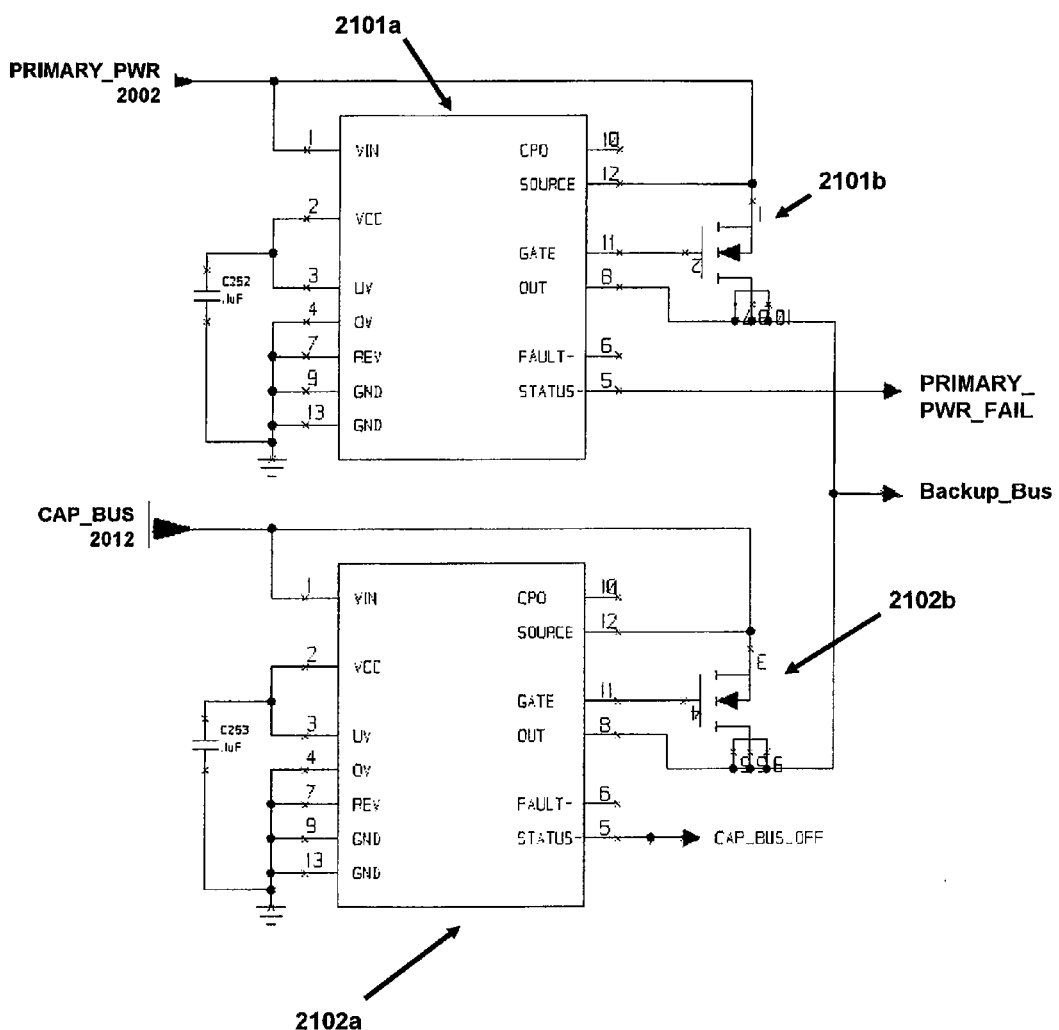

Details concerning one exemplary implementation of the power select circuit 2004 may be found in FIGS. 21A and 21B. Referring to FIG. 21A, the exemplary power selection circuit may be implemented by applying the input power signals PRIMARY_PWR 2002 and CAP_BUS 2012 as inputs to the anodes of two diodes 2101 and 2102 whose cathodes are coupled together. The output of the coupled cathodes is the Backup_Bus 2006. In this arrangement, each of the diodes 2101 and 2102 will conduct whenever the voltage at the anode of the diode is greater than the voltage at its cathode and the voltage at the cathode of a conducting diode will be the voltage applied at the anode of that diode, less any voltage drop across the diode. As described above, during normal operation, the voltage level of the primary input power PRIMARY_PWR 2002 will be 12 volts. As described in more detail below, during normal operation the voltage level of the CAP_BUS 2012 will be approximately 7.3 volts. Under these conditions the diode 2101 will be rendered conductive and the voltage at the cathode of the diode 2101 will be 12 volts minus the drop across the diode (which will be relatively small). Because the cathode of the diode 2101 is coupled to the cathode of the diode 2102, and because the cathode of the diode 2101 will be—during normal operation conditions as described above—just less than 12V, the diode 2102 will be reversed biased and non-conductive. Under these conditions, power will flow from the primary input power PRIMARY_PWR to the Backup_Bus 2006.

During aberrational conditions (e.g., during a failure of the input primary power), the voltage level of the primary input power PRIMARY_PWR may drop. If the voltage level drops below that of the voltage provided by the CAP_BUS 2012, then the diode 2101 will be rendered non-conductive and the diode 2102 rendered conductive, thus resulting in power flowing from the CAP_BUS 2012 to the Backup_Bus 2006.

While the exemplary circuit of FIG. 21A uses diodes to implement the power selection circuitry 2004, alternate embodiments are envisioned wherein active circuits are used to reduce the additional power dissipation that can result from the voltage drops that would occur when ordinary diodes are used. FIG. 21B illustrates such an alternate embodiment.

Referring to FIG. 21B, an alternate embodiment of the power selection circuitry is illustrated in which the diodes 2101 and 2102 of FIG. 21A are replaced with active circuits, each including a controller and an external switched device, and each configured to act as a near-ideal diode. In the illustrated example, the near-ideal diode circuits are formed from two diode controllers 2101a and 2102a and two external N-channel MOSFETs 2101b and 2102b. The diode controllers may be any suitable diode controller, such as the Linear Technology LTC4352 ideal diode controller. In operation, each of the diode controllers operates to control its associated external switching device to provide the functionality of a near ideal diode. In other words, the diode circuit including controller 2101a will render switch 2101b conductive whenever the voltage at its input (labeled PRIMARY_PWR) is greater than the voltage at its output (labeled Backup_Bus). The use of the diode controllers 2101a and 2102a and the switching devices 2101b and 2102b avoids some of the power losses associated with the use of passive diodes as illustrated in FIG. 21A.

In addition to controlling their associated switching devices, each of the diode controllers 2101a and 2102a of FIG. 21B provides a status signal that indicates whether the switching device associated with the controller is conductive. For example, in embodiments where LTC4352 controllers are used, the status signal for each controller will be driven low whenever the gate to source voltage of its associated switching device is such that power is passing through the switching device. When the gate to source voltage of the associated switching device is such that the switching device is nonconductive, the status signal is driven high. In the illustrated example, the status output from the controller 2101a is labeled PRIMARY_PWR_FAIL. As such, in the example, when that signal is in the logic low state, power will be flowing from the primary input power bus PRIMARY_PWR 2002 through switching device 2101b to the Backup_Bus 2006. When such power flow ceases, the PRIMARY_PWR_FAIL signal will transition to a logic high level, indicating that there has been a failure or loss of the primary input power. In a similar sense, the status output of the controller 2102b, labeled CAP_BUS_OFF, will be in the logic high state during normal operation (indicating that power is not flowing from the CAP_BUS 2012 to the Backup_Bus 2006) and will be in the logic low state whenever power is flowing from the CAP_BUS 2012 to the Backup_Bus 2006.

It will be appreciated that the power select circuits 2004 depicted in FIGS. 21A and 21B are exemplary only and that other arrangements can be used to implement power select circuit 2004.

Referring back to the exemplary circuit of FIG. 20, the Backup_Bus output 2006 from the power select circuit 2004 is provided as the power input to a variety of circuits including: (i) a plurality of DC-DC regulators 2007a-2007c and 2008, and (ii) a monitored capacitor bus circuit 2010. As described in more detail below, the monitored capacitor bus circuit 2010 stores power provided from the Backup_Bus 2006 in one or more back-up storage devices for use in the performance of backup operations in the event that the power provided by the PRIMARY_PWR bus 2002 degrades or fails.

In the illustrated example, the on-board DC-DC regulators 2007a-2007c and 2008 take the power provided by the Backup_Bus 2006 and convert that power to regulated output power at voltage levels required by the circuitry that is used in the Flash memory system 100 of FIG. 1. As examples: regulator 2007a could provide output power at a level of 1.2 volts for powering the core logic of FPGA 10 in FIG. 1; regulator 2007b could provide output power at 1.0 volts for powering the core logic of other FPGAs (not shown) used in memory system 100 of FIG. 1; regulator 2007c could provide output power at 1.8 volts for powering the CPU 15, CPU memory 17, and, in some embodiments the controller memory 11 of FIG. 1; and regulator 2008 could provide 3.3V output power for powering the Flash memory array 14 of FIG. 1

In the illustrated examples, each of the DC-DC regulators 2007a, 2007b and 2007c is a DC-DC step-down regulator that includes a controller, such as the ST1S10 available from ST Microelectronics, and external circuitry, including an inductor and a filter capacitor, that provides power at a voltage level required by one or more of the circuits within the Flash memory system 100. In the exemplary circuit, regulator 2008 is a wide-input, synchronous, buck voltage regulator, such as the IR3821 regulator available from International Rectifier, and associated circuitry. In the example, the regulator 2008 also provides a power good signal, not illustrated, that may be used by other components within the Flash memory system 100 of FIG. 1.

Referring again back to FIG. 20, in addition to providing power to the regulating devices described above, the Backup_Bus 2006 also provides power to a monitored capacitor bus circuit 2010. In general, the capacitor bus circuit 2010 performs a variety of functions including the functions of receiving power from the Backup_Bus 2006 and storing power provided from the Backup_Bus 2006 in one or more backup storage devices for use in the event of a disruption or failure of the primary input power 2002 and enabling in-circuit testing of the power storage capacity of the power storage devices as described in more detail below. In the illustrated example, the power storage devices are ultra-capacitors and the power available from the power storage devices is referred to as CAP_BUS 2012. As reflected in FIG. 20, the CAP_BUS 2012 is provided as one of the inputs to the power select circuit 2004.

Details concerning the structure and operation of an exemplary monitored capacitor bus circuit 2010 are reflected in FIGS. 22A-23C.

Figure 22A:
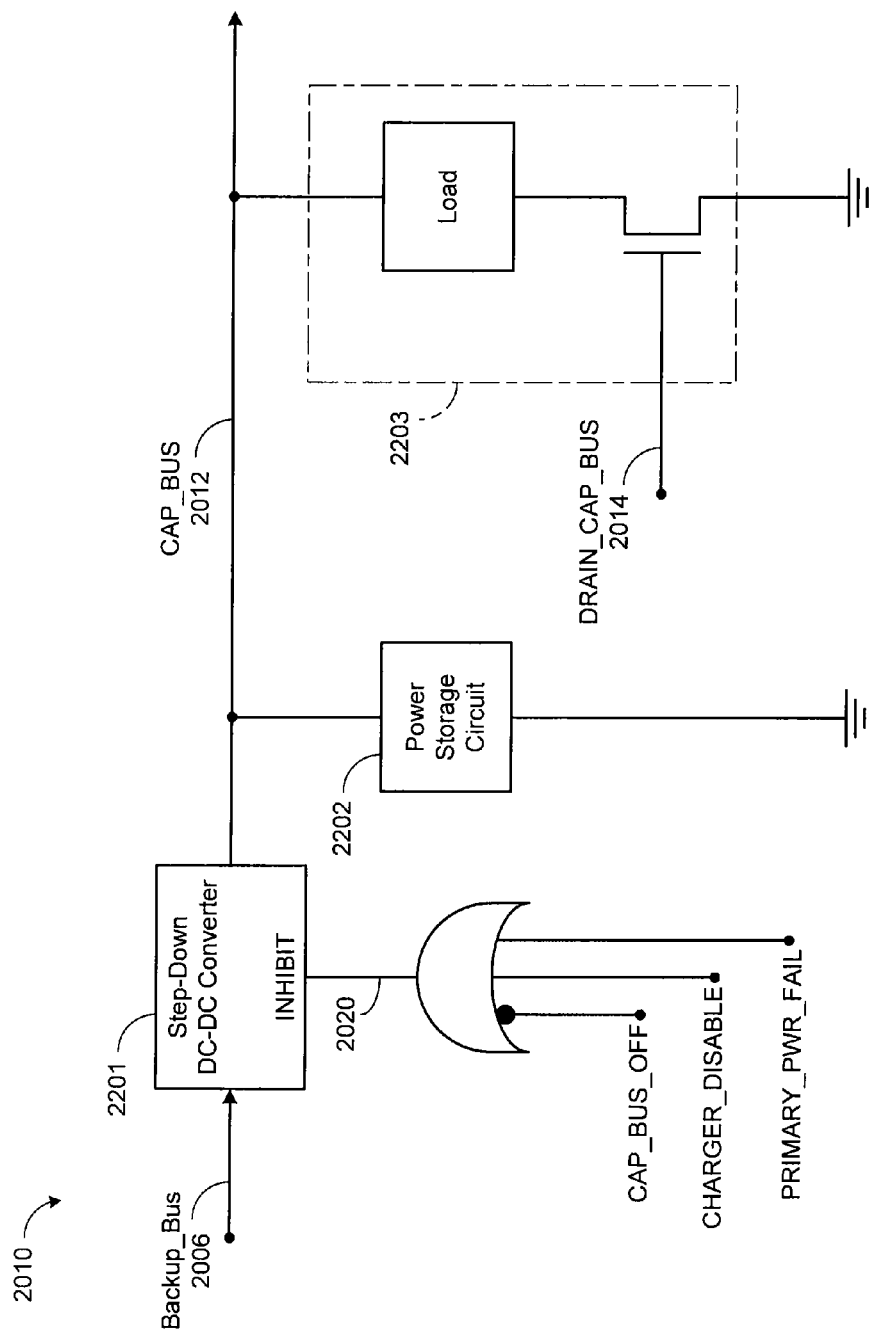
FIG. 22A-22B illustrate a simplified and more detailed schematic representation of the capacitor bus circuit of FIG. 20.

FIG. 22A illustrates a simplified schematic of the capacitor bus circuit 2010. Referring to the figure, the exemplary capacitor bus circuit 2010 includes a step-down DC-DC regulator 2201 having an input coupled to the Backup_Bus 2006 and its output coupled to the CAP_BUS 2012. When active, the step-down regulator 2201 receives input power from the Backup_Bus 2006 and converts that power to power at a regulated, lower voltage level that is applied to the CAP_BUS 2012. In the illustrated example, the regulated output voltage from the step-down regulator 2201 is approximately 7.3 volts.

As reflected in FIG. 22A, the output from the step-down regulator 2201 is applied to the CAP_BUS 2012. A power storage circuit 2202 is coupled across the CAP_BUS 2012, as is a power draining circuit 2203. In the illustrated example, the power draining circuit 2203 comprises a resistor and a switched element in the form of a field effect transistor where the gate of the field effect transistor receives an input signal, labeled DRAIN_CAP_BUS signal 2014. The power draining circuit 2203 may be activated through the assertion of the DRAIN_CAP_BUS signal 2014 to drain power from the CAP_BUS 2012. As described in more detail below, this functionality is useful for performing in-circuit testing of the power storage circuit 2202.

As reflected in FIG. 22A, in the illustrated exemplary circuitry, the step-down regulator 2201 receives an INHIBIT signal 2020 that, when activated, inhibits the operation of the regulator 2201. In the illustrated example, the INHIBIT signal 2020 is generated from the logical OR of three signals—a CHARGER_DISABLE signal, the PRIMARY_PWR_FAIL signal from the exemplary power selection circuitry 2004 described above in connection with FIG. 21B, and the logical inverse of the CAP_BUS_OFF signal from the exemplary power selection circuitry 2004 described above in connection with FIG. 21B. In the illustrated example, therefore, the operation of the step-down regulator 2201 will be inhibited whenever one or more of the following occurs: (i) the CHARGER_DISABLE signal is asserted to halt operation of the regulator; (ii) the PRIMARY_PWR_FAIL circuit is asserted, corresponding to a failure or loss of the primary input power; or (iii) the CAP_BUS_OFF signal goes low, indicating that the Backup_Bus 2006 is now being powered from the CAP_BUS 2012.

Because of the arrangement of the described capacitor bus circuit 2010, during normal operation—when the primary input power is as expected—the step-down regulator 2201 will operate and provide power to the CAP_BUS 2012. This power will initially charge, and thereafter maintain a charge, in the power or charge storage circuit 2202. If, however, a command is issued to halt the operation of the regulator 2201, or if the power select circuit 2004 ceases to provide power from the primary input power PRIMARY_PWR, or if the power select circuit 2004 begins to provide power from the CAP_BUS 2012, then the INHIBIT line 2020 will be asserted and regulator 2201 will cease to operate.

Figure 22B:
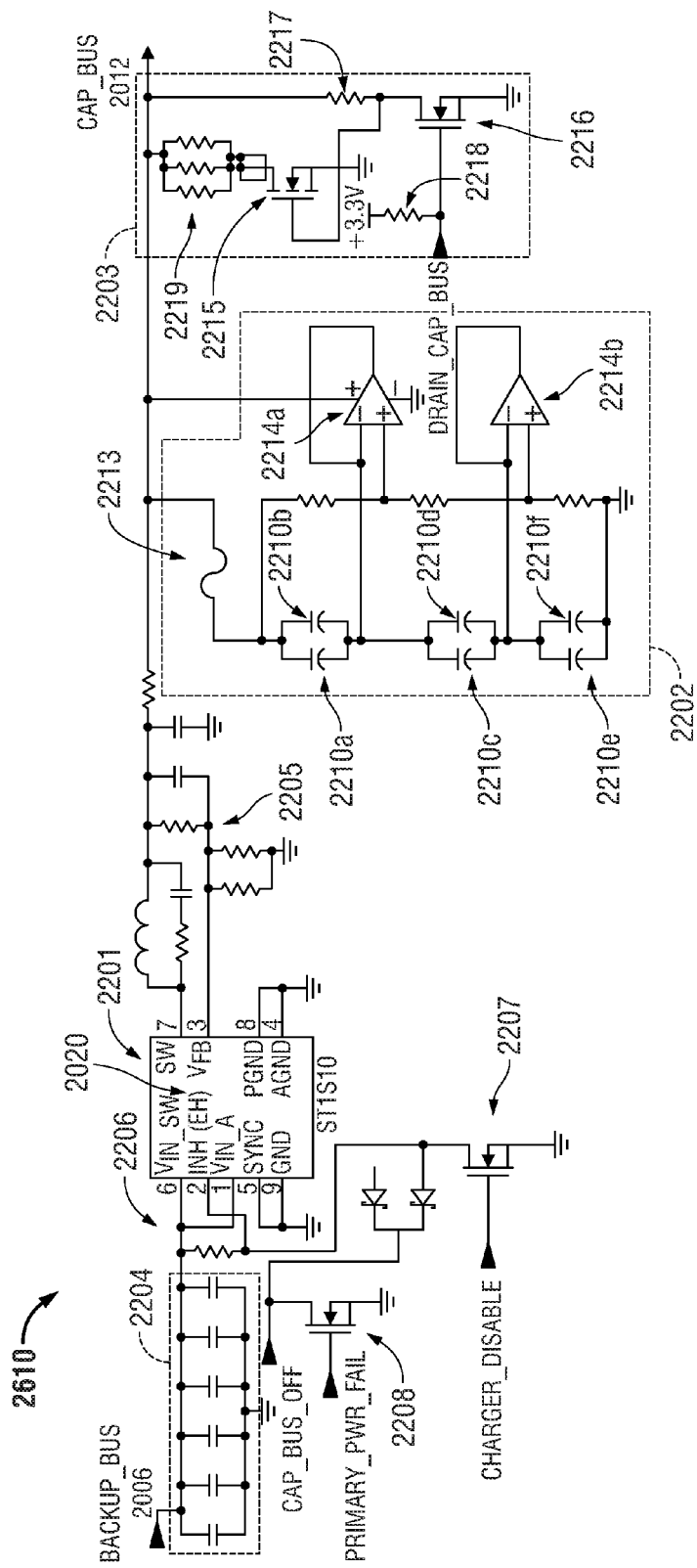

FIG. 22B illustrates an exemplary alternate specific embodiment of the capacitor bus circuit 2010 of FIG. 22A. In the illustrated example, the step-down regulator 2201 takes the form of a monolithic synchronous step-down regulator that, in the example, is formed from a regulator controller—such as the ST1S10 regulator available from ST Microelectronics—and associated inductive and capacitive filter elements. The illustrated regulator 2201 receives as its input the voltage from the Backup_Bus 2006 and reflects the use of a bank of filtering capacitors 2204 coupled across the Backup_Bus 2006. A feedback circuit (indicated generally at 2205), including a plurality of resistors and a capacitor, provides a feedback signal from the output of the regulator 2201, which is used by the regulator 2201 to provide the desired output voltage (which in the example is approximately 7.3 volts).

In the exemplary embodiment, the INHIBIT pin 2020 for the regulator 2201 is active in the logic low state. In the example, the INHIBIT pin 2020 for the regulator 2201 is coupled to a circuit arrangement that includes a pull-up resistor 2206, a first switching device 2207 and a second switching device 2208. Both switching devices in this embodiment are N-channel MOSFETS. The gate of the first switching device 2207 is coupled to receive the CHARGER_DISABLE signal. The gate of the second switching device 2208 is coupled to receive the PRIMARY_PWR_FAIL signal while its drain is coupled to receive the CAP_BUS_OFF signal. During normal operation, the CHARGER_DISABLE signal will not be asserted, the CAP_BUS_OFF signal will be at a logic high level, and the PRIMARY_PWR_FAIL signal will be at logic low level. Under these conditions, neither of the switching devices 2207 or 2208 will be conductive and, as such, the voltage at the INHIBIT pin 2020 of the regulator 2201 will be pulled high through the pull-up resistor 2206. If, however, the CHARGER_DISABLE signal is asserted, the switching device 2207 will conduct, pulling the INHIBIT pin towards ground and, therefore, inhibiting the operation of regulator 2201. Similarly, if the PRIMARY_PWR_FAIL signal is asserted while the CAP_BUS_OFF signal is at a high level, the switching device 2208 will conduct, overriding the CAP_BUS_OFF signal and pulling the INHIBIT pin 2020 towards ground to inhibit operation of the regulator 2201. Further, if the CAP_BUS_OFF signal goes low, thus indicating that the Backup_Bus 2006 is being powered from the CAP_BUS, the INHIBIT pin of regulator 2201 will be pulled low, thus inhibiting operation of the regulator. As a result of this arrangement, the CAP_BUS 2012—and thus the charge storage device 2202—will be charged from the primary input power during normal operation and the operation of the regulator 2201 will be inhibited whenever the primary power fails, whenever the Backup_Bus is being powered by the CAP_BUS, or whenever the regulator 2201 is turned off as a result of the assertion of the CHARGER_DISABLE signal.

In the exemplary circuit of FIG. 22B, the charge storage circuit 2202 is further illustrated as being formed from an arrangement of six ultra-capacitors 2210a-2210f, with capacitor pairs 2210a-2210b, 2210c-2210d, and 2210e-2210f being coupled together in parallel, and the parallel connections of 2210a-2210b, 2210c-2210d and 2210e-2210f being coupled together in series. This arrangement of the capacitors is coupled to the CAP_BUS 2012 through a fuse element 2213. In the illustrated example, each of the ultra-capacitors 2210a-2210f is a 6.0 Farad capacitor and the capacitors are arranged such that the voltage across each of the parallel connected pairs of capacitors is approximately at or between about 2.4-2.7 volts such that the total voltage provided by the parallel connected arrangement is approximately at or between 7.2 and 8.1 volts.

It should be appreciated that the capacitor arrangement of FIG. 22B is but one exemplary arrangement that may be used to form the charge storage circuit 2202 and that other arrangements of capacitors may be used without departing from the teachings of this disclosure.

In the illustrated embodiment, operational amplifiers 2214a and 2214b are provided to balance the amount of charge stored on each of the ultra-capacitors 2210a-2210f. Alternate embodiments are envisioned wherein other components can be used to balance the charge. For example, in one alternate embodiment, Zener diodes having breakdown voltages corresponding to the desired voltage across each parallel coupled pair of capacitors could be placed across each parallel-connected pair of capacitors, in place of the operational amplifiers 2214a and 2214b.

FIG. 22B also illustrates an exemplary power drain circuit 2203 in greater detail. As reflected in FIG. 22B, the exemplary power drain circuit includes a load 2219 comprising three parallel connected resistors that is coupled to a biased control circuit including switching devices 2215 and 2216 and resistors 2217 and 2218. In the illustrated circuit, one end of the resistor 2217 is coupled to the CAP_BUS 2012 and the other end is coupled to the drain of switching element 2216, which in the illustrated circuit is an N-channel MOSFET. The gate of the switching device 2216 is coupled to receive the DRAIN_CAP_BUS signal 2014 and is coupled, through a pull-up resistor 2218 to a voltage source which in the example is the 3.3 v source. When the DRAIN_CAP_BUS signal 2014 is not asserted, the resistor 2218 will pull the gate of switching device 2216 high, such that it conducts and pulls the gate of the transistor 2215 low, thus ensuring that the transistor 2215 is off or non-conductive. When the DRAIN_CAP_BUS signal 2014 is asserted, which in this example is accomplished by taking the DRAIN_CAP_BUS signal to a logic low level, switching device 2216 will be rendered non-conductive and the resistor 2217 will take the gate of switching device 2215 high, thus turning it on and placing the load 2219 on the CAP_BUS.

The ability to selectively place load 2219 onto the CAP_BUS and to remove load 2219 from the CAP_BUS allows for the implementation of a novel in-circuit monitoring approach that may be used to test the capacitance of the charge storage device 2202 and, therefore, test the ability of the charge storage device 2202 to provide the expected backup power. Such testing may be necessary because of the potential for capacitive storage devices to degrade over time (and under certain circumstances) and because of the importance of the availability of backup power from the charge storage device 2202.

Figure 23A:
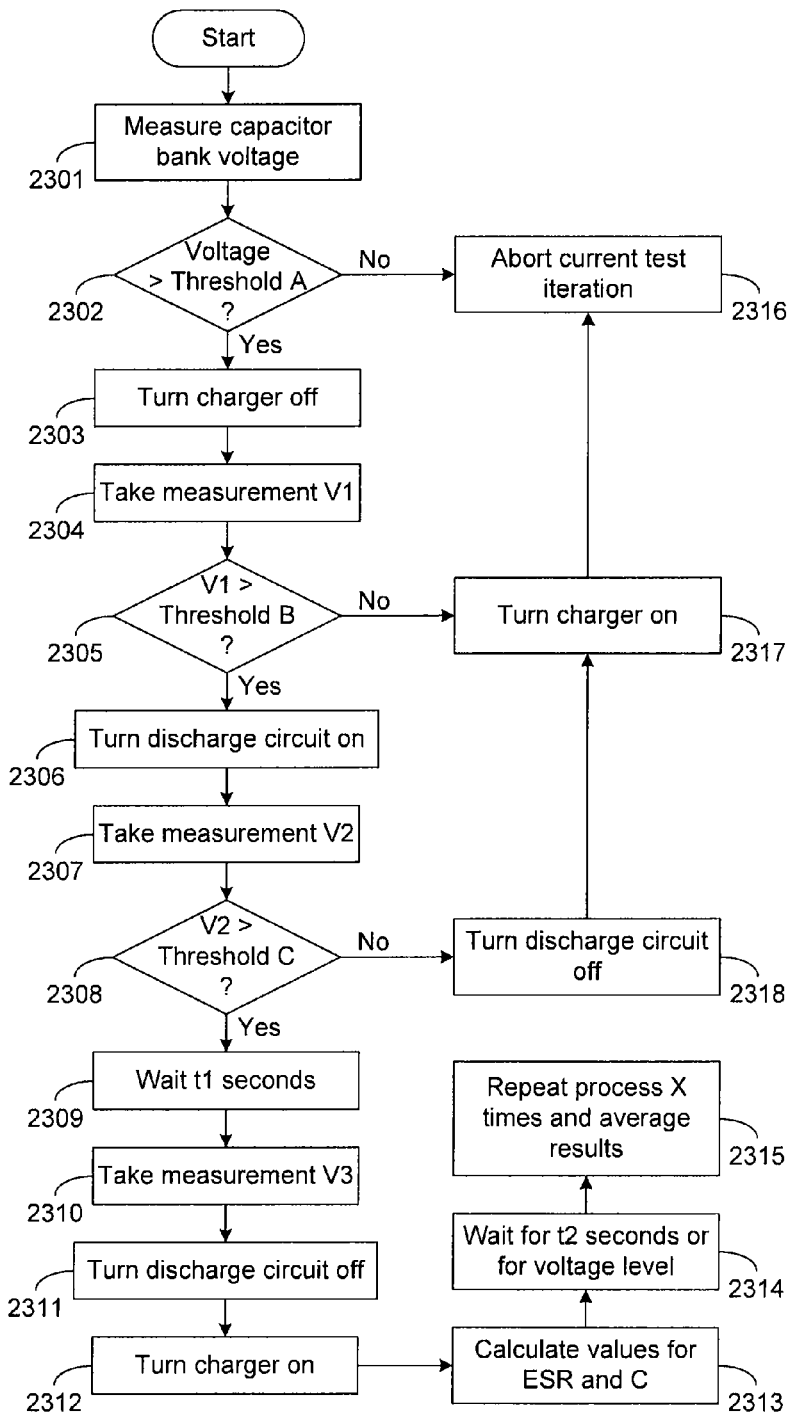
FIGS. 23A-23C illustrate aspects of the apparatus and process useful with the circuitry of FIG. 20 for testing the capacitance of the voltage storage device.
Figure 23B:
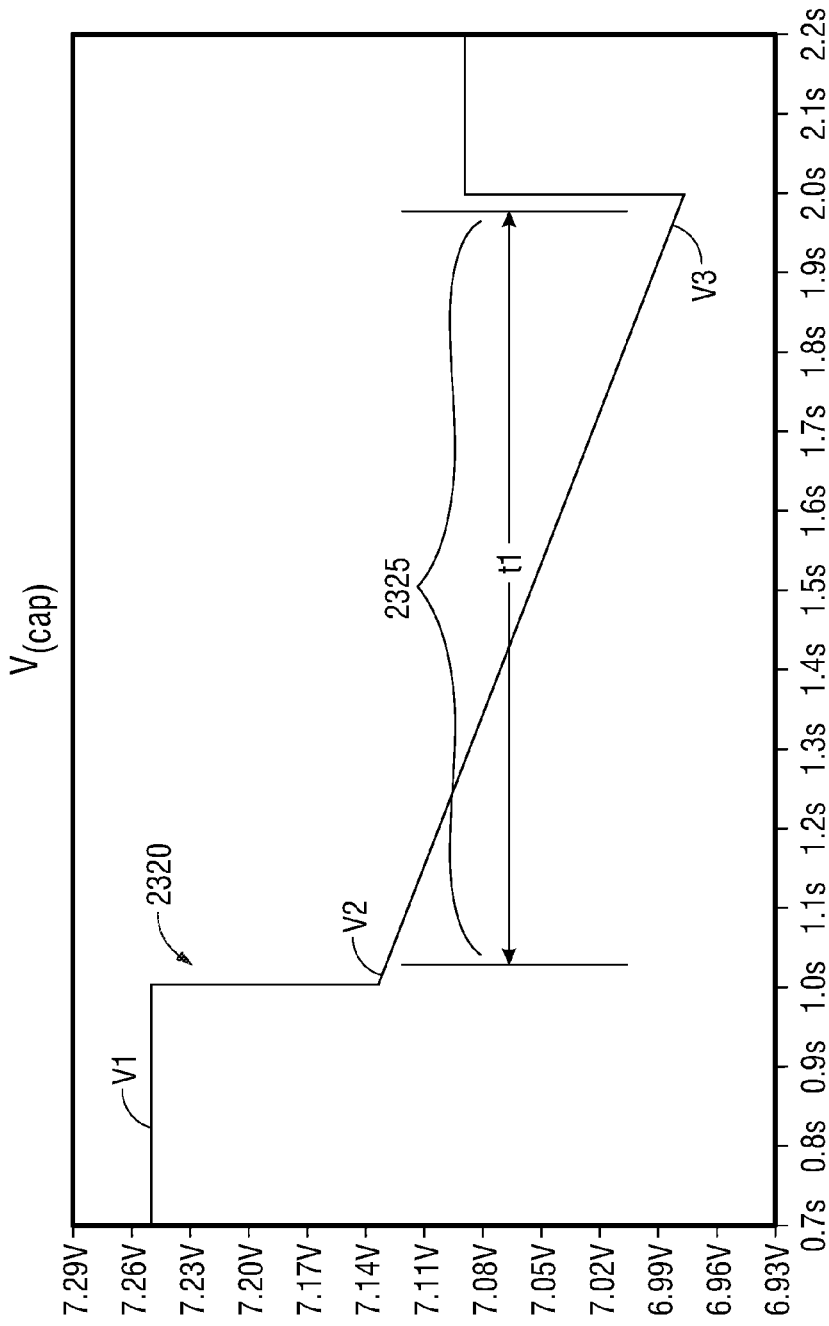
Figure 23C:
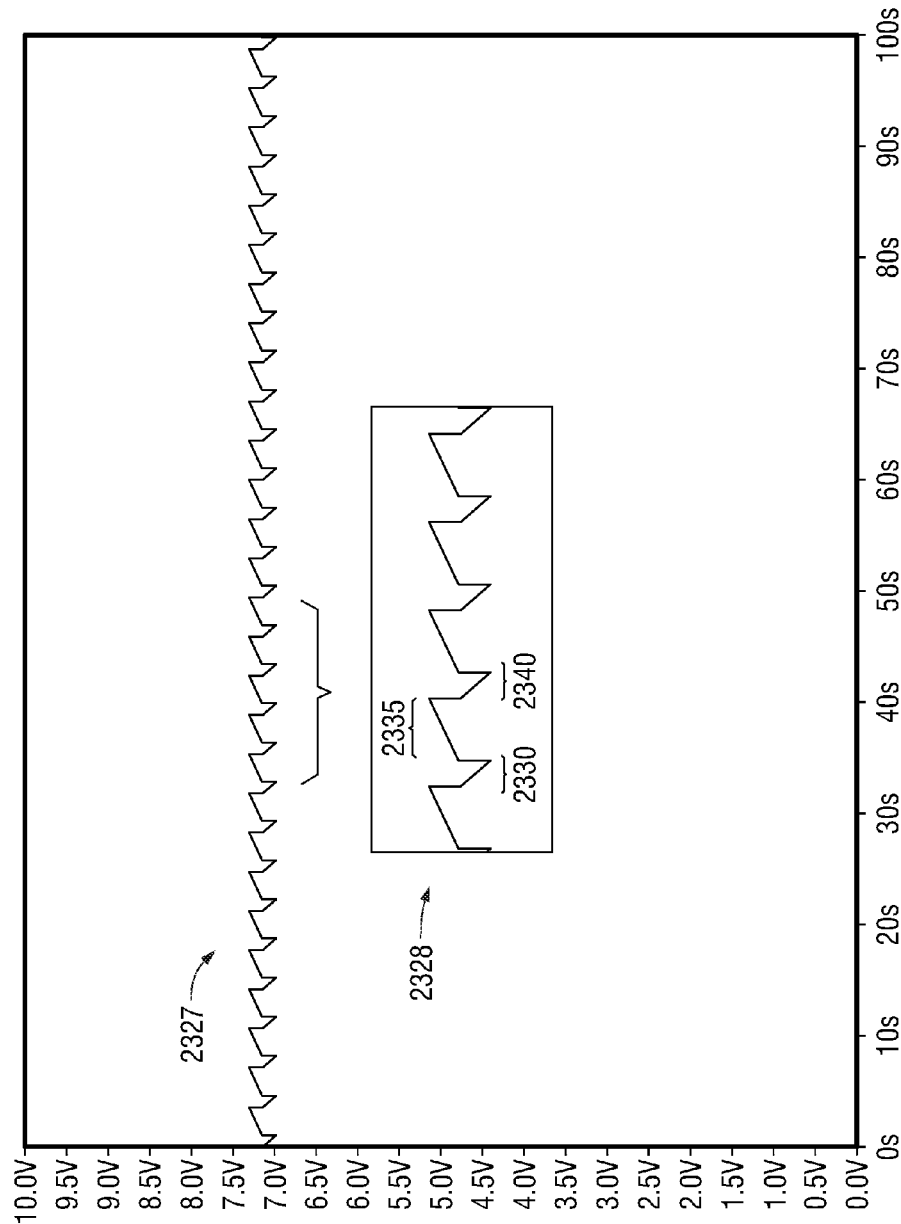

FIGS. 23A-23C illustrate one approach that may be used with the exemplary circuitry of FIG. 22B for testing the capacitance of the charge storage device 2202 during operation of the Flash memory storage system described herein. In the described embodiment, the approach is implemented through the use of the circuitry described above in connection with FIG. 22B and through the use of the CPU controller 15 of FIG. 1. In general, to implement the approach of FIGS. 23A-23C, the CPU controller 15 will be coupled through appropriate circuit connections (which in one embodiment are traces on or within a printed circuit board) to provide the CHARGER_DISABLE signal and the DRAIN_CAP_BUS signal 2014. The CPU controller 15 will also be coupled to receive a digital signal that reflects a sampled voltage level corresponding to the voltage on the CAP_BUS at the time of sampling. This sampled voltage level may be provided by any appropriate voltage monitor. In one embodiment, the voltage monitor is a digitally-communicating monitor, such as the LTC4151 current and voltage monitor available from Linear Technology, that can sample the voltage on the CAP_BUS 2012 and provide the CPU controller 15 with a digital signal reflecting the sampled voltage value.

Referring to FIG. 23A, the illustrated process of testing the capacitance of the voltage storage device 2202 begins under conditions in which it is assumed that the power circuitry is operating normally (i.e., with the primary input power being within expected levels) and the Backup_Bus 2006 being powered from the primary input power. In the exemplary process, the CPU controller 15 first takes a reading of the voltage level on the CAP_BUS 2012 at step 2301 and determines at step 2302 whether the voltage level is at or above an acceptable threshold voltage level, Threshold A. If the test indicates that the CAP_BUS voltage is within acceptable levels, the process will proceed to test the capacitance of the charge storage device 2202. If, however, the test indicates that the CAP_BUS voltage is below the Threshold A level, the capacitance test will be aborted at step 2316 and the CPU controller 15 will signal an error.

If the threshold test indicates that the CAP_BUS voltage is above the Threshold A level, the CPU controller 15 will then move to implement the capacitance test. This first step of the test is to disable the regulator 2201 such that it ceases to charge the CAP_BUS. This is done in step 2303 where the regulator 2201 is turned off through assertion of the CHARGER_DISABLE signal. When, or just shortly after, the regulator 2201 is turned off, the voltage level of the CAP_BUS should be at a voltage level resulting from the charge stored in the charge storage device 2202 (since the regulator 2201 would be off). At step 2304, the CPU controller 15 samples this voltage, designated as voltage V1. At step 2305, it compares this sampled voltage V1 to a second threshold, Threshold B. The threshold voltage, Threshold B, may be selected to reflect a value that corresponds to a voltage that is at, or just above, the lowest CAP_BUS voltage than can safely support an acceptable backup and shutdown of the system. This comparison may be done because the performance of the capacitance test as described below results in a loss of some of the charge in the charge storage device 2202. By ensuring that the charge on the charge storage device 2202 is of such a magnitude that the charge storage device can provide adequate power to the system for backup and shutdown in the event that the primary power fails during or just after the capacitance test, the test at step 2305 tends to ensure that the performance of the test will not reduce the voltage of the CAP_BUS below that sufficient for an acceptable backup and shut down operation.

If the test at step 2305 indicates that there is inadequate charge in the charge storage device 2202 to support a capacitance test, the CPU controller 15 will turn the regulator 2201 ON at step 2317, such that it will begin providing power to the CAP_BUS and charging the charge storage circuit 2202 and will abort the capacitance test.

If, however, the test at step 2305 indicates that there is adequate charge to support a capacitance test, the CPU controller 15 will then proceed to initiate the capacitance test by first activating the power draining circuit 2203, through assertion of the DRAIN_CAP_BUS signal 2014 at step 2306, and then sampling the voltage on the CAP_BUS at step 2307. This sampled value is referenced in FIG. 23A as voltage V2.

In step 2308, the sampled V2 value is compared to another threshold, Threshold C, and the regulator 2201 is turned on and the capacitance test aborted at step 2318 if this test indicates that the V2 value is unacceptably low. If, however, the sampled V2 value is within acceptable limits, the CPU controller 15 will then, in step 2309, wait for a period of time, referred to as "t1" in the figure. The period of time t1 may be, for example, on the order of one to two seconds in some embodiments, depending on the implementation. After the passage of the time provided for in step 2309, the controller will then take a further sample of the voltage on the CAP_BUS at step 2310, such sample being referred to in FIG. 23A as the V3 voltage sample.

In the illustrated example, after taking the V3 sample, the CPU controller 15 will then turn the power drain circuit 2203 OFF in step 2311, thus disconnecting the load 2219 from the CAP_BUS and will turn the regulator 2201 back ON in step 2312, thus allowing the regulator to again power the CAP_BUS 2012 and begin recharging the capacitor storage circuit 2202. Ideally the amount of charge drained from the CAP_BUS over the period in which the load 2219 is applied to the CAP_BUS is a very small amount of the total energy stored in the charge storage circuit 2202. This amount should, in general, be less than 5% of the total stored energy and, in certain embodiments, should be less than 1% of the total stored energy.

In step 2313, the CPU controller 15 will use the sampled values V2, V3, and the time period t1 seconds provided in step 2309 to determine various parameters associated with the charge storage circuit 2202, including in the example, values corresponding to the capacitance C and the equivalent series resistance ("ESR") of the charge storage circuit 2202. The manner in which these parameters are calculated by the CPU controller 15 are discussed in more detail below.

In the illustrated example, the CPU controller 15 waits for a sufficiently long second period of time, t2 (not expressly labeled), at step 2314 for the regulator 2201 to completely (or nearly completely) recharge the charge storage circuit 2202. The CPU controller 15 then repeats the capacitance measurement process a predefined suitable number of times (depending on the particular implementation) and averages the results at step 2315 to obtain average parameter values corresponding to the capacitance C and ESR of the charge storage device 2202. The use of multiple measurements, averaged over time, tends to overcome and reduce the impact of noise on the system. This averaging to reduce noise increases the ability of the system to tolerate noise on each individual measurement. This increased ability to tolerate noise, in turn, allows the system to operate under conditions where, for each measurement, the load is coupled to the CAP_BUS for only a very limited period of time such that the voltage on the CAP_BUS, and the backup power available from the charge storage circuit 2202 coupled to the CAP_BUS is not significantly reduced. In one preferred embodiment, the number of measurements taken for each calculation of C and ESR, is greater than 100 and the amount of energy drained from the CAP_BUS for each measurement is less than 2% of the energy stored in the charge storage circuit 2202 at the initiation of each measurement cycle.

FIG. 23B illustrates in greater detail the operation of the in-circuit capacitance measurement circuitry and process as described herein for an exemplary circuit. Referring to the figure, the initial voltage reading V1 is taken at the time the CHARGER-DISABLE signal is asserted but before the DRAIN_CAP_BUS signal 2014 is asserted. During this interval, there is essentially no load applied to the CAP_BUS and, as such, the voltage V1 will be essentially the voltage to which the charge storage device 2202 has been charged. In the example of FIG. 23B, this voltage level V1 is approximately 7.25 volts.

After the V1 reading is taken, the power drain circuit 2203 is activated, thus putting a load on the CAP_BUS. This will result in a steep initial drop in voltage on the CAP_BUS, designated as 2320, followed by a period of gradual reduction (designated 2325) in the voltage of the CAP_BUS as power and charge are drained through the power drain circuit 2203. During this period of gradual reduction, the CPU controller 15 will sample the voltage level on the CAP_BUS at a first time, to obtain a sampled value V2, and at a subsequent time to obtain a sampled value V3. The period between the taking of the two samples is, in the example, designated as time t1. In the example of FIG. 23B, the V2 value is approximately 7.14 volts, the V3 value is approximately 6.99 volts, and the time period t2 is approximately 1.95 seconds.

Knowing the value of the resistive load (R) that is applied to the CAP_BUS, the CPU controller 15 can use the sampled voltage values (V1, V2, and V3) and the determined or detected time period t1, to calculate capacitance C and ESR values for the charge storage device 2202 as follows:

$$ESR = \left(\frac{V1*R}{V2}\right) - R$$

$$C = \frac{-t1}{(R+ESR)*\mathrm{Ln}\left(\frac{V3}{V2}\right)}$$

It should be appreciated that the voltage waveform illustrated in FIG. 23B is an idealized waveform. The actual voltage waveform will vary from the idealized waveform and will tend to exhibit an exponential-like decay.

FIG. 23B illustrates a single interval over which the in-circuit capacitance testing approach of this disclosure is applied. For more accurate measurements, this process may be repeated one or a number of times and the values determined for each interval averaged to provide average C and ESR values. FIG. 23C illustrates an exemplary approach reflecting the performance of the capacitance testing over a large number of intervals. Details concerning the illustrated waveform may be found in the magnified section 2328. As may be noted in the figure, each interval over which the capacitance is measured (such as the exemplary intervals 2330 and 2340) is separated by an interval (such as exemplary interval 2335) over which the CAP_BUS and the charge storage device 2202 are recharged by the regulator 2201.

While the above discussion refers to a determination of the charge stored in the charge storage device 2202 and/or to the capacitance of the charge storage device 2202, it will be understood that—because the measurements are taken from the CAP_BUS—the actual stored charge and capacitance will refer to the charge stored on the CAP_BUS and the overall apparent capacitance and ESR of the CAP_BUS including the charge stored and the capacitance provided by the other components coupled to the CAP_BUS and the inherent parasitic capacitance of the CAP_BUS itself. However, because the majority of the detected capacitance, and the majority of the stored charge, will be a result of the charge storage device 2202, it is appropriate to refer to the measurements and calculated values as referring to the charge storage device 2202. It should also be noted that the other devices residing on the CAP_BUS line contribute a small amount of capacitance to the overall charge storage mechanism during power loss. Including these components in the parametric measurements provides a slightly more accurate evaluation of the system's overall performance during power loss.

As noted above, the number of measurements taken during a given capacitance calculation can vary. Furthermore, the frequency at which the in-circuit capacitance calculation process is performed can be fixed or varied. In one embodiment, the capacitance of the charge storage circuit 2202 is calculated once every hour. In other embodiments, the capacitance may be calculated more frequently, with the frequency being determined as a function of the extent to which the calculated capacitance has degraded from the peak capacitance level. In this embodiment, therefore, the capacitance may be calculated more frequently as the capacitance of the charge storage circuit 2202 degrades.

In one embodiment, one or more warning signals are communicated upon the capacitance of the charge storage circuit 2202 degrading below a certain level so that notice can be provided that the charge storage devices may need to be replaced. In such an embodiment, and in other embodiments, the charge storage circuit 2202 can be configured as a plug-in module that can be removed and replaced either while the system is operating normally or during a period where the system is powered down and where components and boards may be moved to allow ready access to the parts to be replaced.

Having described the structure and operation of the components within the power circuit 2000 of FIG. 20, the overall operation of the circuit may now be described. As reflected in the figures, the power selection circuit 2004 receives as its inputs the voltage signals provided by the PRIMARY_PWR bus 2002 and the CAP_BUS 2012. Thus, the power selection circuit 2004 will provide, at its output (Backup_Bus 2006), the input with the highest voltage. Thus, during normal steady state operation, the voltage provided by the primary power bus PRIMARY_PWR 2002 (which will normally be at 12 volts) will exceed the voltage provided by the CAP_BUS 2012 (which will normally be at 7.3 volts) such that the 12V power provided by the primary power bus PRIMARY_PWR 2002 will be passed through to the Backup_Bus 2006. If, however, the primary power bus PRIMARY_PWR 2002 were to fail, or become disconnected from the circuit, then the voltage of the power provided by the PRIMARY_PWR bus 2002 could drop below the voltage of the power provided by the CAP_BUS 2012 such that the voltage from the CAP_BUS 2012 would be passed to the Backup_Bus 2006. In this manner, the power circuit 2000 of FIG. 20 provides relatively stable operating power to the components within the Flash memory system 100 of FIG. 1 during periods when the primary input power is at or nearly at its expected value, and provides a limited supply of stored power from power storage devices in the event of a failure or disruption of the primary input power.

During periods when the circuit is operating normally, the CPU controller 15 can perform periodic checks of the capacitance of the charge storage device 2202 to ensure that the charge storage device 2202 has a capacitance adequate to support backup and shutdown operations in the event that the primary input power fails. If one or more of these checks indicates that the capacitance has degraded to the point that safe backup and shutdown operations can not be assured, the CPU controller 15 can provide an indication to that effect. The indication can be a notice sent to one or all of the host devices coupled to the Flash memory system described herein and/or a visual indication (such as a flashing light or display) indicating that the charge storage device has degraded to the point that a safe backup and shutdown cannot be assured in the event of a failure of the primary power.

Backup and Shutdown Operations

The ability of the power circuit 2000 to provide reliable reserve power during periods when the primary power fails or is disrupted allows the overall system described herein to provide a robust and reliable backup feature. In particular, the availability of the reserve power, coupled with the apparatus and methods described in more detail below, allows the described Flash memory system to backup certain key information into non-volatile storage and elegantly shut down in such a manner that errors and/or data loss are avoided and such that the system may be restarted in a relatively fast and efficient manner. The implementation of the robust backup operations is enabled by novel and beneficial backup and shutdown procedures and the use of novel power sequencing circuitry as described in more detail below.

To understand the backup and shutdown operations of the system described herein, it is beneficial to have an understanding of some of the types of information stored in the system and the components and structures used to store such information as previously described. Additional details are provided below.

FIG. 24, like FIG. 1, illustrates a Flash-based memory system in accordance with certain teachings of this disclosure. Unless otherwise noted, the elements in FIG. 24 correspond to those described with respect to FIG. 1 and, as such, the description of those components will not be repeated.

Referring to FIG. 24, CPU backup memory space 2401 is associated with the CPU controller 15. In this embodiment of FIG. 24, this CPU backup memory storage space 2401 is accessed by the CPU controller 15 through a dedicated communications link. This is exemplary only, however, and the CPU backup memory space 2401 may be accessed by the CPU controller 15 using the same communications bus that the CPU controller 15 uses to access main CPU memory 17, or the same communications bus that the CPU controller 15 uses to access the Flash controller 10. In the embodiment of FIG. 24, the CPU backup memory space 2401 is formed from highly stable non-volatile storage, such as NOR Flash memory. As discussed in more detail below, the CPU backup memory space 2401 is used to store information that is important for purposes of backup and restore.

Figure 25:
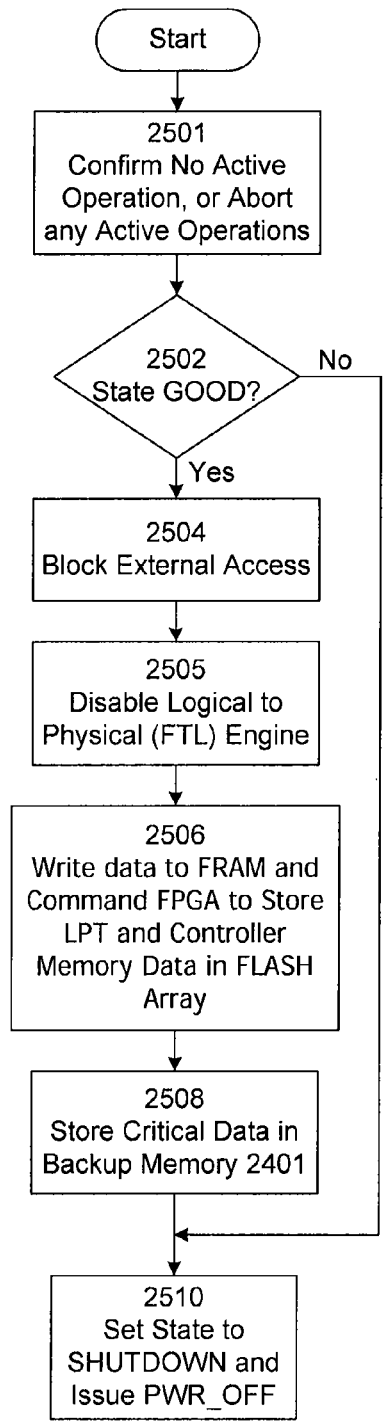
FIG. 25 generally illustrates the novel backup and shutdown procedures that may be implemented using the Flash memory system described herein and, in particular, the exemplary system of FIG. 24.

FIG. 25 generally illustrates the novel backup and shutdown procedures that may be implemented using the Flash memory system described herein and, in particular, the exemplary system of FIG. 24. In general, these procedures are implemented in response to a detected failure or fault in the primary input power and through a combination of hardware and software and/or firmware.

Referring to FIG. 25, the novel backup/shutdown procedures described herein are initiated through the detection of a failure or error in the primary input power. In the illustrated example described herein, this failure or error is detected by the power selection circuitry 2004. This detection may be accomplished, for example, through the assertion of the PRIMARY_PWR_FAIL signal as described above. The assertion of the PRIMARY_PWR_FAIL signal may be detected by the CPU controller 15 at step 2500 which will, in response, initiate the Backup and Shutdown procedure described below.

Initially, at step 2501, the CPU controller 15 will determine whether there is any active on-board operation about to be issued at the time the primary power failure was detected. If such operations exist, the CPU controller 15 will abort those operations.

After confirming the absence of any active operations (or the aborting of any detected underway operations), the CPU controller 15 will determine the state of the system at step 2502. If the state of the system was such that the system was properly operational (e.g., GOOD), such that there is data that potentially needs to be backed up, then the system will proceed to implement the backup process. If the CPU controller 15 determines at step 2502 that the system was not operating properly at the time of the primary power failure (e.g., the primary power was lost before the system was brought into proper operating condition)—such that there is no information that needs to be backed up—then the process will skip the backup operation and go straight to the shutdown operation, discussed in more detail below.

Assuming that step 2502 indicates that the Flash system was operating properly at the time of the failure of primary power, the backup/shutdown process will proceed to step 2504 where it will block out any external access to the Flash memory system. This step ensures that no commands (e.g., READ or WRITE commands) may be received by the system from an external host. In one embodiment, access to the Flash system is locked out, such that a host would be able to detect the locked-out state in the event of an attempted access. In other embodiments, the CPU controller 15 may send positive notification to the hosts using the system that a power failure has occurred. However, such notification can take time and require power that may be needed to complete the backup operations. As such, the most power efficient approach would be the one where no positive notification is provided to the hosts by the system.

After the external access is locked out in step 2504, the CPU controller 15 will monitor the system to ensure that any internal operations underway (e.g., a MOVE operation, the completion of a WRITE operation, etc.) are completed and the board hardware is idle before moving to the next step. One approach for such verification is to have the CPU controller 15 issue a "no operation" or "NOP" command to each of the lanes within the Flash memory array 14. The return of status for each of these commands confirms that the NOP commands have been completed and that all lanes are idle and not processing any previously issued commands.

Once it is determined that the hardware is idle and that all outstanding commands have been completed, the CPU controller 15 will then disable the engine that performs the logical to physical address conversions in step 2505 and, in conjunction with the FPGA or Flash controller 10, proceed to store information that creates a backup image of the system that may be used to quickly and correctly restore the system to the condition that existed at the time of the primary power failure.

Steps 2506 and 2508 illustrate the storage of backup data into secure memory locations by the CPU controller 15 and the Flash controller 10. In the illustrated embodiment, some of the data is stored as a result of actions taken by the FPGA or Flash controller 10 and other data as a result of actions taken by the CPU controller 15, although it will be understood that the operations could be performed by a single controller or otherwise divided between the CPU controller 15 and the Flash controller 10. In one embodiment, data that the CPU controller 15 wants to have written to the Flash memory array 14 will be written by the CPU controller 15 into the Flash controller memory 11 used by the Flash controller 10 and the CPU controller 15 will then instruct the Flash controller 10 to write such data to the Flash memory array 14.

In the illustrated example, step 2506 involves the storage of the logical-to-physical translation table and any error detection and/or error correction information stored therein (the LPT table) in the NAND Flash memory. In the example, this is accomplished through operation of the Flash controller 10 by having the FPGA or Flash controller 10 take the data in the LPT table (which in the illustrated example would have been stored in the FPGA RAM or FRAM 11) and storing that data in the Flash memory array 14. To speed up the process and preserve power, this storage step may be accomplished by having the Flash controller 10 write data to the lanes of the Flash memory array 14 simultaneously and may be accomplished by having the CPU controller 15 issue a single command to the FPGA controller 10. In the same step, the Flash controller 10 may receive and store in the Flash memory array 14 the information stored within the CPU memory 17 in the same manner (e.g., by writing data to all lanes of the memory array simultaneously).

In step 2508, the CPU controller 15 will store certain potentially critical data in the CPU backup memory space 2401, described above. Such potentially critical data may include data reflecting the location of bad Blocks within the Flash memory array 14, a pointer pointing to the location in the Flash memory array 14 where the Flash controller 10 stored the LPT and controller memory data, and error correction information (e.g., CRC information) associated with the stored critical data.

In an alternate embodiment, a predetermined portion of the Flash memory array will be dedicated to the storage of backup information. In such an alternate embodiment, it may be unnecessary to have a pointer as described above, since the storage location of the backup information within the Flash array 14 would be fixed and predetermined. The use of a fixed, reserved and predetermined Flash memory space in the Flash memory array 14 for the storage of backup data may not be optimal for all applications. As such, a still further alternate embodiment is envisioned where the location to which the backup data is stored within the Flash array 14 will vary, either for each start-up of the Flash system, or over the operation of the Flash system. In such an embodiment, the use of the described pointer will identify exactly where in Flash memory the backup data is stored.

To ensure that there is adequate available storage space within the Flash memory array 14 for the storage of backup information, embodiments are envisioned where portions of the Flash memory array 14 are reserved and maintained in a cleared, ready-to-write configuration such that there is always available memory for the immediate storage of backup data. Such memory space can be reserved initially upon start up of the system or can be dynamically constructed during operation such that there is always space available for the storage of backup information. In one embodiment, the reserved memory space for the storage of backup data is selected to represent contiguous memory locations.

In further embodiments, the reserved memory space may be configured such that it is found in a plurality of physical Flash memory chips and there is a physical correspondence between the memory locations of the chips providing the memory space. For example, the reserved space could be such that all of the physical memory locations that provide the member space in the chips correspond to each other in terms of planes, blocks, or other physical characteristics. Such correspondence can increase the speed at which the backup data is stored during a backup operation or retrieved during a restore operation. It can also simplify the bookkeeping associated with backup and restore operations, since the plurality of flash chips used for backup data share common address information.

For example, in one embodiment, the last physical block of the planes in the memory devices making up the Flash memory array 14 can be reserved for the storage of backup data. In other embodiments, the physical memory locations reserved for the storage of backup data are rotated among predetermined locations, with a rotation from one location to the next occurring upon the completion of a successful backup operation.

After the backup data is stored in the Flash memory array 14 and the CPU backup storage space 2401, the CPU controller 15 will change the state of the system to SHUTDOWN in step 2510 and issue a command to shut down the system. Such a command may involve the assertion of a specific signal or command, such as a PWR_OFF signal that may be used to control the power control circuitry to power down the components of the system in an orderly fashion.

In one embodiment, the FPGA or Flash controller 10 is initially configured to support the backup and shutdown process along with the processes that are required during normal operation. Some FPGA's, however, are limited in their available internal resources, and may not be capable of simultaneously supporting both the circuitry required for normal operation and the circuitry required for the backup and shutdown process described above. To enable the use of such FPGA devices, alternate embodiments are envisioned wherein two "images" are provided for the FPGA, with each image configuring the FPGA to provide the circuitry required for operation under one set of conditions. In this embodiment, one programming image for the FPGA may be provided to configure the FPGA for normal operation and another image may be provided for the implementation of the backup and shutdown process. In this embodiment, the CPU controller 15, upon the detection of a primary power failure and a determination that there are no longer any pending "normal" operations, will execute a command to cause the FPGA to "change images"—switching from the image that provides the circuitry for normal operation to the image that provides the circuitry for backup and shutdown. In this embodiment, a still further image may be provided to configure the FPGA for restore and power up operations.

Figure 26:
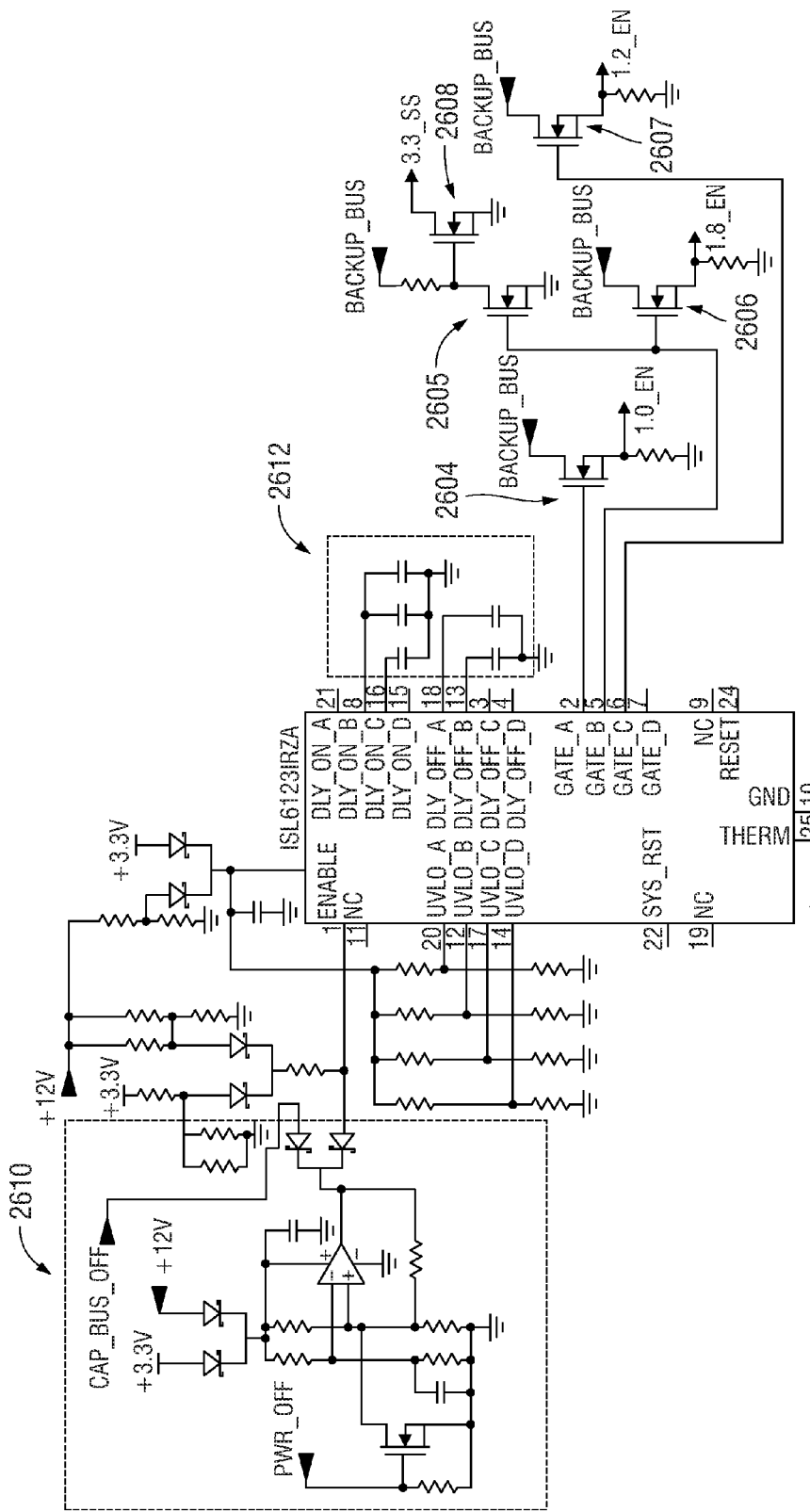
FIG. 26 illustrates exemplary circuitry that may be used with the power system of FIG. 20 to power down (or shut down) the components of the system of FIGS. 20 and 24 in an orderly fashion.

FIG. 26 illustrates exemplary circuitry that may be used with the power system described above in connection with FIG. 20 to power down (or shut down) the components of the system in an orderly fashion.

Referring to FIG. 26, a power shutdown circuit is illustrated that includes a power sequencing controller 2602 (such as the ISL6123 controller available from Intersil); external switching devices 2604, 2605, 2606, 2607 and 2608; PWR_OFF input circuitry 2610; and external configuration circuitry 2612. The gates of the switching devices are coupled to gate drive outputs of the power sequencing controller 2602 such that the gate of the switching device 2604 is coupled to the Gate_A drive of controller 2602, the gate of the switching devices 2605 & 2606 are both coupled to the Gate_B drive of the controller 2602, and the gate of the switching device 2607 is coupled to the Gate_C drive of the controller 2602.

In general, the external configuration circuitry programs the sequencing controller to provide the gate drive signals in a defined order to set a turn-on and a turn-off sequence for the various components of the power system. In the illustrated example, the controller is configured to turn on the devices in a sequence where the Gate_C drive is asserted first, the Gate_B drive second, and the Gate_A drive third, with the sequence being reversed for a turn-off. Thus, in accordance with this sequence, during an ordered turn off process, the regulator 2007b providing the 1.2V FPGA core power will go down first, followed by the regulators 2007C and 2008 providing the 3.3V and 1.8V voltages which are powered down together, followed by the regulator 2007a that provides the 1.0V output.

It will be appreciated that this sequence is exemplary only and that other sequences can be used. In general, the turn-on and turn-off sequences should be determined based on the power sequencing requirements of the components used in the system, such as, for example, the CPU controller 15 and the FPGA or Flash controller 10. Acceptable power sequences for such devices are often included in the documentation associated with such components which identifies sequences to prevent damage to the components when one power rail has failed and another power rail is still within acceptable limited.

As may be noted, switching device 2604 is coupled to the Backup_Bus and coupled to provide an enable line for the DC-DC regulator 2007a, which—as described in connection with FIG. 20—is the regulator providing a 1.0 volt output in the example. The arrangement of the circuit is such that when the Gate_A signal is asserted the enable line for the regulator 2007a will be coupled to the Backup-Bus. Thus, when the Gate_A signal is asserted, and the Backup_Bus has a sufficient voltage on it, the enable signal for the regulator 2007a will be asserted and the regulator 2007a will be enabled and on. If, however, the Gate_A signal is not asserted by the power sequencing controller 2602 (e.g., if it is no longer asserted as the result of a power off sequence) the enable signal for the regulator will go low and the regulator 2007a will be disabled or turned off. Moreover, because the switching device 2604 is connected to the Backup_Bus 2006, the enable signal to the regulator 2007a will also go low in the event that the Backup_Bus drops to a level insufficient to assert the enable signal. Thus, this circuit arrangement allows the Gate_A drive signal to primarily determine the operating state of the regulator 2007a, but also ensures that the enable signal will go low (thus turning off the regulator 2007a) if the Backup_Bus voltage falls to an insufficient level (regardless of the state of the Gate_A drive signal). The turning off of the regulators as a result of the Backup_Bus 2006 voltage dropping to such a low value can prevent the damage of components if there is a problem with the backup operation (e.g., if it gets "stuck" and takes too long to complete the backup operation such that the PWR_OFF signal is not asserted in a timely fashion) or if there is a problem with the charge storage circuit that prevents the circuit from providing power adequate to complete the backup process.

As is reflected in FIG. 26, the switching devices 2606 and 2607 are configured similar to that described above with respect to device 2604 such that their operation is the same as that described above. Switching devices 2605 and 2608 are arranged to provide equivalent control over the regulator 2008 providing the 3.3 volt output in the example, The PWR_OFF input circuitry 2610 is configured to initiate a power down sequence whenever the PWR_OFF signal is asserted by the controller 15. In the illustrated example, the input circuitry 2610 is also configured to initiate a power off sequence in response to other conditions.

In the illustrated embodiment, the PWR_OFF input circuitry 2610 also operates to provide a form of "power latch." If there is an indication that the primary power has failed and a backup operation is initiated and the primary power returns to full power during the backup procedure, the input circuitry 2610 will allow the system to complete the backup and turn the power off to all the parts in the system and keep the power off until the entire system is reset by taking the primary power back to a low level—or OFF—and reapplying the power such that a proper startup and restore operation is initiated. This latching is implemented because it ensures that the system goes through a proper backup and restore operation once a backup operation is initiated, rather than face the potential of beginning to operate based on incomplete or indeterminate backup data.

Efficient Startup and Restore Operations

The implementation of the robust backup and shutdown operations and apparatus as described above allows the Flash memory system described herein to implement fast and highly efficient startup and restore operations. These operations are generally reflected in FIG. 27.

Figure 27:
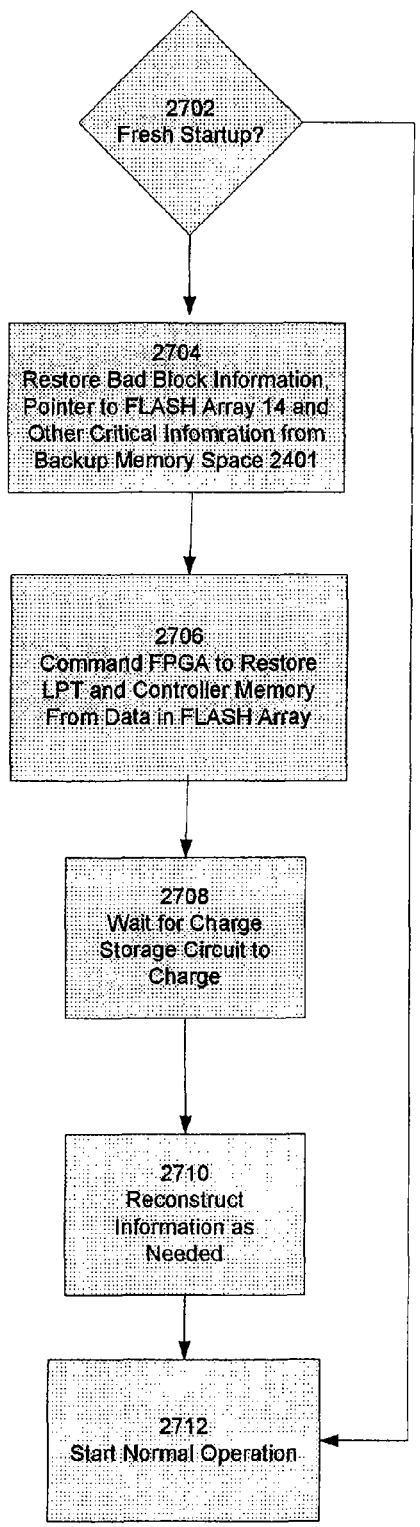
FIG. 27 illustrates an exemplary startup and restore process that may be used with the system of FIGS. 20 and 24.

Referring to FIG. 27, an exemplary startup and restore process is illustrated. Such a process would be typically implemented through proper programming of the CPU controller 15. Referring to FIG. 27, the controller first determines, in step 2702, whether the system is engaging in a "fresh" start up—such that there is no backup data to be restored—or whether the system is engaged in a start up that requires a restore operation. If a determination is made that the system is engaged in a "fresh" start up, the system will proceed to startup and power up at step 2712 without engaging in a restore operation. If the system is engaged in a start up that requires a restore, the system will first restore the system information concerning the bad blocks in the Flash memory array 14 from the backup memory space 2401 accessible to the controller 15 at step 2704. Then the controller will restore, from the CPU backup memory space 2401, the information indicating the point in Flash memory array 14 at which the backup data and image was stored and the other information, such as the error correction or CRC information, available in the CPU backup storage space. This is also accomplished in step 2704.

Using the information obtained from the CPU backup memory space 2401, the CPU controller 15 can then provide instructions to the FPGA or Flash controller 10 to restore the LPT table that will be saved into the Flash memory array 14 and the information that was stored during backup from the controller memory. This is accomplished in step 2706.

In step 2708, the CPU controller 15 will wait until the charge storage circuit 2202 in the power system described above in connection with FIG. 20 is fully charged before proceeding to the next step. This step is implemented to ensure that there is adequate backup power available to back up the system in the event of a subsequent failure of primary input power. This step 2708 can be accomplished through either a monitoring and sampling of the voltage on the CAP-_BUS voltage or through a prescribed time delay under the assumption that the charge storage circuit will adequately charge over that period.

In step 2710, the CPU controller 15 can engage in various reconstruction actions, such as, for example, using data now stored in the CPU memory to reconstruct the tables and information identifying the dirty blocks and blocks that are ready to erase. Once that is done, the CPU controller 15 can initialize the engine that performs the logical to physical address conversion and place the system in a state of normal operation at step 2712.

The systems and methods described above have been used in connection with a memory system exemplified by the memory system of FIGS. 28A-33B. The same systems and methods can be used with more complex systems. One example of a complex system in which the disclosed designs and methods can be used is reflected in FIG. 28A.

Figure 28A:
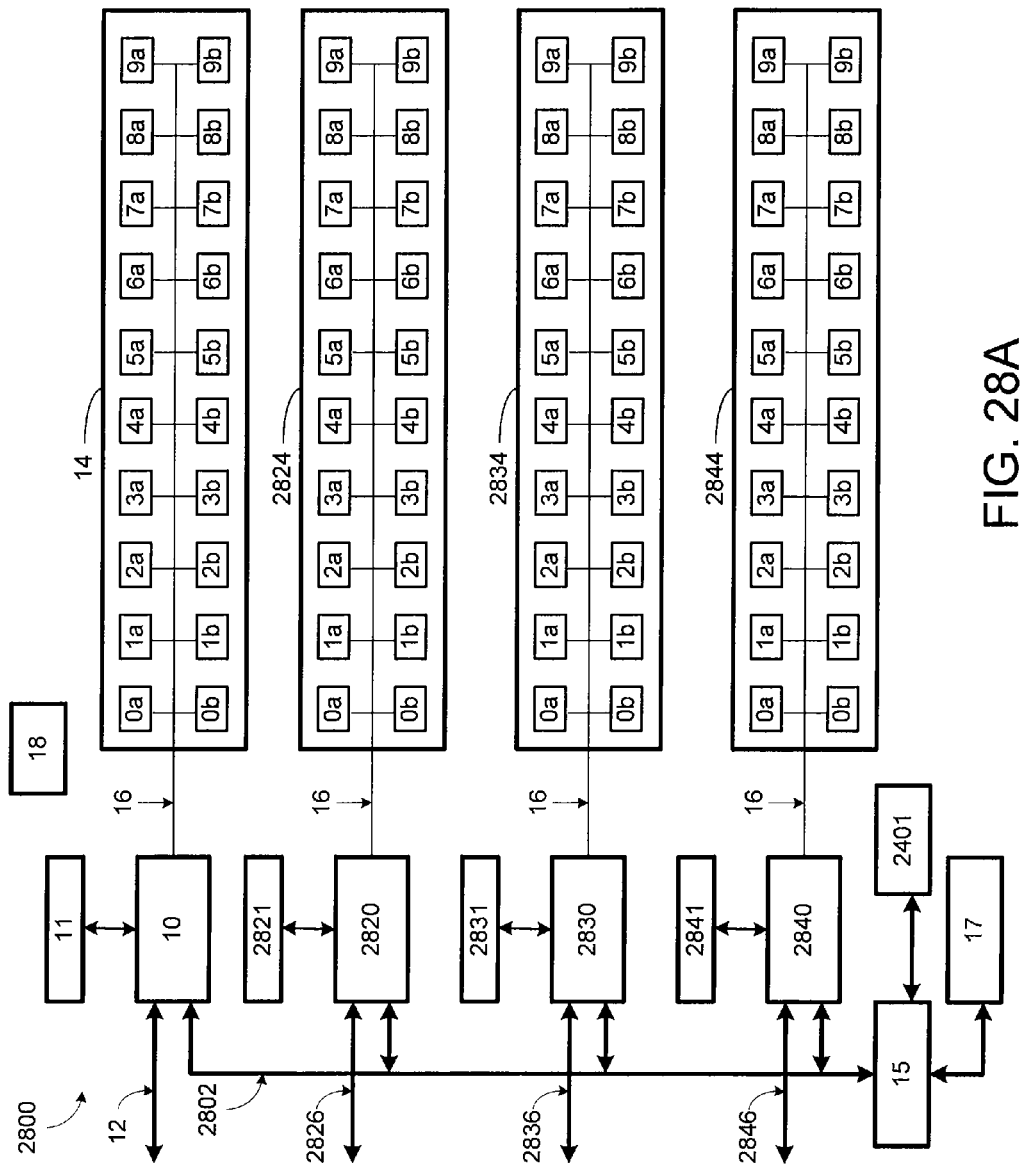
FIGS. 28A and 28B illustrate examples of a card-based Flash memory storage system.

Referring to FIG. 28A, a memory system 2800 is illustrated that, in the illustrated embodiment includes a number of components mounted on a single printed circuit board for a card-based Flash memory system. In general, the card-based Flash memory system 2800 of FIG. 28A includes several components like those described above in connection with FIGS. 1 and 24 and, unless otherwise noted, similarly labeled components are the same as in the systems described in connection with FIGS. 1 and 24.

Referring to FIG. 28A, the illustrated system 2800 includes a CPU 15, CPU memory 17, and CPU backup memory space 2401. As with the previously described embodiments, the CPU backup memory space 2401 can take the form of Flash memory and, more specifically, NOR Flash memory in some embodiments.

The system 2800 further includes a first Flash controller 10, a first Flash controller memory 11, a first Flash storage array 14, and buses 12 and 16 as described above. The first Flash controller 10 communicates with the CPU 15 via a bus 2802. Although not illustrated, the system will include the power circuitry described above for providing power to the overall memory system 2800.

In addition to including the first Flash controller 10, with its first Flash controller memory 11 and first Flash storage array 14, the memory system 2800 also includes second, third and fourth Flash controllers 2820, 2830, and 2840, each having its own Flash controller memory (which in the embodiment is RAM memory) 2821, 2831, and 2841, and each having its own memory or storage array 2824, 2834 and 2844. Each of the second, third and fourth Flash controllers 2820, 2830 and 2840 is coupled to communicate with the CPU 15 via the communications bus 2802.

In general, each of the second, third and fourth controllers 2820, 2830, and 2840 and its associated flash controller memory 2821, 2831, and 2841 and Flash storage array 2824, 2834 and 2844 operate like Flash controller 10 and its associated circuitry as described above. For example, each receives memory access requests over an associated bus (identified as bus 2826, 2836 and 2846 respectively) and each processes those requests in the manner described above with respect to the system of FIGS. 1 and 24. Thus, each of Flash controller 10, 2820, 2830 and 2840 will maintain its own LPT table (and in some embodiments, its own individual LPT error correction and/or error detection data) within its associated controller memory.

In the system 2800 of FIG. 28A, when there is a power disruption, each of the individual Flash memory controllers 2820 2830 and 2840 will respond like controller 10 as described above to engage in a backup operation to store the appropriate backup information within its associated Flash array. In this embodiment, CPU 15 will operate as described above to back up its associated data within the CPU backup memory 2401. The restore operation will be as described above with respect to the CPU 15 and each individual Flash controller.

In the example of FIG. 28A, each Flash controller 10, 2820 2830 and 2840 is illustrated as receiving memory access requests over an independent and dedicated communications link 12, 2826, 2836 and 2846. Alternate embodiments are envisioned wherein a switch (potentially under the controller of the CPU 15) is provided, wherein the switch receives or transmits data and commands over one or more communication links external the printed circuit board on which the overall system is formed and uses the switch to transmit the data or commands to or from the appropriate Flash controller.

Figure 28B:
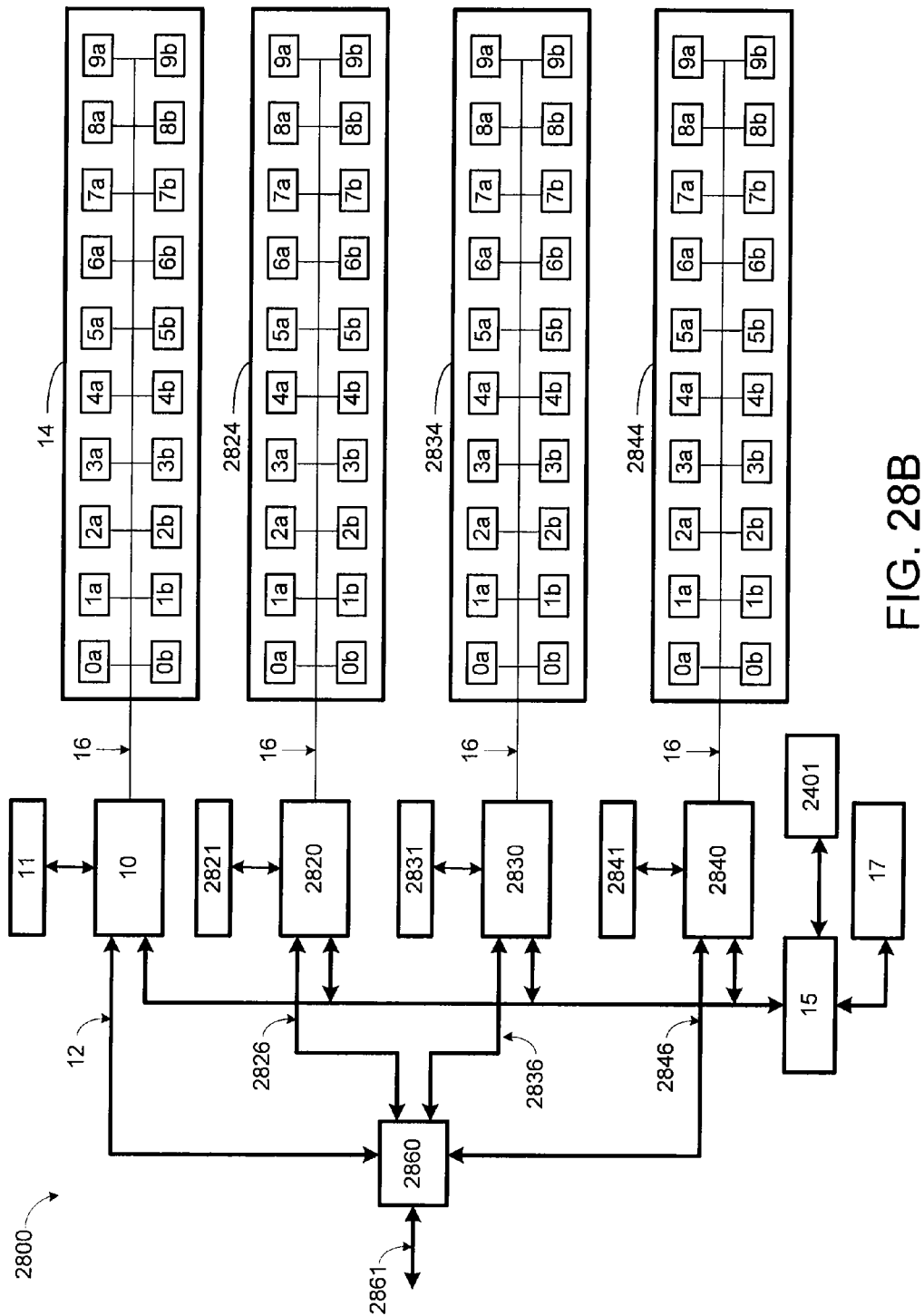

Such an embodiment is illustrated in FIG. 28B, where like-numbered elements are the same as reflected in FIG. 28A. Referring to FIG. 28B, the primary interface link 2861 connects directly to a primary controller 2860. The primary controller 2860 receives data requests over the primary interface link 2861 and, in turn, provides the requests to each Flash controller 10, 2820, 2830 and 2840 over communication links 12, 2826, 2836, and 2846, respectively. As discussed above, many of the data requests will be associated with a specific LBA, or range of LBAs. In the embodiment of FIG. 28B, each Flash controller 10, 2820, 2830 and 2840 will be associated with a particular non-overlapping range of LBAs. One of the functions of the primary controller 2860 is to receive requests, and direct those requests to the specific Flash controller to which the LBA included in the request is assigned. In this manner, the primary controller 2860 performs a form of address decoding.

The construction of a memory system on a single printed circuit board as described above in connection with FIG. 28A or FIG. 28B (such system being referred to herein as a "Flash-card") enables the construction of more sophisticated systems. One such system is illustrated in FIG. 29.

Figure 29:
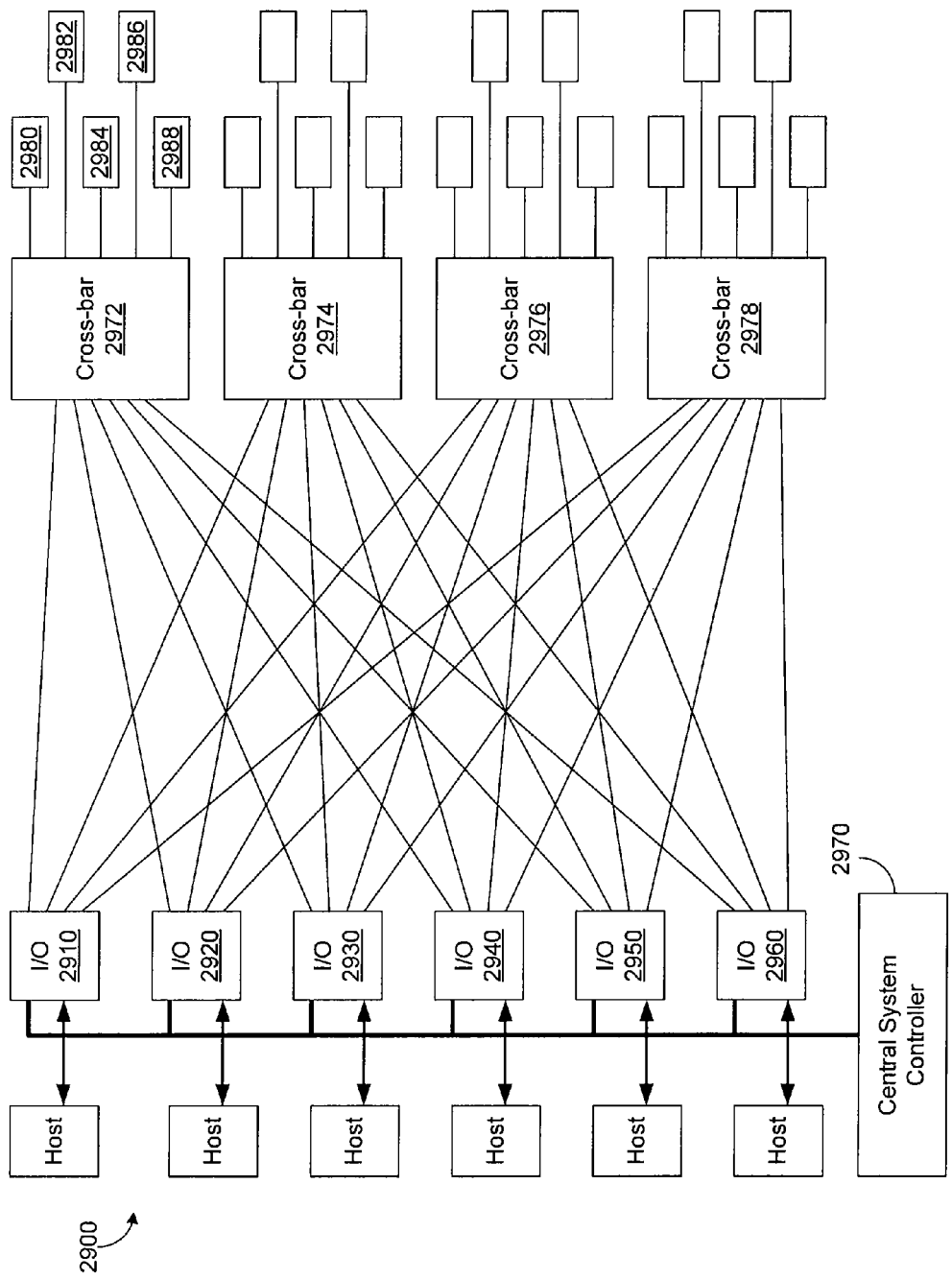
FIG. 29 illustrates an example of a module-based Flash memory storage system that uses one or more card-based Flash memory storage systems.

Referring to FIG. 29, a memory storage system 2900 is illustrated that includes a number of different input/output ("I/O") modules 2910, 2920 2930, 2940, 2950 and 2960. Each input/output module is a module that can receive and transmit communications and data over one or more external communications links. Each I/O module can receive communications from an external host using one or more known communication protocols such as Fibre Channel, Infiniband, SATA, USB or any other known communication protocol.

Each I/O module is coupled to enable bi-directional transfer of data or information to and from a central system controller 2970 and to and from a number of cross-bar switching elements 2972, 2974, 2976 and 2978. Each of the cross-bar switching elements is also coupled to receive commands and control signals from the central system controller 2970.

Each of the cross-bar switching elements is further coupled to a plurality of Flash-cards, which are labeled here as 2980, 2982, 2984, 2986, and 2988 for reference, with each Flash-card having a construction like that in FIG. 28B. It will be understood, however, that this construction is exemplary and that the Flash-cards 2980 could have the construction depicted in FIG. 28A or other constructions without departing from the teachings of this disclosure.

In general, the I/O modules 2910-2960 will receive data access requests that are each generally directed to a specific LBA as described above. In the illustrated example, a range (potentially the entire range) of the LBAs provided by the system are mapped to multiple physical Flash-cards, with each Flash-card being associated with a given range of LBAs. Furthermore, in the example of FIG. 29, each of the cross-bar switching elements 2972-2978 is coupled to a number of Flash-cards 2980. In the example, each cross-bar switching element is coupled to five Flash-cards, although it will be understood that one could associate different numbers of Flash-cards with each cross-bar element. Thus, because each of the Flash-cards will be associated with a given range of LBAs, and because each cross-bar element will be associated with a given number of Flash-cards, each cross-bar element will be associated with a given range of LBAs.

In the illustrated example of FIG. 29, requests are received by the I/O modules from external hosts. Each I/O module will partially process a request, at least to the extent to determine which of the cross-bar switching elements is associated with the LBA associated with that request. The I/O module will then forward the request, or at least a portion of the request, to the appropriate cross bar switching element. The cross-bar switching element that receives the request will, in turn, partially process the request to at least determine which of the Flash-cards coupled to the cross-bar switching element is associated with the LBA to which the request is directed. The cross-bar element will then forward the request to the appropriate Flash-card which will process the request as described above in connection with FIG. 28A or FIG. 28B.

In the example of FIG. 29, each of the Flash-cards in the system includes the power system 2000 as described above. As such, each Flash-card is capable of responding to an unexpected power failure by implementing the backup and shutdown sequence as described above to preserve and protect the integrity of the data stored on the Flash-card. In addition, however, the system of FIG. 29 can provide for an orderly, expected shut-down that can enable the "warm-swap" of one of more of the Flash-cards. More specifically, in the system of FIG. 29, each of the cross-bar switching elements includes, not only elements for switching data and control signals, but also a controlled power switch (such as a power FET) that allows for the control of the power provided to each of the Flash-cards. The controlled power switches for the cross-bar switching element are shown here as 2982, 2984, 2986, and 2988, respectively. The inclusion of such a controlled power device allows the system of FIG. 29 to implement a "warm-swap" feature. In such a feature, a decision can be made to disable a specific Flash card while the overall system continues to run. This decision can be made locally, by a specific Flash-controller or primary controller on a given Flash-card, by the overall system controller, or externally by a host or operator. When such a decision is made, a control signal can be provided to the particular Flash-card at issue to initiate an orderly shut-down. The Flash-card receiving the orderly shutdown command can respond to the command by initiating a shut-down and backup procedure as described above. Once that procedure is completed, the Flash-card (through its primary controller) can issue a command indicating that the orderly shutdown has been completed and the overall system controller can then send a signal to the power switch to shut power off to the Flash-card at issue. The Flash-card at issue can then be safely removed from the system, e.g., for replacement.

The use of an orderly shutdown procedure as describe above provides several advantages. As one example, a system can be constructed that provides one extra "spare" Flash-card that is not normally used. When a potential fault is detected in one of the main Flash-cards, the Flash-card with the potential fault can be shutdown and removed in the orderly manner described above and the "spare" can be substituted therefor without interfering with the overall operation of the system. In one alternative embodiment, the data from the Flash-card to be shut down can be migrated to the "spare" card prior to the shutdown to ensure data continuity.

The ability to have an orderly shutdown of individual Flash-cards as provided above, allows for the construction of systems with removable Flash-card modules. Such a system can be beneficially used in applications where one wants to be able to store very large amounts of information in Flash memory using equipment that is fixed in a given structure (e.g., a mobile unit such as a car or airplane) and then access that data using equipment in another location. In such situations, the amount of time that may be required to transport the stored data over a network or other electronic connection may be undesirable and/or the ability to transport the data electronically may be limited. In such situations, the teachings of the present disclosure allow for the construction of a Flash-based storage system where data can be stored in one or more Flash-memory modules in one piece of equipment and the data modules can be physically removed for ready transport to another piece of equipment where the data can be accessed. This type of system allows for extremely fast data transmission and also allows for the transmission of extremely large amounts of stored data under conditions where there is no electronic data transmission infrastructure.

A system as described above is generally depicted in FIGS. 30, 31, 32A-32D, and 33A-33B.

Figure 30:
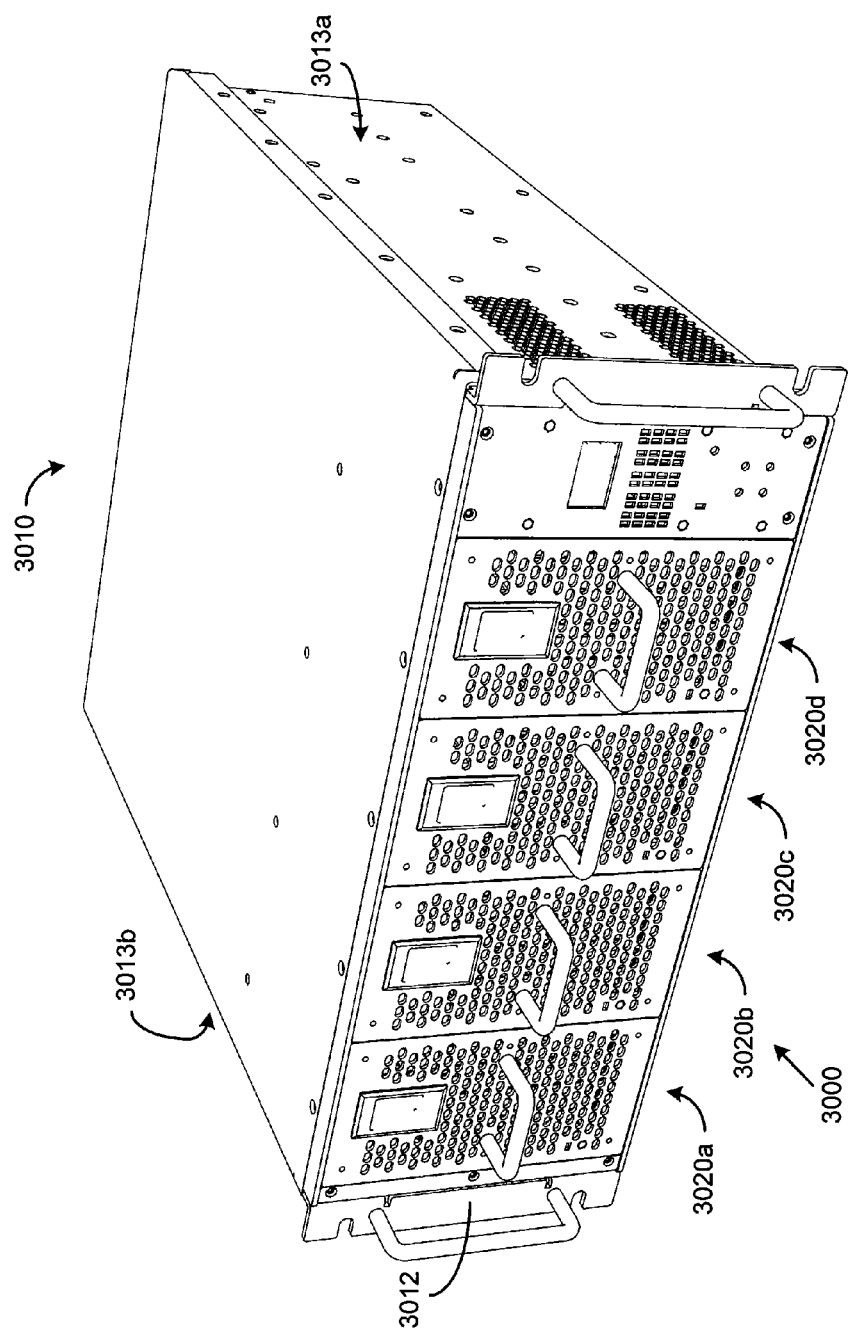
FIG. 30 illustrates a perspective view of an example of a rack-mountable structure for housing one or more module-based Flash memory storage systems.

Referring first to FIG. 30, a physical storage system 3000 is illustrated that includes a rack-mountable structure or housing 3010 that includes a front face 3012 configured to be mounted to a rack (not illustrated). In one embodiment the front face 3012 of the rack-mountable structure is formed of electrically conductive material. Positioned within the rack-mountable structure 3010 are four individual, removable, Flash-modules 3020a, 3020b, 3020c and 3020d. Although not expressly shown in FIG. 30, in some embodiments, the rack-mountable structure or housing 3010 may also be fitted with rack slides on each side 3013a and 3013b of the structure to facilitate mounting the structure on a chassis or the like.

Figure 31:
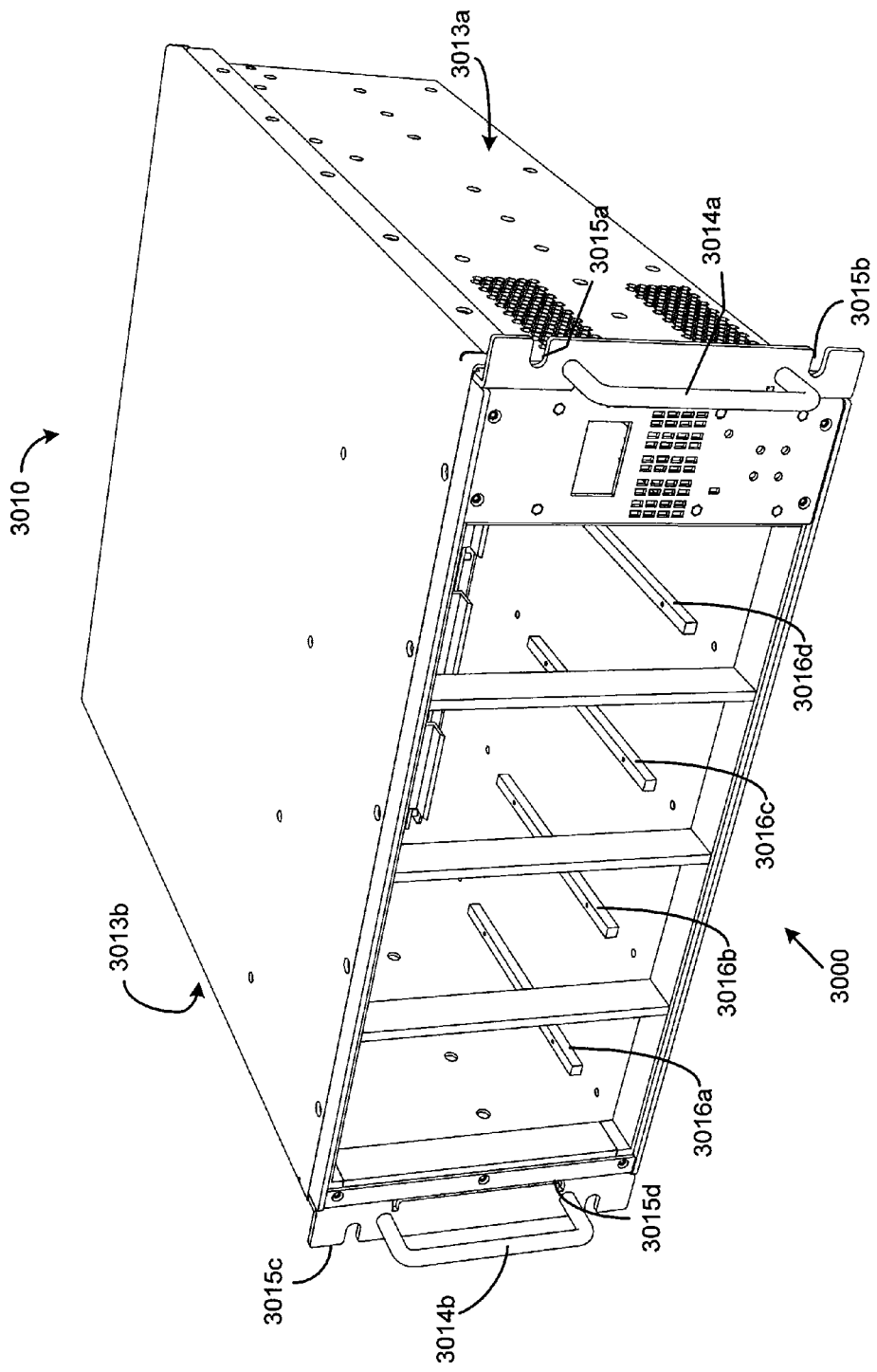
FIG. 31 illustrates an interior view of the rack-mountable structure for housing one or more module-based Flash memory storage systems.

Additional details concerning the construction of an exemplary structure 3010 may be found in FIG. 31, which shows a view of the rack-mountable structure 3010 without the front face 3012. Referring to FIG. 31, the rack-mountable structure 3010 is a generally box-like structure that may be formed of electrically conductive materials like steel. Positioned on the front face of the structure are plates or components that include, in the example, both mounting slots 3015a-3015d and handles 3014a-3014b (see also FIGS. 33A and 33B) that allow the structure to be easily positioned and mounted on a rack. As can be seen, guide members 3016a-3016d may be positioned within the box-like structure 3010 to define areas for reception of the Flash-modules 3020a, 3020b, 3020c and 3020d (FIG. 30). The bottom portions of the box-like structure 3010 may further be coated or covered with a material, such as a phenolic material, to allow the Flash-modules to smoothly glide into and out of the rack-mountable structure 3010.

Figure 32B:
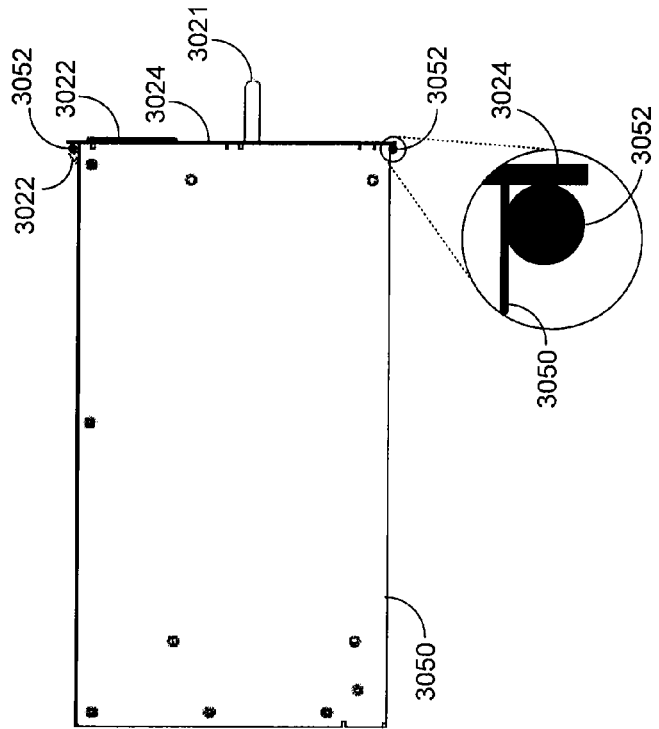
FIGS. 32A-32D illustrate the exterior construction of an exemplary module-based Flash memory storage system.
Figure 32A:
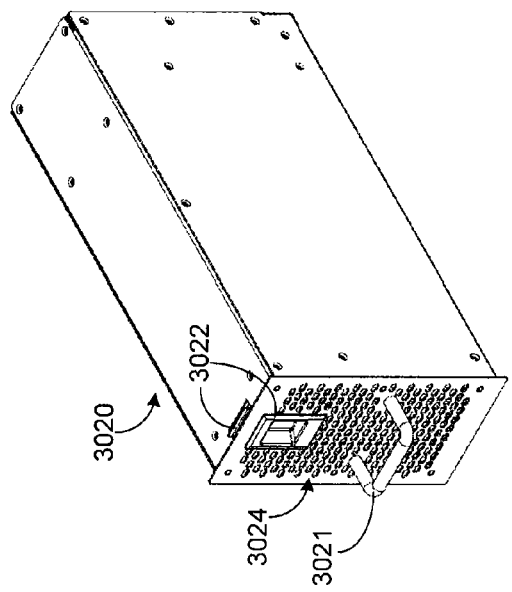

Details of the construction of the Flash-modules 3020 of the exemplary system 3000 are provided in FIGS. 32A-32D. FIG. 32A illustrates the exterior construction of an exemplary Flash-module 3020 (the Flash-card mounted therein is shown in dashed lines). In general, the Flash-module 3020 is a box-like structure that is rectangular in appearance and that includes a handle 3021 for ease of removal and installation of the module, a latching mechanism 3022 for maintaining the position of the Flash-module 3020 within the rack-mountable structure 3010 when the latching mechanism 3022 is engaged, and a plurality of ventilation openings 3024 to allow for the circulation of cooling air. The Flash-module may be constructed of lightweight materials, including aluminum and may be partially constructed from steel. In general, the Flash-modules are configured to slide in and out of the rack-mountable structure 3010. To that end, the rack-mountable structure 3010 may include low-friction components, such as one or more phenolic strips, to enable the Flash-modules to more easily slide into and out of the rack-mountable structure 3010.

FIG. 32B illustrates a side view of an exemplary Flash-module 3020, which shows the positioning of the Flash-cards within the module. FIG. 32B further reflects the positioning of a generally non-conductive, compressible material 3050—which, in the example of FIG. 32B, is a Fiberglass mesh material—on the bottom of the Flash-module. The generally non-conductive, compressible material 3050 tends to electrically isolate and physically separate the Flash-module from the bottom portion of the rack-mountable structure 3010 and may also serve to provide shock relief. Alternate embodiments are envisioned in which the material 3050 is partially to highly conductive.

In addition to the above, the Flash-module 3020 includes a flanged front surface 3024 that is formed of conductive material that, in one preferred embodiment, is either the same material from which the front face 3012 of the rack-mountable structure 3010 is formed, or a material that has the same degree of electrical conductivity as the front face of structure 3010. In one embodiment, electrically conductive gasket material 3052 is positioned along the flanged portion of the front surface 3024 on the interior side thereof such that the gasket is positioned between the flanged front surface 3024 and the front face 3012 of the rack-mountable structure 3010 when the Flash-module 3020 is positioned within the rack-mountable structure 3010. In this embodiment, because the gasket material 3052 is electrically conductive, the combination of the flanged front surface 3024 of the module, the gasket 3052 and the front-face 3012 of the rack-mountable structure 3010 forms a relatively conductive structure. The presence of such a conductive structure tends to reduce the nature and extent of electro-magnetic interference ("EMI") emissions from the system 3000.

Alternate embodiments are envisioned where the electrically conductive gasket material 3052 is affixed to the front face of the rack-mountable structure 3010 and/or where the gasketing material is coupled to both portions (or all) of the flanged front surface 3024 of the Flash-module 3020 and to portions (or all) of the front face surface of the rack-mountable structure 3010. In one embodiment, the gasketing material may be a low closure force EMI gasketing material such as the type provided by Parker Chomerics under the SOFT-SHIELD trademark.

Figure 32D:
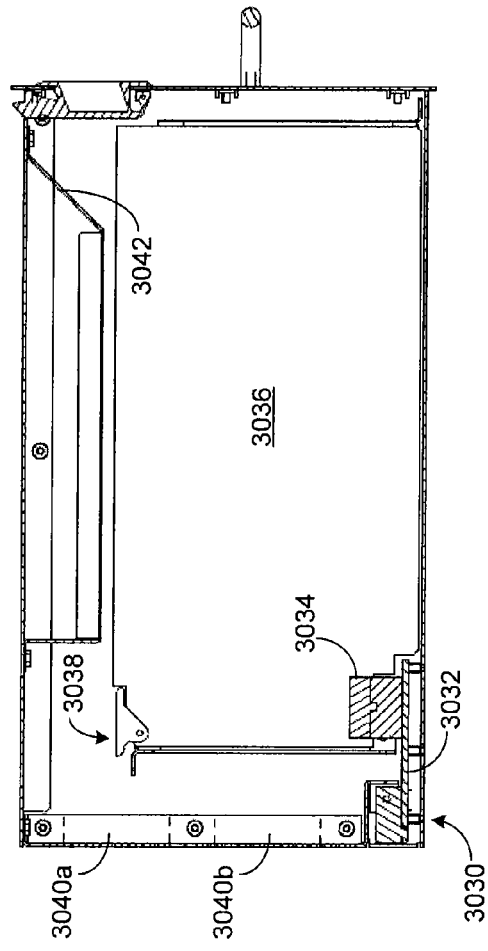
Figure 32C:
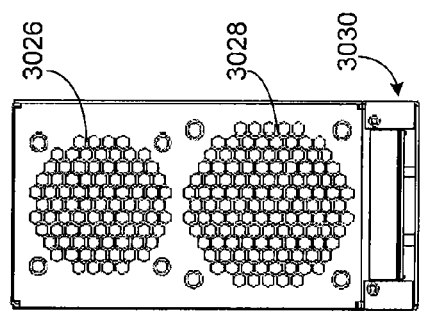

FIG. 32C illustrates the rear portion of the Flash-module 3020. As illustrated, the rear portion defines two vented portions 3026 and 3028 to allow for the flow of air through the module. A external interface portion is provided that includes an exterior physical interface 3030 for mounting the Flash-module 3020 to the rack-mountable structure 3010, discussed in more detail below.

FIG. 32D illustrates a cross-section of the Flash-module 3020. As reflected in this cross-section, the module 3020 includes the external physical interface 3030, an interior motherboard 3032, a plurality of Flash-cards 3036, and a plurality of interior physical interfaces 3034 for mounting the Flash-cards 3036 to the interior motherboard 3032 (only one each of the Flash-cards 3036 and interior physical interfaces 3034 is illustrated in FIG. 31C). The Flash-cards 3036 may have the construction of the Flash-cards discussed above in connection with FIG. 29. Retaining structures 3038 may be provided to retain the Flash-cards in position. In the embodiment of FIG. 32D, each of the physical interfaces 3030 and 3034 is a connector module of the type available from, respectively, Component Equipment Company, Inc. (CECO), part number FXR5M2BC1P1M; and ERNI Electronics GmbH, part number 973056. Each of these physical interfaces 3030 and 3034, in turn, may be mated to corresponding connectors, respectively, on the rack-mountable structure's motherboard (e.g., CECO part number FXPR5M2C3P1X) and the Flash-module's motherboard 3032 (e.g., ERNI part number 973046).

Also positioned within the module 3020 are two cooling fans 3040a and 3040b (see dashed lines) for creating cooling airflow through the module 3020. In one embodiment, the fans are arranged to draw air through the "front" portion of the module 3020 (the portion with the handle 3021) and expel the air through the back of the module via the vent portions 3026 and 3028 (see FIG. 32C) of the module. In such an embodiment, a diverting baffle 3042 may be provided for diverting airflow downward towards the Flash-cards. In one embodiment, the fans 3040a and 3040b are differently sized such that, in combination with the diverting baffle 3042, the overall airflow across the Flash-cards from top-to-bottom is substantially constant to allow for even cooling. In such particular embodiment, the upper fan is a 60 mm cooling fan and the lower fan is a 70 mm cooling fan.

In the embodiment of FIGS. 32A-32D, each Flash-module 3020 includes four Flash-cards 3036, although it will be understood that a different number of Flash-cards can be used without departing from the teachings of this disclosure.

In general, the external interface 3030 enables signal connections to be made to provide and receive control and data signals to and from the Flash-cards. Further, the external interface 3030 allows for the provision of power to the Flash-module's motherboard 3032 for distribution to the various Flash-cards 3036 through the internal connectors 3034. In general, one internal connector 3034 is provided for each Flash-card within the module.

The external interface card 3030 provides the received signal lines and power to the motherboard 3032 positioned within the Flash-module 3020. Included on the motherboard 3032 are connections that receive the power from the external connector 3030 and provide the power, via a branched circuit, to connectors 3034 which in turn, provide power to the individual Flash-cards. Included within the branch circuit are individual fuse elements (not expressly shown) that create a fused connection between the input power line and each of the Flash-cards within the module 3020. In one embodiment, the fuses within the Flash-module are non-resettable fuses that will trip when a specific current limit is reached. These non-resettable fuses may be combined with a slower acting resettable fuse positioned on the mother board, with one resettable fuse per Flash-module, that trips when a sufficiently large electrical current is present for a sufficiently long period of time. This use of relatively fast-acting, non-resettable fuses for each Flash-card within the Flash-module and a single slower acting, resettable fuse external to the Flash-module, for the entire Flash-module, provides a high degree of system protection.

Figure 33A:
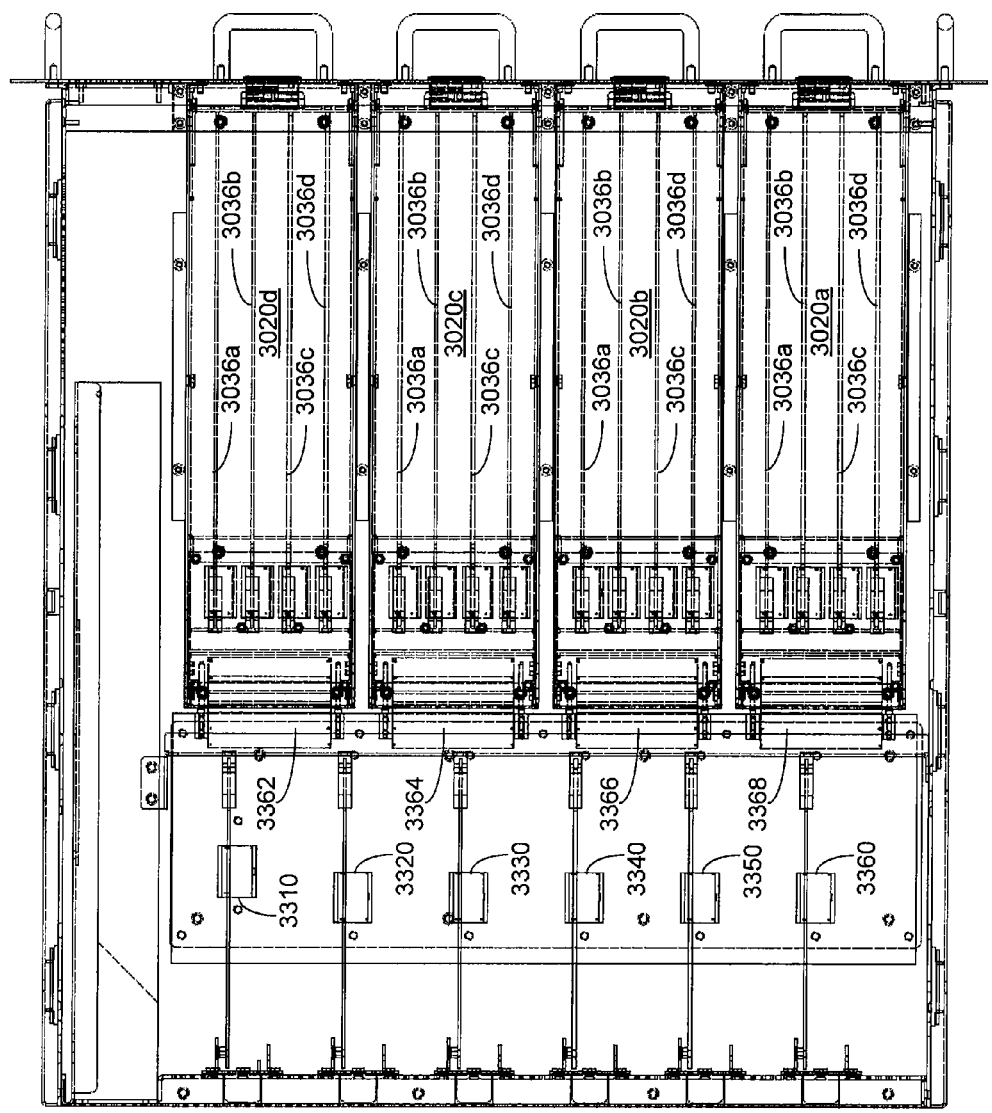
FIGS. 33A and 33B illustrate top and side cross-sectional views of the exemplary rack-mountable structure for housing one or more module-based Flash memory storage systems.

FIGS. 33A an 33B illustrate the manner in which the Flash-modules 3020 may be used in the overall system.

Referring first to FIG. 33A, a top-down view of the internal components of the rack-mountable structure 3010 are illustrated in a situation where four Flash-modules are positioned within the system. In general, the system is similar to that described above in connection with FIG. 29 in that the system includes a plurality of Input/Output modules 3310, 3320, 3330, 3330, 3340, 3350 and 3360 that can receive and respond to data requests from and to one or more external hosts (not illustrated). The I/O modules are coupled to a plurality of cross-bar switching elements 3362, 3364, 3366 and 3368, and each cross-bar switching element is coupled, through a connector and an external interface 3030 (see FIGS. 32C-32D) to one of four Flash-modules 3020a, 3020b, 3020c and 3020d. Each Flash-module 3020a-d contains or houses a plurality of Flash-cards, 3036a, 3036b, 3036c, and 3036d. Located with each cross-bar switching element is a power switch (not specifically numbered) that can be activated (or deactivated) to control the application of power to the Flash-module associated with that cross-bar switching element.

In operation, the system of FIG. 33A operates like the system described in connection with FIG. 29. However, instead of controlling the application of power to individual Flash-cards, the power switches associated with each cross-bar switching element are utilized to control the application of power to entire Flash-modules. Thus, in operation, the system can be operated for a period of time during which data can be stored within the Flash memory locations within the Flash-modules. Then, at a later time, instructions can be provided to each Flash-module to perform an orderly shutdown and, using the structures and methods described above, each Flash-card within each Flash-module can perform an orderly shut-down and back-up operation and provide a notification when such operation is complete. At that time, a notification can be provided that the Flash-module can be safely removed. Alternatively, although not preferred, a given Flash-module can be unexpectedly removed, thus disconnecting the power from the Flash-module and causing the Flash-cards within the module to perform an emergency backup operation as described above.

The operation described above thus allows for the removal of one or more of the Flash-modules and transportation of the Flash-module to another location and another piece of equipment where the data stored within the module can be promptly read and analyzed. In such an application, a new or "empty" Flash-module can be inserted into the system and be used to receive new data while the data in the "filled" Flash module is inspected. This system can be particularly advantageous in airborne or mobile inspection systems. For example, while the inspection system is in operation and the inspection is in progress, data can be obtained. The Flash-modules can then be removed to allow for prompt review of the data while new Flash-modules are installed to facilitate further collection of data.

Figure 33B:
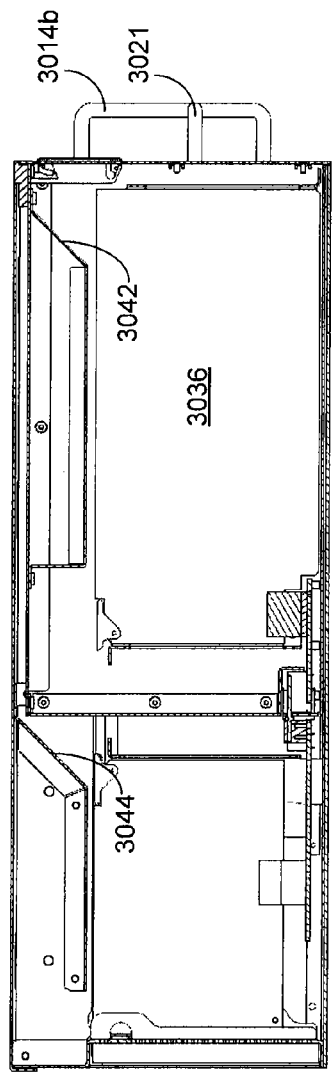

FIG. 33B illustrates a side cross-sectional view of the system of FIG. 33A. As illustrated, the system may include a second diverting baffle 3044 disposed towards the back of the Flash-module behind the first diverting baffle 3042 for directing the air circulated by the cooling fans within the Flash-modules across the I/O modules to allow for cooling of the I/O modules.

The above embodiments are illustrative and not limiting. Other and further embodiments utilizing one or more aspects of the inventions described above can be devised without departing from the spirit of Applicant's invention.

Further, the order of steps can occur in a variety of sequences unless otherwise specifically limited. The various steps described herein can be combined with other steps, interlineated with the stated steps, and/or split into multiple steps. Similarly, elements have been described functionally and can be embodied as separate components or can be combined into components having multiple functions.

The inventions have been described in the context of preferred and other embodiments and not every embodiment of the invention has been described. Obvious modifications and alterations to the described embodiments are available to those of ordinary skill in the art. The disclosed and undisclosed embodiments are not intended to limit or restrict the scope or applicability of the invention conceived of by the Applicants, but rather, in conformity with the patent laws, Applicants intend to protect fully all such modifications and improvements.

What is claimed is:

1. A Flash-based memory system having a backup power source, comprising:
   a printed circuit board (PCB);
   a plurality of Flash memory devices mounted to the PCB, each Flash memory device having a physical memory space that is divided into blocks, each block being further divided into pages, each page representing an individually addressable memory location on which memory operations are performed, multiple memory locations being erased at the same time in one-block groupings;
   a Flash controller mounted to the PCB and communicating independently with each Flash memory device to perform the memory operations;
   a power circuit mounted to the PCB and providing power to the Flash memory devices, the power being provided from a primary power source during normal operation of the Flash-based memory system and from a backup power source when the primary power source falls below a predefined level, the backup power source including a charge storage device and charging circuitry configured to charge the charge storage device; and
   a central processing unit (CPU) mounted to the PCB and coupled to the power circuit and the Flash controller, the CPU configured to perform one or more test procedures on the charge storage device and provide an indication of a charge storage capacity of the charge storage device, the one or more test procedures comprising:
   disabling the charging circuitry from charging the charge storage device;
   obtaining a first voltage measurement from the charge storage device;
   applying a predefined load to the charge storage device;
   obtaining a second voltage measurement from the charge storage device;
   waiting a predefined amount of time; and
   obtaining a third voltage measurement from the charge storage device;
   wherein the CPU provides an indication of the charge storage capacity of the charge storage device by providing at least one of a capacitance C of the charge storage device and an equivalent series resistance (ESR) of the charge storage device based on one or more of the first, second, and third voltage measurements.

2. The Flash-based memory system according to claim 1, wherein the one or more test procedures further comprises obtaining an initial voltage measurement from the storage device prior to disabling the charging circuitry and continuing with the one or more test procedures only if the initial voltage measurement exceeds a first predefined threshold.

3. The Flash-based memory system according to claim 1, wherein the one or more test procedures further comprises determining whether the first voltage measurement exceeds a second predefined threshold and continuing with the one or more test procedures only if the first voltage measurement exceeds the second predefined threshold.

4. The Flash-based memory system according to claim 1, wherein the one or more test procedures further comprises determining whether the second voltage measurement exceeds a third predefined threshold and continuing with the one or more test procedures only if the second voltage measurement exceeds the third predefined threshold.

5. The Flash-based memory system according to claim 1, wherein the CPU is configured to provide the capacitance C and the ESR of the charge storage device using the following equations in which the first, second, and third voltage measurements are represented as V1, V2, and V3, respectively, the predefined amount of time is represented as t1, and the predefined load is represented as R:

$$ESR = \left(\frac{V1 * R}{V2}\right) - R$$

$$C = \frac{-t1}{(R + ESR) * \text{Ln}\left(\frac{V3}{V2}\right)}.$$

6. The Flash-based memory system according to claim 5, wherein the CPU is further configured to perform the one or more test procedures on the charge storage device a predefined number of iterations, measure V1, V2, and V3, respectively, for each iteration, determine an average measurement for V1, V2, and V3, respectively, over the predefined number of iterations, and calculate a capacitance C and an ESR for the charge storage device.

7. The Flash-based memory system according to claim 1, wherein the CPU is further configured to perform the one or more test procedures on the charge storage device a predefined number of iterations, calculate the capacitance C and the ESR of the charge storage device for each iteration, and determine an average capacitance C and an average ESR for the charge storage device over the predefined number of iterations.

8. The Flash-based memory system according to claim 1, wherein the power circuit includes power selection circuitry configured to select between a primary power and a backup power, the power selection circuitry being implemented using one of the following arrangements: i) a first switching element receiving the primary power as an input and a second switching element receiving the backup power as an input, the first and second switching elements having outputs that are connected together; and ii) a first switching device controller receiving the primary power as an input and controlling a first switching device and a second switching device controller receiving the backup power as an input and controlling a second switching device, the first and second switching devices having outputs that are connected together.

9. A method of testing a Flash-based memory system having a backup power source, comprising:
   providing power to the Flash-based memory system, the power being provided from a primary power source during normal operation of the Flash-based memory system and from a backup power source when the primary power source falls below a predefined level, the backup power source including a charge storage device and charging circuitry configured to charge the charge storage device;
   automatically performing one or more test procedures on the charge storage device and providing an indication of a charge storage capacity of the charge storage device, the one or more test procedures comprising:
   disabling the charging circuitry from charging the charge storage device;

obtaining a first voltage measurement from the charge storage device;
applying a predefined load to the charge storage device;
obtaining a second voltage measurement from the charge storage device;
waiting a predefined amount of time; and
obtaining a third voltage measurement from the charge storage device;
wherein providing an indication of the charge storage capacity of the charge storage device comprises providing at least one of a capacitance C of the charge storage device and an equivalent series resistance (ESR) of the charge storage device based on one or more of the first, second, and third voltage measurements.

10. The method according to claim 9, wherein the one or more test procedures further comprises obtaining an initial voltage measurement from the storage device prior to disabling the charging circuitry and continuing with the one or more test procedures only if the initial voltage measurement exceeds a first predefined threshold.

11. The method according to claim 9, wherein the one or more test procedures further comprises determining whether the first voltage measurement exceeds a second predefined threshold and continuing with the one or more test procedures only if the first voltage measurement exceeds the second predefined threshold.

12. The method according to claim 9, wherein the one or more test procedures further comprises determining whether the second voltage measurement exceeds a third predefined threshold and continuing with the one or more test procedures only if the second voltage measurement exceeds the third predefined threshold.

13. The method according to claim 9, wherein the capacitance C and the ESR of the charge storage device are provided using the following equations in which the first, second, and third voltage measurements are represented as V1, V2, and V3, respectively, the predefined amount of time is represented as t1, and the predefined load is represented as R:

$$ESR = \left(\frac{V1 * R}{V2}\right) - R$$
$$C = \frac{-t1}{(R+ESR)*\text{Ln}\left(\frac{V3}{V2}\right)}.$$

14. The method according to claim 13, wherein the one or more test procedures are performed on the charge storage device a predefined number of iterations, V1, V2, and V3 are measured, respectively, for each iteration, an average measurement for V1, V2, and V3 is determined, respectively, over the predefined number of iterations, and a capacitance C and an ESR are calculated for the charge storage device.

15. The method according to claim 9, wherein the one or more test procedures are performed on the charge storage device a predefined number of iterations, the capacitance C and the ESR of the charge storage device are calculated for each iteration, and an average capacitance C and an average ESR are determined for the charge storage device over the predefined number of iterations.

16. The method according to claim 9, further comprising automatically selecting between a primary power and a backup power, the automatically selecting being implemented using one of the following arrangements: i) a first switching element receiving the primary power as an input and a second switching element receiving the backup power as an input, the first and second switching elements having outputs that are connected together; and ii) a first switching device controller receiving the primary power as an input and controlling a first switching device and a second switching device controller receiving the backup power as an input and controlling a second switching device, the first and second switching devices having outputs that are connected together.

17. A Flash-based memory system having a backup power source, comprising:
a plurality of Flash memory devices;
a Flash controller communicating independently with each Flash memory device;
a backup power source providing power to the Flash memory devices when a primary power source falls below a predefined level, the backup power source including a charge storage device; and
a central processing unit (CPU) coupled to the backup power source, the CPU configured to perform one or more predefined test procedures on the charge storage device and provide an indication of a charge storage capacity of the charge storage device, the CPU providing the indication of the charge storage capacity of the charge storage device by providing at least one of a capacitance C of the charge storage device and an equivalent series resistance (ESR) of the charge storage device;
wherein the CPU is configured to provide the capacitance C and the ESR of the charge storage device using one or more predefined equations involving voltage measurements from the charge storage device, a predefined load, and a predefined amount of time, wherein the one or more test procedures comprising:
disabling the charging circuitry from charging the charge storage device;
obtaining a first voltage measurement from the charge storage device;
applying a predefined load to the charge storage device;
obtaining a second voltage measurement from the charge storage device;
waiting a predefined amount of time; and
obtaining a third voltage measurement from the charge storage device.

18. The Flash-based memory system according to claim 17, wherein the CPU is configured to provide the capacitance C and the ESR of the charge storage device using the following equations in which V1, V2, and V3 represent first, second, and third voltage measurements from the charge storage device, respectively, R represents a predefined load, and t1 represents a predefined amount of time:

$$ESR = \left(\frac{V1 * R}{V2}\right) - R$$
$$C = \frac{-t1}{(R+ESR)*\text{Ln}\left(\frac{V3}{V2}\right)}.$$

19. The Flash-based memory system according to claim 18, wherein the CPU is further configured to perform the one or more predefined test procedures on the charge storage device a predefined number of iterations, measure V1, V2, and V3, respectively, for each iteration, determine an average measurement for V1, V2, and V3, respectively, over the predefined number of iterations, and calculate a capacitance C and an ESR for the charge storage device.

20. The Flash-based memory system according to claim 17, wherein the CPU is further configured to perform the one or more predefined test procedures on the charge storage device a predefined number of iterations, calculate the capacitance C and the ESR of the charge storage device for each iteration, and determine an average capacitance C and an average ESR for the charge storage device over the predefined number of iterations.

* * * * *